United States Patent
Wu et al.

(10) Patent No.: US 11,438,100 B2
(45) Date of Patent: Sep. 6, 2022

(54) RATE-MATCHING TECHNIQUES FOR POLAR CODES

(71) Applicant: Qualcomm Incorporated, San Diego, CA (US)

(72) Inventors: Liangming Wu, Beijing (CN); Jing Jiang, San Diego, CA (US); Changlong Xu, Beijing (CN)

(73) Assignee: QUALCOMM Incorporated, San Diego, CA (US)

(*) Notice: Subject to any disclaimer, the term of this patent is extended or adjusted under 35 U.S.C. 154(b) by 259 days.

(21) Appl. No.: 16/640,982

(22) PCT Filed: Aug. 21, 2017

(86) PCT No.: PCT/CN2017/098363
§ 371 (c)(1),
(2) Date: Feb. 21, 2020

(87) PCT Pub. No.: WO2019/036867
PCT Pub. Date: Feb. 28, 2019

(65) Prior Publication Data
US 2020/0204301 A1    Jun. 25, 2020

(51) Int. Cl.
*H04L 1/00* (2006.01)

(52) U.S. Cl.
CPC .................................. *H04L 1/0068* (2013.01)

(58) Field of Classification Search
None
See application file for complete search history.

(56) References Cited

U.S. PATENT DOCUMENTS

| | | | |
|---|---|---|---|
| 2014/0208183 A1 | 7/2014 | Mahdavifar et al. | |
| 2015/0091742 A1* | 4/2015 | Ionita .................. | H03M 13/251 341/57 |

(Continued)

FOREIGN PATENT DOCUMENTS

| | | |
|---|---|---|
| CN | 106027068 A | 10/2016 |
| CN | 106100794 A | 11/2016 |

(Continued)

OTHER PUBLICATIONS

Qualcomm Incorporated: "Sequence Construction of Polar Codes for Control Channel," 3GPP Draft, 3GPP TSG-RAN WG1 NR Ad-Hoc#2, R1-1711218, Sequence Construction of Polar Codes for Control Channel, 3rd Generation Partnership Project (3GPP), Mobile Competence Centre; 650, Route Des Lucioles; F-06921, Sophia-Antipoli, vol. RAN WG1, No. Qingdao, Jun. 27, 2017-Jun. 30, 2017, Jun. 20, 2017, XP051305804, 17 pages, Retrieved from the Internet: URL: http://www.3gpp.org/ftp/tsg_ran/WG1_RL1/TSGR1_AH/NR_AH_1706/Docs/ [retrieved on Jun. 20, 2017].

(Continued)

*Primary Examiner* — Phirin Sam
(74) *Attorney, Agent, or Firm* — Holland & Hart LLP

(57) ABSTRACT

Methods, systems, and devices for wireless communication are described for polar coding with rate matching. A transmitter may construct input channels into a polar encoder to provide an information bit vector that does not include punctured or shortened bits. One or more transmission capacity factors may be used in identifying the information bit vector, which may be mapped to one or more of a codeword length of the polar code or a number of transmitted bits in each codeword. A number of different rate matching schemes may be available for transmissions, and may be selected based on one or more polar coding parameters. In some cases, mapping techniques may be used in two or more different rate matching schemes.

46 Claims, 25 Drawing Sheets

(56) References Cited

U.S. PATENT DOCUMENTS

| | | | | |
|---|---|---|---|---|
| 2015/0333775 A1* | 11/2015 | Korb | ................... | H03M 13/13 714/780 |
| 2016/0285479 A1 | 9/2016 | El-Khamy et al. | | |
| 2016/0353322 A1* | 12/2016 | Li | ...................... | H04W 74/004 |
| 2017/0366199 A1* | 12/2017 | Ge | ........................ | H04L 1/0053 |
| 2018/0278369 A1* | 9/2018 | Ge | ........................ | H04L 1/0068 |
| 2020/0321986 A1* | 10/2020 | Hui | .................. | H03M 13/6362 |
| 2021/0143843 A1* | 5/2021 | Nimbalker | ........ | H03M 13/6356 |

FOREIGN PATENT DOCUMENTS

| | | |
|---|---|---|
| CN | 106656213 A | 5/2017 |
| CN | 106817195 A | 6/2017 |
| CN | 107005690 A | 8/2017 |
| CN | 107026709 A | 8/2017 |
| CN | 107040261 A | 8/2017 |
| WO | WO-2018152694 A1 | 8/2018 |

OTHER PUBLICATIONS

Supplementary Partial European Search Report—EP17922452—Search Authority—Munich—dated Jun. 8, 2021.
International Search Report and Written Opinion—PCT/CN2017/098363—ISA/EPO—dated May 11, 2018.
Jin Xu, et al., "Application of Polar Code in LTE System", Telecommunications Science, 2017, vol. 33, Issue 3, 7 pages.
Qualcomm Incorporated: "Sequence Construction of Polar Codes for Control Channel", 3GPP TSG-RAN WG1 #90, R1-1713468, Aug. 25, 2017, 15 pages.
Supplementary European Search Report—EP17922452—Search Authority—Munich—dated Sep. 8, 2021.

* cited by examiner

| β | 0 | 1/16 | 2/16 | 3/16 | 4/16 | 5/16 | 6/16 | 7/16 | 8/16 |
|---|---|---|---|---|---|---|---|---|---|
| $f(β)$ | 128/64 | 114/64 | 102/64 | 93/64 | 85/64 | 79/64 | 73/64 | 68/64 | 64/64 |

FIG. 5

RATE-MATCHING TECHNIQUES FOR POLAR CODES

CROSS REFERENCE

The present 371 Application for Patent claims priority to International Patent Application No. PCT/CN2017/098363 by Wu et al., entitled "RATE-MATCHING TECHNIQUES FOR POLAR CODES," filed Aug. 21, 2017, which is assigned to the assignee hereof, and is hereby incorporated by reference in its entirety.

BACKGROUND

The following relates generally to wireless communication, and more specifically to rate-matching techniques for polar codes.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as a Long Term Evolution (LTE) systems or LTE-Advanced (LTE-A) systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform-spread-OFDM (DFT-S-OFDM). A wireless multiple-access communications system may include a number of base stations or network access nodes, each simultaneously supporting communication for multiple communication devices, which may be otherwise known as user equipment (UE).

Wireless communications, however, often involves sending data over a noisy communication channel. To combat noise, a transmitter may encode data in the form of code blocks using error correcting codes to introduce redundancy in the code block so that transmission errors may be detected and/or corrected. Some examples of encoding algorithms with error correcting codes include convolutional codes (CCs), low-density parity-check (LDPC) codes, and polar codes. A polar code is an example of a linear block error correcting code and constructed using channel polarization techniques. Channel polarization takes independent copies of a transmission channel and transforms the copies into a set of reliable channels and a set of unreliable channels. Information bits are encoded in the more reliable channels and bits known a priori by the transmitter and receiver are encoded in the less reliable channels. A polar code has been shown to approach the theoretical channel capacity as the code length approaches infinity. Some aspects of polar code processing may be computationally intensive, and it may be desirable to use techniques that are somewhat less computationally intensive.

SUMMARY

The described techniques relate to improved methods, systems, devices, or apparatuses that support polar coding when rate matching is employed, in which an encoded set of bits may be rate-matched in order to achieve a given code rate or codeword size for a transmission. Such rate matching (e.g., puncturing or shortening) may be performed by a transmitter (e.g., a base station or a UE) to provide encoded bits that satisfy a given code rate or codeword size. When performing rate matching, a transmitter may order the input bit channels into the encoder in a way that accounts for such punctured or shortened bits. In some cases, one or more transmission capacity factors used in identifying bit channels for the information bit vector may be mapped to one or more of a codeword length of the polar code (which may be referred to as a mother code length) or a number of transmitted bits in each codeword. In some cases, the mapping may be provided through a lookup table that includes a number of transmission capacity factors that correspond to different ratios of codeword length to the number of transmitted bits in each codeword, and in cases where a ratio is not included in the lookup table, an interpolation function or rounding function may be used to select the transmission capacity factor.

In some cases, a number of different rate matching schemes may be available for transmissions, and a transmitter may select a particular scheme based on one or more polar coding parameters. In some cases, a transmitter may switch from a first rate matching scheme to a second rate matching scheme based on one or more of the parameters. In some cases, bit channel locations for an information bit vector may be determined based at least in part on a rate matching scheme used for rate matching an encoded codeword and one of a plurality of functions that are based at least in part on a number of transmitted bits relative to a number of encoded bits.

A method of wireless communication is described. The method may include identifying an information bit vector comprising a number of information bits to be encoded using a polar code, identifying a first number of bits of a codeword generated from the information bit vector to be transmitted, identifying a set of bit locations of the polar code for the number of information bits, wherein the set of bit locations is determined based at least in part on partitioning of a plurality of bit-channels of the polar code for a first order polarization stage and assigning portions of the number of information bits to a first bit-channel partition and a second bit-channel partition of the first order polarization stage, wherein a capacity of the plurality of bit-channels of the first order polarization stage is based at least in part on a transmission capacity factor determined according to a mapping between one or more of a mother polar code length for the codeword, the first number of bits, or a plurality of predetermined transmission capacity factors, encoding the information bit vector according to the set of bit locations using the polar code to obtain the codeword, rating matching the codeword to the first number of bits, and transmitting the rate matched codeword over a wireless channel.

An apparatus for wireless communication is described. The apparatus may include means for identifying an information bit vector comprising a number of information bits to be encoded using a polar code, means for identifying a first number of bits of a codeword generated from the information bit vector to be transmitted, means for identifying a set of bit locations of the polar code for the number of information bits, wherein the set of bit locations is determined based at least in part on partitioning of a plurality of bit-channels of the polar code for a first order polarization stage and assigning portions of the number of information bits to a first bit-channel partition and a second bit-channel partition of the first order polarization stage, wherein a capacity of the plurality of bit-channels of the first order polarization stage is based at least in part on a transmission capacity factor determined according to a mapping between one or more of a mother polar code length for the codeword, the first number of bits, or a plurality of predetermined transmission capacity factors, means for encoding the information bit vector according to the set of bit locations using the polar code to obtain the codeword, means for rating matching the codeword to the first number of bits, and means for transmitting the rate matched codeword over a wireless channel.

Another apparatus for wireless communication is described. The apparatus may include a processor, memory in electronic communication with the processor, and instructions stored in the memory. The instructions may be operable to cause the processor to identify an information bit vector comprising a number of information bits to be encoded using a polar code, identify a first number of bits of a codeword generated from the information bit vector to be transmitted, identify a set of bit locations of the polar code for the number of information bits, wherein the set of bit locations is determined based at least in part on partitioning of a plurality of bit-channels of the polar code for a first order polarization stage and assigning portions of the number of information bits to a first bit-channel partition and a second bit-channel partition of the first order polarization stage, wherein a capacity of the plurality of bit-channels of the first order polarization stage is based at least in part on a transmission capacity factor determined according to a mapping between one or more of a mother polar code length for the codeword, the first number of bits, or a plurality of predetermined transmission capacity factors, encode the information bit vector according to the set of bit locations using the polar code to obtain the codeword, rate matching the codeword to the first number of bits, and transmit the rate matched codeword over a wireless channel.

A non-transitory computer readable medium for wireless communication is described. The non-transitory computer-readable medium may include instructions operable to cause a processor to identify an information bit vector comprising a number of information bits to be encoded using a polar code, identify a first number of bits of a codeword generated from the information bit vector to be transmitted, identify a set of bit locations of the polar code for the number of information bits, wherein the set of bit locations is determined based at least in part on partitioning of a plurality of bit-channels of the polar code for a first order polarization stage and assigning portions of the number of information bits to a first bit-channel partition and a second bit-channel partition of the first order polarization stage, wherein a capacity of the plurality of bit-channels of the first order polarization stage is based at least in part on a transmission capacity factor determined according to a mapping between one or more of a mother polar code length for the codeword, the first number of bits, or a plurality of predetermined transmission capacity factors, encode the information bit vector according to the set of bit locations using the polar code to obtain the codeword, rate matching the codeword to the first number of bits, and transmit the rate matched codeword over a wireless channel.

In some examples of the method, apparatus, and non-transitory computer-readable medium described above, the transmission capacity factor may be based at least in part on a ratio of the first number of bits to the mother polar code length for the codeword.

In some examples of the method, apparatus, and non-transitory computer-readable medium described above, the mapping provides a plurality of transmission capacity factor values, each transmission capacity factor value corresponding to an associated rate matching ratio value that may be determined based at least in part on the first number of bits and the mother polar code length for the codeword. In some examples of the method, apparatus, and non-transitory computer-readable medium described above, the mapping may be provided in a lookup table containing the plurality of rate matching ratio values and the plurality of transmission capacity factor values.

In some examples of the method, apparatus, and non-transitory computer-readable medium described above, the identifying the set of bit locations further comprises determining a calculated rate matching ratio between the first number of bits and the mother polar code length, identifying a first rate matching ratio value and a second rate matching ratio value from the lookup table, the calculated rate matching ratio being between the first rate matching ratio value and the second rate matching ratio value, and determining the transmission capacity factor as an interpolation between a first transmission capacity factor value associated with the first rate matching ratio value and a second transmission capacity factor value associated with the second rate matching ratio value. In some examples of the method, apparatus, and non-transitory computer-readable medium described above, the interpolation may be a first order linear interpolation.

In some examples of the method, apparatus, and non-transitory computer-readable medium described above, the identifying the set of bit locations further comprises determining a calculated rate matching ratio between the first number of bits and the mother polar code length, identifying a first rate matching ratio value and a second rate matching ratio value from the lookup table, the calculated rate matching ratio being between the first rate matching ratio value and the second rate matching ratio value, and selecting the transmission capacity factor as the first rate matching ratio value or the second rate matching ratio value based at least in part on which of the first rate matching ratio value or the second rate matching ratio value may be closest to the calculated rate matching ratio.

A method of wireless communication is described. The method may include identifying an information bit vector comprising a number of information bits to be encoded using a polar code, identifying one or more transmission parameters for a codeword to be generated from the information bit vector using the polar code, selecting a first rate matching scheme for determining a first number of bits of the codeword to be transmitted, the first rate matching scheme being selected from a plurality of rate matching schemes based at least in part on the one or more transmission parameters, identifying a set of bit locations of the polar code for the number of information bits based at least in part on the first number of bits and the number of information bits, encoding the information bit vector according to the set of bit locations using the polar code, rating matching the codeword to the first number of bits using the first rate matching scheme, and transmitting the rate matched codeword over the wireless channel.

An apparatus for wireless communication is described. The apparatus may include means for identifying an information bit vector comprising a number of information bits to be encoded using a polar code, means for identifying one or more transmission parameters for a codeword to be generated from the information bit vector using the polar code, means for selecting a first rate matching scheme for determining a first number of bits of the codeword to be transmitted, the first rate matching scheme being selected from a plurality of rate matching schemes based at least in part on the one or more transmission parameters, means for identifying a set of bit locations of the polar code for the number of information bits based at least in part on the first number of bits and the number of information bits, means for encoding the information bit vector according to the set of bit locations using the polar code, means for rating matching the codeword to the first number of bits using the first rate matching scheme, and means for transmitting the rate matched codeword over the wireless channel.

Another apparatus for wireless communication is described. The apparatus may include a processor, memory in electronic communication with the processor, and instructions stored in the memory. The instructions may be operable to cause the processor to identify an information bit vector comprising a number of information bits to be encoded using a polar code, identify one or more transmission parameters for a codeword to be generated from the information bit vector using the polar code, select a first rate matching scheme for determining a first number of bits of the codeword to be transmitted, the first rate matching scheme being selected from a plurality of rate matching schemes based at least in part on the one or more transmission parameters, identify a set of bit locations of the polar code for the number of information bits based at least in part on the first number of bits and the number of information bits, encode the information bit vector according to the set of bit locations using the polar code, rate matching the codeword to the first number of bits using the first rate matching scheme, and transmit the rate matched codeword over the wireless channel.

A non-transitory computer readable medium for wireless communication is described. The non-transitory computer-readable medium may include instructions operable to cause a processor to identify an information bit vector comprising a number of information bits to be encoded using a polar code, identify one or more transmission parameters for a codeword to be generated from the information bit vector using the polar code, select a first rate matching scheme for determining a first number of bits of the codeword to be transmitted, the first rate matching scheme being selected from a plurality of rate matching schemes based at least in part on the one or more transmission parameters, identify a set of bit locations of the polar code for the number of information bits based at least in part on the first number of bits and the number of information bits, encode the information bit vector according to the set of bit locations using the polar code, rate matching the codeword to the first number of bits using the first rate matching scheme, and transmit the rate matched codeword over the wireless channel.

Some examples of the method, apparatus, and non-transitory computer-readable medium described above may further include processes, features, means, or instructions for switching to a second rate matching scheme of the plurality of rate matching schemes based at least in part on one or more updates to the one or more transmission parameters associated with the transmission. In some examples of the method, apparatus, and non-transitory computer-readable medium described above, the one or more transmission parameters comprise one or more of the number of information bits in the information bit vector, the first number of bits, a mother code length for polar codes of the transmission, a ratio of the number of information bits and the first number of bits or a coding rate, a ratio of the first number of bits and the mother code length, or any combination thereof.

In some examples of the method, apparatus, and non-transitory computer-readable medium described above, the plurality of rate matching schemes comprise one or more of a first rate matching scheme that adjusts the number of information bits in the information bit vector, a second rate matching scheme that adjusts a block size of input data, a third rate matching scheme that interlaces portions of two or more input data blocks, or a fourth rate matching scheme that may have one or more non-interlaced input data blocks and that interlaces two or more other input data blocks.

In some examples of the method, apparatus, and non-transitory computer-readable medium described above, the selecting the first rate matching scheme may be based on one or more of a value of a first parameter of the one or more transmission parameters relative to a first threshold value for the first parameter, a value of a ratio of the first number of bits and a mother code length relative to a second threshold value, a value of a coding rate of the codeword, or whether a value of each of the one or more transmission parameters belongs to a set of values associated with each rate matching scheme of the plurality of rate matching schemes.

A method of wireless communication is described. The method may include identifying an information bit vector comprising a number of information bits to be encoded using a polar code, identifying a first number of bits of a codeword generated from the information bit vector to be transmitted, identifying a set of bit locations of the polar code for the plurality of information bits, wherein the set of bit locations is determined based at least in part on partitioning of a plurality of bit-channels of the polar code for a first order polarization stage and assigning portions of a number of the plurality of information bits to a first bit-channel partition and a second bit-channel partition of the first order polarization stage, wherein a capacity for the first bit-channel partition or a capacity of the second bit-channel partition is based at least in part on one of a plurality of functions of a number of the plurality of bit-channels for the first order polarization stage, wherein the one of the plurality of functions is determined based at least in part on the first number of bits, encoding the information bit vector according to the set of bit locations using the polar code to obtain the codeword, rating matching codeword to the first number of bits, and transmitting the rate matched codeword over the wireless channel.

An apparatus for wireless communication is described. The apparatus may include means for identifying an information bit vector comprising a number of information bits to be encoded using a polar code, means for identifying a first number of bits of a codeword generated from the information bit vector to be transmitted, means for identifying a set of bit locations of the polar code for the plurality of information bits, wherein the set of bit locations is determined based at least in part on partitioning of a plurality of bit-channels of the polar code for a first order polarization stage and assigning portions of a number of the plurality of information bits to a first bit-channel partition and a second bit-channel partition of the first order polarization stage, wherein a capacity for the first bit-channel partition or a capacity of the second bit-channel partition is based at least in part on one of a plurality of functions of a number of the plurality of bit-channels for the first order polarization stage, wherein the one of the plurality of functions is determined based at least in part on the first number of bits, means for encoding the information bit vector according to the set of bit locations using the polar code to obtain the codeword, means for rating matching codeword to the first number of bits, and means for transmitting the rate matched codeword over the wireless channel.

Another apparatus for wireless communication is described. The apparatus may include a processor, memory in electronic communication with the processor, and instructions stored in the memory. The instructions may be operable to cause the processor to identify an information bit vector comprising a number of information bits to be encoded using a polar code, identify a first number of bits of a codeword generated from the information bit vector to be transmitted, identify a set of bit locations of the polar code for the plurality of information bits, wherein the set of bit locations is determined based at least in part on partitioning of a plurality of bit-channels of the polar code for a first order polarization stage and assigning portions of a number of the plurality of information bits to a first bit-channel partition and a second bit-channel partition of the first order polarization stage, wherein a capacity for the first bit-channel partition or a capacity of the second bit-channel partition is based at least in part on one of a plurality of functions of a number of the plurality of bit-channels for the first order polarization stage, wherein the one of the plurality of functions is determined based at least in part on the first number of bits, encode the information bit vector according to the set of bit locations using the polar code to obtain the codeword, rate matching codeword to the first number of bits, and transmit the rate matched codeword over the wireless channel.

A non-transitory computer readable medium for wireless communication is described. The non-transitory computer-readable medium may include instructions operable to cause a processor to identify an information bit vector comprising a number of information bits to be encoded using a polar code, identify a first number of bits of a codeword generated from the information bit vector to be transmitted, identify a set of bit locations of the polar code for the plurality of information bits, wherein the set of bit locations is determined based at least in part on partitioning of a plurality of bit-channels of the polar code for a first order polarization stage and assigning portions of a number of the plurality of information bits to a first bit-channel partition and a second bit-channel partition of the first order polarization stage, wherein a capacity for the first bit-channel partition or a capacity of the second bit-channel partition is based at least in part on one of a plurality of functions of a number of the plurality of bit-channels for the first order polarization stage, wherein the one of the plurality of functions is determined based at least in part on the first number of bits, encode the information bit vector according to the set of bit locations using the polar code to obtain the codeword, rate matching codeword to the first number of bits, and transmit the rate matched codeword over the wireless channel.

In some examples of the method, apparatus, and non-transitory computer-readable medium described above, the plurality of functions correspond to a plurality of different rate matching schemes. In some examples of the method, apparatus, and non-transitory computer-readable medium described above, the one of the plurality of functions may be further determined based at least in part on a mother polar code length for the codeword. In some examples of the method, apparatus, and non-transitory computer-readable medium described above, the one of the plurality of functions may be further determined based at least in part on a value of the first number of bits relative to a mother polar code length for the codeword.

A method of wireless communication is described. The method may include receiving a first number of bits of a codeword over a wireless channel, wherein the codeword is encoded using a polar code and is generated from an information bit vector comprising a number of information bits, identifying a set of bit locations of the polar code for the number of information bits, wherein the set of bit locations is determined based at least in part on partitioning of a plurality of bit-channels of the polar code for a first order polarization stage and assigning portions of the number of information bits to a first bit-channel partition and a second bit-channel partition of the first order polarization stage, wherein a capacity of the plurality of bit-channels of the first order polarization stage is based at least in part on a transmission capacity factor determined according to a mapping between one or more of a mother polar code length for the codeword, the first number of bits, or a plurality of predetermined transmission capacity factors, and decoding the codeword according to the polar code to obtain the information bit vector at the set of bit locations.

An apparatus for wireless communication is described. The apparatus may include means for receiving a first number of bits of a codeword over a wireless channel, wherein the codeword is encoded using a polar code and is generated from an information bit vector comprising a number of information bits, means for identifying a set of bit locations of the polar code for the number of information bits, wherein the set of bit locations is determined based at least in part on partitioning of a plurality of bit-channels of the polar code for a first order polarization stage and assigning portions of the number of information bits to a first bit-channel partition and a second bit-channel partition of the first order polarization stage, wherein a capacity of the plurality of bit-channels of the first order polarization stage is based at least in part on a transmission capacity factor determined according to a mapping between one or more of a mother polar code length for the codeword, the first number of bits, or a plurality of predetermined transmission capacity factors, and means for decoding the codeword according to the polar code to obtain the information bit vector at the set of bit locations.

Another apparatus for wireless communication is described. The apparatus may include a processor, memory in electronic communication with the processor, and instructions stored in the memory. The instructions may be operable to cause the processor to receive a first number of bits of a codeword over a wireless channel, wherein the codeword is encoded using a polar code and is generated from an information bit vector comprising a number of information bits, identify a set of bit locations of the polar code for the number of information bits, wherein the set of bit locations is determined based at least in part on partitioning of a plurality of bit-channels of the polar code for a first order polarization stage and assigning portions of the number of information bits to a first bit-channel partition and a second bit-channel partition of the first order polarization stage, wherein a capacity of the plurality of bit-channels of the first order polarization stage is based at least in part on a transmission capacity factor determined according to a mapping between one or more of a mother polar code length for the codeword, the first number of bits, or a plurality of predetermined transmission capacity factors, and decode the codeword according to the polar code to obtain the information bit vector at the set of bit locations.

A non-transitory computer readable medium for wireless communication is described. The non-transitory computer-readable medium may include instructions operable to cause a processor to receive a first number of bits of a codeword over a wireless channel, wherein the codeword is encoded using a polar code and is generated from an information bit vector comprising a number of information bits, identify a set of bit locations of the polar code for the number of information bits, wherein the set of bit locations is determined based at least in part on partitioning of a plurality of bit-channels of the polar code for a first order polarization stage and assigning portions of the number of information bits to a first bit-channel partition and a second bit-channel partition of the first order polarization stage, wherein a capacity of the plurality of bit-channels of the first order polarization stage is based at least in part on a transmission capacity factor determined according to a mapping between one or more of a mother polar code length for the codeword, the first number of bits, or a plurality of predetermined transmission capacity factors, and decode the codeword according to the polar code to obtain the information bit vector at the set of bit locations.

In some examples of the method, apparatus, and non-transitory computer-readable medium described above, the transmission capacity factor may be based at least in part on a ratio of the first number of bits to the mother polar code length for the codeword. In some examples of the method, apparatus, and non-transitory computer-readable medium described above, the mapping provides a plurality of transmission capacity factor values, each transmission capacity factor value corresponding to an associated rate matching ratio value that may be determined based at least in part on the first number of bits and the mother polar code length for the codeword. In some examples of the method, apparatus, and non-transitory computer-readable medium described above, the mapping may be provided in a lookup table containing the plurality of rate matching ratio values and the plurality of transmission capacity factor values.

In some examples of the method, apparatus, and non-transitory computer-readable medium described above, the identifying the set of bit locations further comprises determining a calculated rate matching ratio between the first number of bits and the mother polar code length, identifying a first rate matching ratio value and a second rate matching ratio value from the lookup table, the calculated rate matching ratio being between the first rate matching ratio value and the second rate matching ratio value, and determining the transmission capacity factor as an interpolation between a first transmission capacity factor value associated with the first rate matching ratio value and a second transmission capacity factor value associated with the second rate matching ratio value. In some examples of the method, apparatus, and non-transitory computer-readable medium described above, the interpolation may be a first order linear interpolation.

In some examples of the method, apparatus, and non-transitory computer-readable medium described above, the identifying the set of bit locations further comprises determining a calculated rate matching ratio between the first number of bits and the mother polar code length, identifying a first rate matching ratio value and a second rate matching ratio value from the lookup table, the calculated rate matching ratio being between the first rate matching ratio value and the second rate matching ratio value, and selecting the transmission capacity factor as the first rate matching ratio value or the second rate matching ratio value based at least in part on which of the first rate matching ratio value or the second rate matching ratio value may be closest to the calculated rate matching ratio.

A method of wireless communication is described. The method may include receiving a first number of bits of a codeword in a transmission over a wireless channel, wherein the codeword is encoded using a polar code and is generated from an information bit vector comprising a number of information bits, selecting a first rate matching scheme of a plurality of rate matching schemes for decoding the codeword based at least in part on one or more parameters associated with the transmission, identifying a set of bit locations of the polar code for the number of information bits based at least in part on the first number of bits and the number of information bits, and decoding the codeword according to the polar code and the first rate matching scheme to obtain the information bit vector at the set of bit locations.

An apparatus for wireless communication is described. The apparatus may include means for receiving a first number of bits of a codeword in a transmission over a wireless channel, wherein the codeword is encoded using a polar code and is generated from an information bit vector comprising a number of information bits, means for selecting a first rate matching scheme of a plurality of rate matching schemes for decoding the codeword based at least in part on one or more parameters associated with the transmission, means for identifying a set of bit locations of the polar code for the number of information bits based at least in part on the first number of bits and the number of information bits, and means for decoding the codeword according to the polar code and the first rate matching scheme to obtain the information bit vector at the set of bit locations.

Another apparatus for wireless communication is described. The apparatus may include a processor, memory in electronic communication with the processor, and instructions stored in the memory. The instructions may be operable to cause the processor to receive a first number of bits of a codeword in a transmission over a wireless channel, wherein the codeword is encoded using a polar code and is generated from an information bit vector comprising a number of information bits, select a first rate matching scheme of a plurality of rate matching schemes for decoding the codeword based at least in part on one or more parameters associated with the transmission, identify a set of bit locations of the polar code for the number of information bits based at least in part on the first number of bits and the number of information bits, and decode the codeword according to the polar code and the first rate matching scheme to obtain the information bit vector at the set of bit locations.

A non-transitory computer readable medium for wireless communication is described. The non-transitory computer-readable medium may include instructions operable to cause a processor to receive a first number of bits of a codeword in a transmission over a wireless channel, wherein the codeword is encoded using a polar code and is generated from an information bit vector comprising a number of information bits, select a first rate matching scheme of a plurality of rate matching schemes for decoding the codeword based at least in part on one or more parameters associated with the transmission, identify a set of bit locations of the polar code for the number of information bits based at least in part on the first number of bits and the number of information bits, and decode the codeword according to the polar code and the first rate matching scheme to obtain the information bit vector at the set of bit locations.

Some examples of the method, apparatus, and non-transitory computer-readable medium described above may further include processes, features, means, or instructions for switching to a second rate matching scheme of the plurality of rate matching schemes based at least in part on one or more updates to the one or more parameters associated with the transmission.

In some examples of the method, apparatus, and non-transitory computer-readable medium described above, the one or more parameters associated with the transmission comprise one or more of the number of information bits in the information bit vector, the first number of bits, a mother code length for polar codes of the transmission, a ratio of the number of information bits and the first number of bits or a coding rate, a ratio of the first number of bits and the mother code length, or any combination thereof.

In some examples of the method, apparatus, and non-transitory computer-readable medium described above, the plurality of rate matching schemes comprise one or more of a first rate matching scheme that adjusts the number of information bits in the information bit vector, a second rate matching scheme that adjusts a block size of input data, a third rate matching scheme that interlaces portions of two or more input data blocks, or a fourth rate matching scheme that may have one or more non-interlaced input data blocks and that interlaces two or more other input data blocks.

In some examples of the method, apparatus, and non-transitory computer-readable medium described above, the selecting the first rate matching scheme may be based on one or more of a value of a first parameter of the one or more parameters relative to a first threshold value for the first parameter, a value of a ratio of the first number of bits and a mother code length relative to a second threshold value, a value of a coding rate of the codeword, or whether a value of each of the one or more parameters belongs to a set of values associated with each rate matching scheme of the plurality of rate matching schemes.

A method of wireless communication is described. The method may include receiving a first number of bits of a codeword over a wireless channel, wherein the codeword is encoded using a polar code and is generated from an information bit vector having a first number of information bits, identifying a set of bit locations of the polar code for the plurality of information bits, wherein the set of bit locations is determined based at least in part on partitioning of a plurality of bit-channels of the polar code for a first order polarization stage and assigning portions of a number of the plurality of information bits to a first bit-channel partition and a second bit-channel partition of the first order polarization stage, wherein a capacity for the first bit-channel partition or a capacity of the second bit-channel partition is based at least in part on one of a plurality of functions of a number of the plurality of bit-channels for the first order polarization stage, wherein the one of the plurality of functions is determined based at least in part on the first number of bits, and decoding the codeword according to the polar code to obtain the information bit vector at the set of bit locations.

An apparatus for wireless communication is described. The apparatus may include means for receiving a first number of bits of a codeword over a wireless channel, wherein the codeword is encoded using a polar code and is generated from an information bit vector having a first number of information bits, means for identifying a set of bit locations of the polar code for the plurality of information bits, wherein the set of bit locations is determined based at least in part on partitioning of a plurality of bit-channels of the polar code for a first order polarization stage and assigning portions of a number of the plurality of information bits to a first bit-channel partition and a second bit-channel partition of the first order polarization stage, wherein a capacity for the first bit-channel partition or a capacity of the second bit-channel partition is based at least in part on one of a plurality of functions of a number of the plurality of bit-channels for the first order polarization stage, wherein the one of the plurality of functions is determined based at least in part on the first number of bits, and means for decoding the codeword according to the polar code to obtain the information bit vector at the set of bit locations.

Another apparatus for wireless communication is described. The apparatus may include a processor, memory in electronic communication with the processor, and instructions stored in the memory. The instructions may be operable to cause the processor to receive a first number of bits of a codeword over a wireless channel, wherein the codeword is encoded using a polar code and is generated from an information bit vector having a first number of information bits, identify a set of bit locations of the polar code for the plurality of information bits, wherein the set of bit locations is determined based at least in part on partitioning of a plurality of bit-channels of the polar code for a first order polarization stage and assigning portions of a number of the plurality of information bits to a first bit-channel partition and a second bit-channel partition of the first order polarization stage, wherein a capacity for the first bit-channel partition or a capacity of the second bit-channel partition is based at least in part on one of a plurality of functions of a number of the plurality of bit-channels for the first order polarization stage, wherein the one of the plurality of functions is determined based at least in part on the first number of bits, and decode the codeword according to the polar code to obtain the information bit vector at the set of bit locations.

A non-transitory computer readable medium for wireless communication is described. The non-transitory computer-readable medium may include instructions operable to cause a processor to receive a first number of bits of a codeword over a wireless channel, wherein the codeword is encoded using a polar code and is generated from an information bit vector having a first number of information bits, identify a set of bit locations of the polar code for the plurality of information bits, wherein the set of bit locations is determined based at least in part on partitioning of a plurality of bit-channels of the polar code for a first order polarization stage and assigning portions of a number of the plurality of information bits to a first bit-channel partition and a second bit-channel partition of the first order polarization stage, wherein a capacity for the first bit-channel partition or a capacity of the second bit-channel partition is based at least in part on one of a plurality of functions of a number of the plurality of bit-channels for the first order polarization stage, wherein the one of the plurality of functions is determined based at least in part on the first number of bits, and decode the codeword according to the polar code to obtain the information bit vector at the set of bit locations.

In some examples of the method, apparatus, and non-transitory computer-readable medium described above, the plurality of functions correspond to a plurality of different rate matching schemes. In some examples of the method, apparatus, and non-transitory computer-readable medium described above, the one of the plurality of functions may be further determined based at least in part on a mother polar code length for the codeword. In some examples of the method, apparatus, and non-transitory computer-readable medium described above, the one of the plurality of functions may be further determined based at least in part on a value of the first number of bits relative to a mother polar code length for the codeword.

BRIEF DESCRIPTION OF THE DRAWINGS

FIG. 5 illustrates an example of lookup table that supports rate-matching techniques for polar codes in accordance with aspects of the present disclosure.

DETAILED DESCRIPTION

Figure 1:
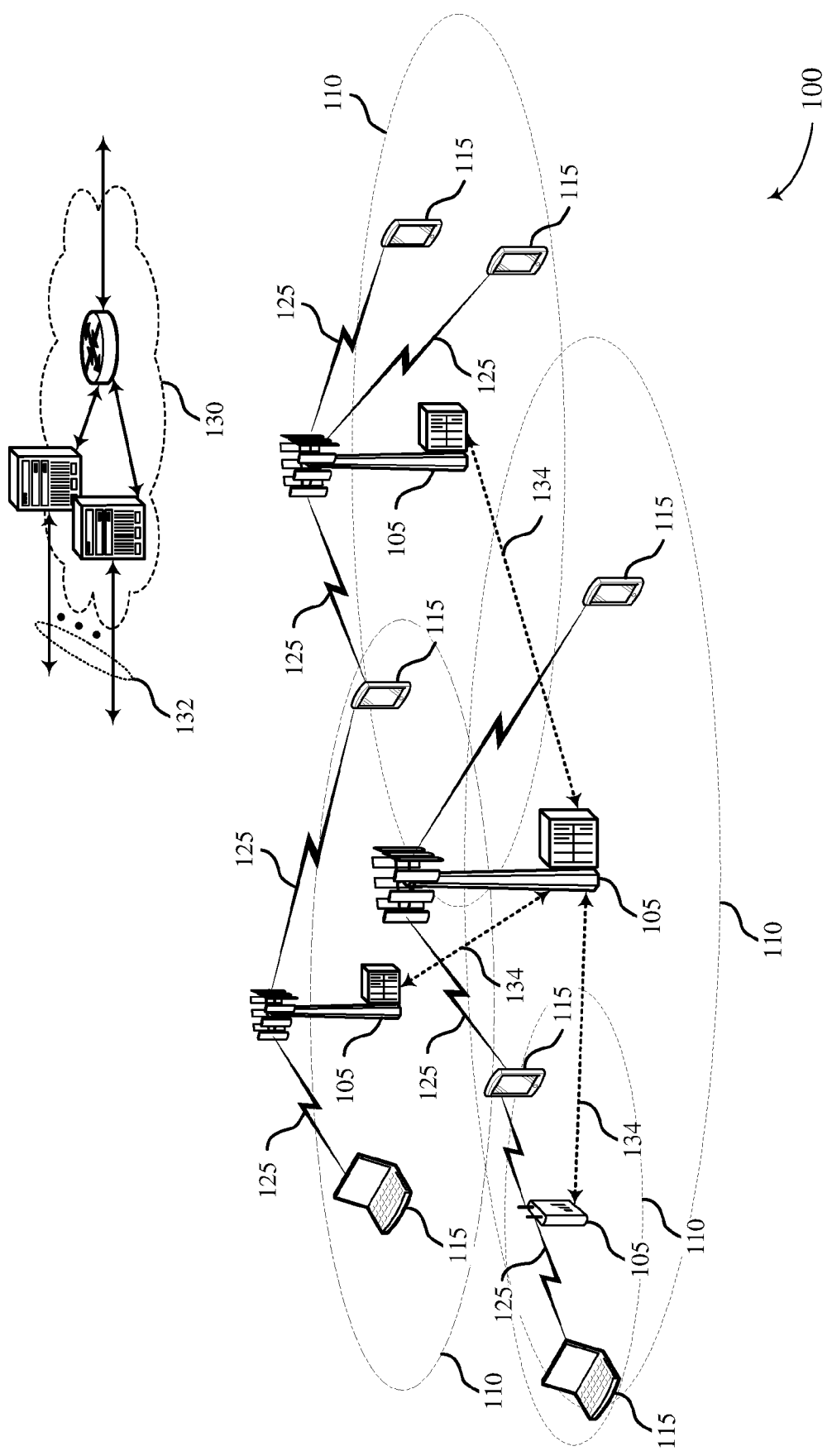
FIG. 1 illustrates an example of a system for wireless communication that supports rate-matching techniques for polar codes in accordance with aspects of the present disclosure.

The described techniques relate to improved methods, systems, devices, or apparatuses that support polar coding when rate matching is employed. In some cases, a base station may encode a set of bits for a transmission to a UE using a polar code. The number of bits generated by a polar code encoder may be determined based on a power function (e.g., $2^N$). In some cases, in order to achieve a given code rate or codeword size for a transmission, more or fewer bits may be generated by the polar code than are transmitted for the given code rate or codeword size. In such cases, the base station may perform rate matching, such as puncturing, shortening, or repetition, on the encoded bits to satisfy the given code rate. That is, the base station may rate match the output codeword of the polar code encoder to a number of desired bits for the given code rate by not transmitting some of the encoded bits, or retransmitting some of the encoded bits.

Because the polar code construction may not account for the rate matching, the gains associated with using the polar code may be compromised, which may result in reduced throughput in a wireless communications system. Various described techniques provide that a transmitter (e.g., a base station or a UE) may construct input channels for an information bit vector in a way that accounts for such punctured or shortened bits. In some cases, one or more transmission capacity factors used in identifying the bit locations for the information bit vector may be mapped to one or more of a codeword length of the polar code (which may be referred to as a mother code length) or a number of transmitted bits in each codeword. In some cases, the mapping may be provided through a lookup table that includes a number of transmission capacity factors that correspond to different ratios of codeword length of the polar code to the number of transmitted bits in each codeword, and in cases where a ratio is not included in the lookup table, an interpolation function or rounding function may be used to select the transmission capacity factor.

In some cases, a number of different rate matching schemes may be available for transmissions, and a transmitter may select a rate matching scheme based on one or more transmission parameters. In some cases, a transmitter may switch from a first rate matching scheme to a second rate matching scheme based on one or more of the transmission parameters. In some cases, bit channel locations for an information bit vector may be determined based at least in part on a rate matching scheme used for rate matching an encoded codeword and one of a plurality of functions that are based at least in part on a number of transmitted bits relative to a number of encoded bits.

A polar code may be composed of multiple channels having different levels of reliability. Channel reliability may represent a capacity of the channel to carry information as part of the encoded codeword. As indicated above, channels of a polar code having higher reliabilities may be used to encode information bits and the remaining channels may be used to encode frozen bits. A frozen bit is a bit having a known value to a decoder and may be set as '0'. For N channels, K information bits may be loaded into the K most reliable channels and N-K frozen bits may be loaded into the N-K least reliable channels, where K<N.

In some examples, a transmitter, such as a base station or a user equipment, may identify a set of bit locations of a polar code for a set of information bits based at least in part on a transmission capacity factor determined according to a mapping between one or more of a mother polar code length for the codeword or a number of transmitted bits of an encoded codeword the first number of bits. The set of bit locations may be determined based at least in part on a recursive partitioning of a set of bit-channels of the polar code for at least a subset of polarization stages of the polar code. For each partition of the at least the subset of the polarization stages of the polar code, portions of a number of the information bits of the each partition may be assigned to bit-channel sub-partitions that may be determined based at least in part on the mapping. The transmitter may encode a codeword according to the polar code based at least in part on the set of bit locations, rate match the codeword, and transmit the rate-matched and encoded codeword over the wireless channel. A receiver, such as a base station or a UE, may receive the codeword over the wireless channel, identify bit locations of the polar code for a set of information bits, and decode the received codeword according to the polar code to obtain an information bit vector at the set of bit locations.

Aspects of the disclosure are initially described in the context of a wireless communications system. The wireless communication system may identify a reliability order for channels of a polar code. The wireless communication system may also identify a number of information bits for each partition at each stage of polarization. Aspects of the disclosure are further illustrated by and described with reference to apparatus diagrams, system diagrams, and flowcharts that relate to information bit distribution optimization.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation Node B or giga-nodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions, from a base station 105 to a UE 115. Downlink transmissions may also be called forward link transmissions while uplink transmissions may also be called reverse link transmissions.

The geographic coverage area 110 for a base station 105 may be divided into sectors making up only a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1 or other interface). Base stations 105 may communicate with one another over backhaul links 134 (e.g., via an X2 or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

In some examples, base station 105 or UE 115 may be equipped with multiple antennas, which may be used to employ techniques such as transmit diversity, receive diversity, multiple-input multiple-output (MIMO) communications, or beamforming. For example, wireless communication system may use a transmission scheme between a transmitting device (e.g., a base station 105) and a receiving device (e.g., a UE 115), where the transmitting device is equipped with multiple antennas and the receiving devices are equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use hybrid automatic repeat request (HARQ) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical (PHY) layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s = 1/30,720,000$ seconds. Time intervals of a communications resource may be organized according to radio frames each having a duration of 10 milliseconds (ms), where the frame period may be expressed as $T_f = 307,200$ $T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an E-UTRA absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as OFDM or DFT-s-OFDM).

The organizational structure of the carriers may be different for different radio access technologies (e.g., LTE, LTE-A, NR, etc.). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a predefined portion or range (e.g., set of subcarriers or RBs) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Wireless communications system 100 may support communication with a UE 115 on multiple cells or carriers, a feature which may be referred to as carrier aggregation (CA) or multi-carrier operation. A UE 115 may be configured with multiple downlink CCs and one or more uplink CCs according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other CCs, which may include use of a reduced symbol duration as compared with symbol durations of the other CCs. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz, etc.) at reduced symbol durations (e.g., 16.67 microseconds). A TTI in eCC may consist of one or multiple symbol periods. In some cases, the TTI duration (that is, the number of symbol periods in a TTI) may be variable.

Wireless communications systems such as an NR system may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

Figure 2:
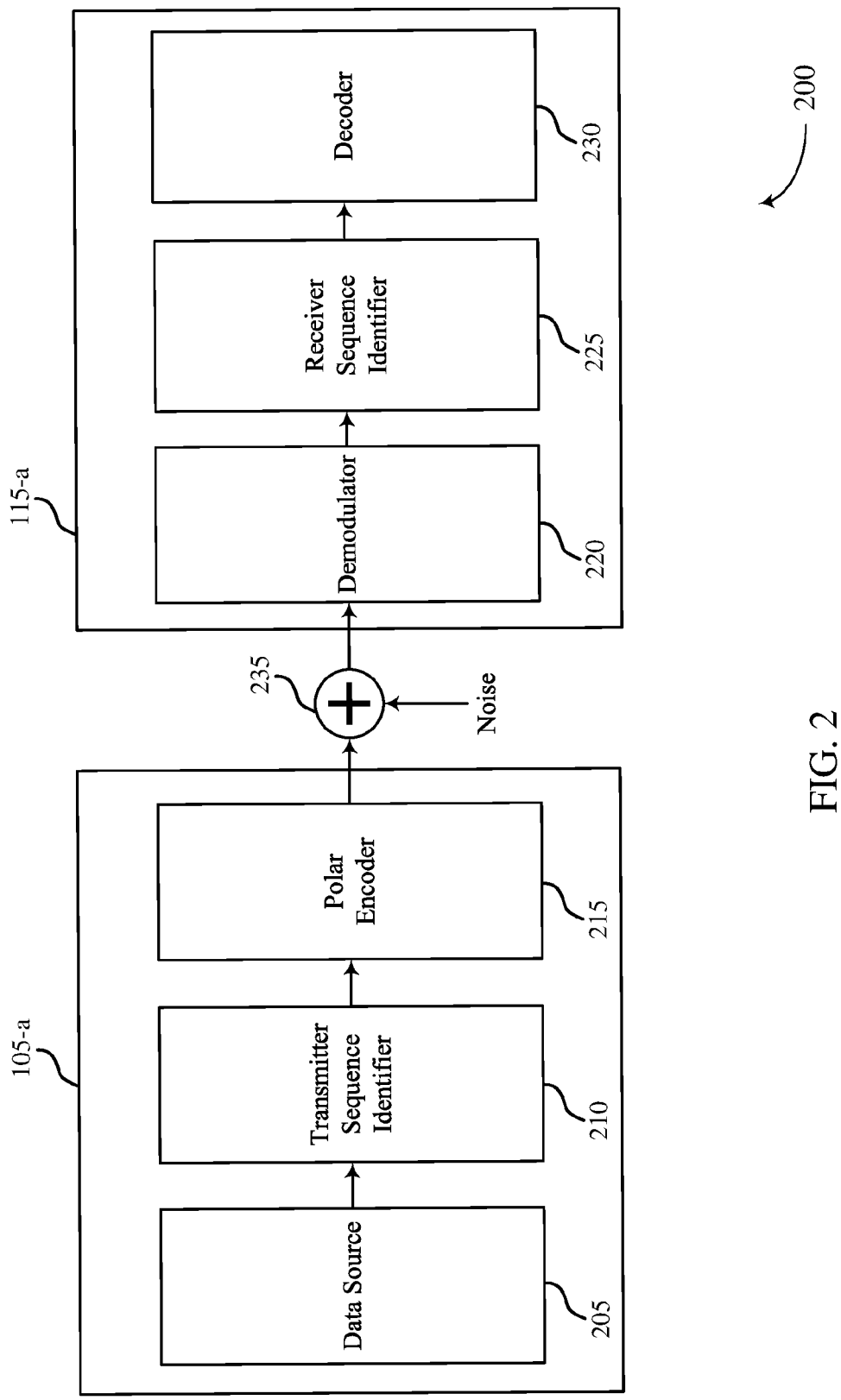
FIG. 2 illustrates an example of a wireless communication system that supports rate-matching techniques for polar codes in accordance with aspects of the present disclosure.

FIG. 2 illustrates an example of a wireless communication system 200 that supports rate-matching techniques for polar codes in accordance with various aspects of the present disclosure. In some examples, wireless communication system 200 may implement aspects of wireless communication system 100. In the example of FIG. 2, base station 105-a may use polar encoding to encode information bits for transmission to UE 115-a via a communication channel 235. In other examples, UE 115-a may encode data for transmission to base station 105-a or another UE using these same techniques. In further examples, base station 105-a may encode data for transmission to another base station 105 using these same techniques. Moreover, devices other than base station 105-a and UE 115-a may use the techniques described herein for decoding a codeword encoded using a polar code.

In the depicted example, base station 105-a may include a data source 205, a transmitter sequence identifier 210, and a polar encoder 215. The data source 205 may provide an information vector of k information bits to be encoded and transmitted to the UE 115-a. The data source 205 may be coupled to a network, a storage device, or the like. The data source 205 may output the information vector to the transmitter sequence identifier 210. The transmitter sequence identifier 210 may identify bit indices to be used for the k information bits in a polar code with mother code length N. The transmitter sequence identifier 210 may output k information bits, and the length N to the polar encoder 215 for polar encoding. In some cases, transmitter sequence identifier 210 may identify the bit indices for information bits based on a rate matching scheme used on an encoded output of the polar encoder 215.

On the receive side, UE 115-a may identify a candidate codeword based on a candidate hypothesis (e.g., decoded resources, M:N:K hypothesis). For example, the UE 115-a may employ a blind decoding process in which multiple candidate hypotheses within a search space are tested to determine if a successful decoding is performed for any of the candidate hypotheses. Demodulator 220 may demodulate the candidate codeword, which may include demapping received symbols associated with a set of resources to obtain a representation of the codeword. Demodulator 220 may then pass the representation of the codeword to a receiver sequence identifier 225. The receiver sequence identifier 225 may determine a length of the codeword and may identify bit indices of the polar code associated with information bits. The receiver sequence identifier 225 may output the bit indices and the representation of the codeword to decoder 230 to identify the most likely candidate path or paths for the information bits obtained from the codeword. The demodulated signal may be, for example, a sequence of logarithmic-likelihood ratio (LLR) values representing a probability value of a received bit being a '0' or a '1.' The decoder may perform a list decoding algorithm on the LLR values (e.g., SCL decoding, maximum likelihood decoding) and may provide an output. If the decoder is able to decode the codeword successfully, the decoder may output a bit sequence of the information vector (e.g., the k information bits) for use, storage, communication to another device, or the like.

Figure 3:
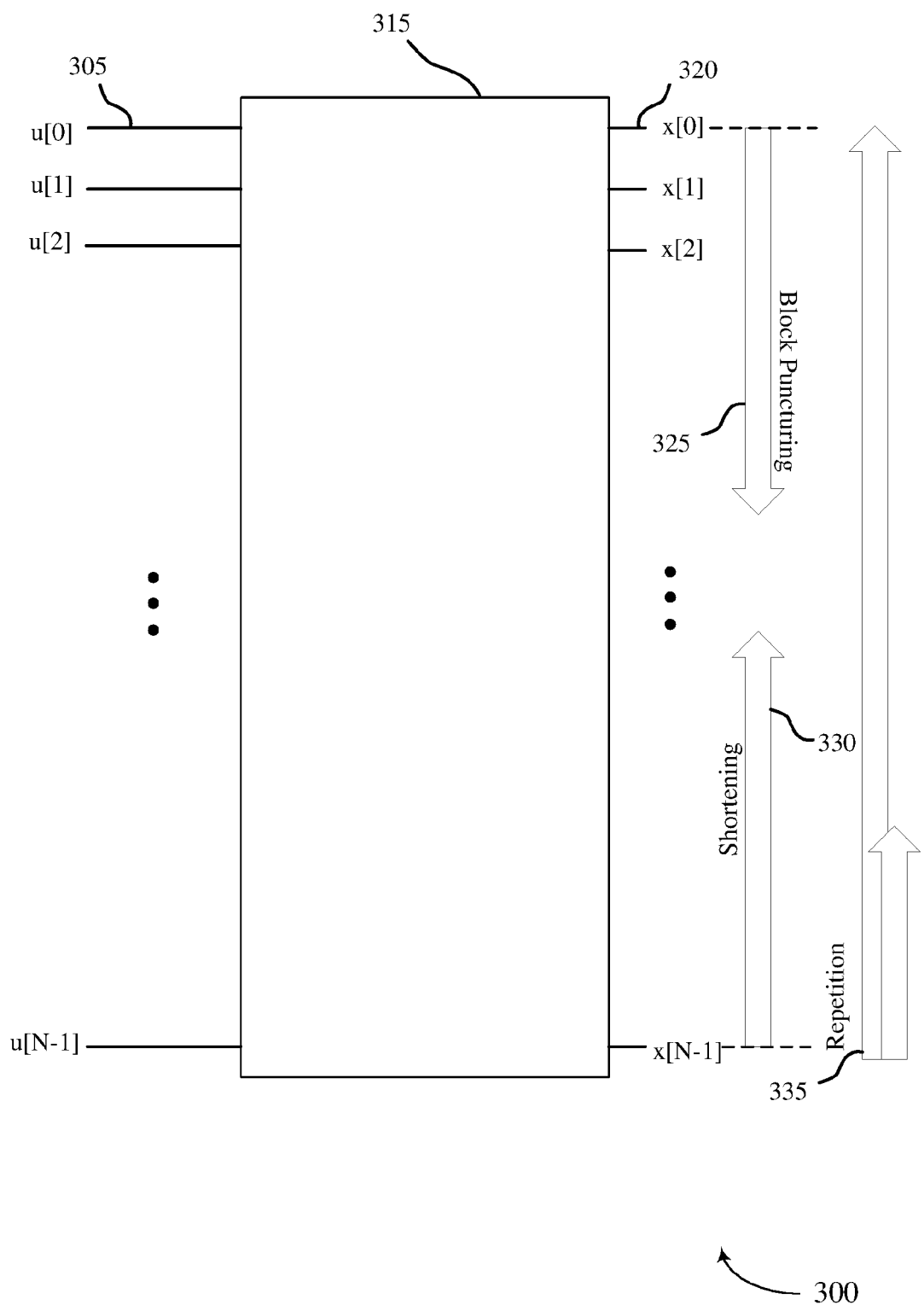
FIG. 3 illustrates an example of a polar encoder that supports rate-matching techniques for polar codes in accordance with aspects of the present disclosure.

FIG. 3 illustrates an example of a diagram 300 that supports rate-matching techniques for polar codes in accordance with various aspects of the present disclosure. In some examples, diagram 300 may implement aspects of wireless communication system 100.

Diagram 300 depicts a polar code that includes N channels for generating a polar-encoded codeword 320 with channel 0 on top, followed by channel 1, and proceeding sequentially to channel N−1. Generator matrix 315 is used by an encoder to encode information bits input to channels u[0:N−1] 305 to generate codeword channels x[0:N−1], and is used by a decoder to decode information received on codeword channels x[0:N−1] to obtain a representation of the information bits and frozen bits on channels u[0:N−1].

The polar encoder (e.g., polar encoder 215 of FIG. 2) may allocate the most reliable channels of a polar code to information bits (e.g., k information bits) and the least reliable channels of the polar code to frozen bits (e.g., N-k frozen bits). The sequence identifier (e.g., transmitter sequence identifier 210 of FIG. 2) may generate a bit index sequence of length N to inform the polar encoder of the order in which to load bits into the channels (e.g., which k bit channels to select of the N bit channels), or may specify the locations for information bits (e.g., using a binary bit vector of length N).

In cases where rate matching is employed on the encoded codeword 320, certain of the codeword channels may not be transmitted, or transmissions of certain codeword channels may be repeated. For example, if a block puncturing 325 rate matching scheme is used (where the arrow shows selection order of transmitted bits), a first number of codeword channels, starting at a beginning of the encoded codeword 320 in the example of FIG. 3, may not be transmitted. If a shortening 330 rate matching scheme is used, a certain number of codeword channels at an end of the encoded codeword 320 in the example of FIG. 3, may not be transmitted. If a repetition 335 rate matching scheme is used, the entire encoded codeword 320 may be transmitted, with one or more codeword channels retransmitted.

Figure 4:
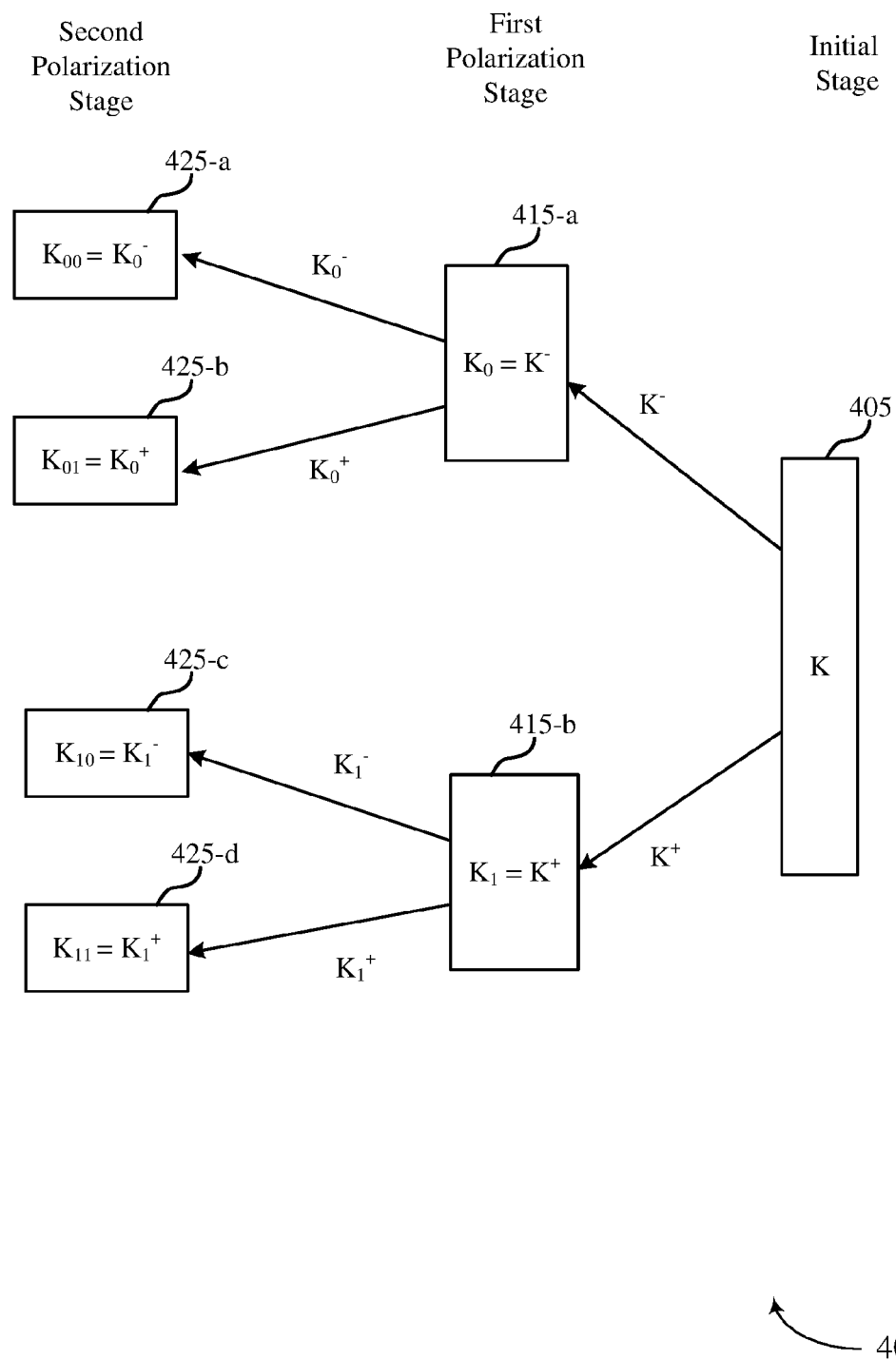
FIG. 4 illustrates an example of a polar code construction scheme that supports rate-matching techniques for polar codes in accordance with aspects of the present disclosure.

FIG. 4 illustrates an example of a polar code construction scheme 400 that supports rate-matching techniques for polar codes in accordance with various aspects of the present disclosure. In some examples, polar code construction scheme 400 may implement aspects of wireless communication system 100.

Depicted on the right in an initial stage is an unpolarized bit sequence having K information bits 405 and N total bits (e.g., information and frozen bits). The polar code construction scheme 400 may partition the K information bits at first and second polarization stages. At the first polarization stage, K0 of the K information bits may be allocated to partition 415-a, and K1 of the K information bits may be allocated to partition 415-b. At the second polarization stage, K00 of the K0 information bits may be allocated to partition 425-a, and K01 of the K0 information bits may be allocated to partition 425-b. Also at the second polarization stage, K10 of the K1 information bits may be allocated to partition 425-c, and K11 of the K1 information bits may be allocated to partition 425-d. The techniques described herein may be applied to additional polarization stages.

In systems that use rate matching, indices corresponding to punctured/shortened bits are not selected as information bits (K), and the information bit allocation may be adjusted such that information bits (K) may be allocated to upper and lower parts of the u domain according to the following:

For block puncturing: $K^- = \left\lfloor \left( R^2 + \left( -\frac{\left| R - \frac{1}{2} \right|}{32} + \frac{1}{64} \right) \right) \times (M - N/2) \right\rfloor$, $$K^+ = K - K^-,$$

where $R = \frac{K}{M}$, $K$ = number of information bits, $M$ = number of transmitted bits (after rate matching), and $N$ = mother code length.

For block shortening: $K^+ = \left\lfloor \left( 2R - R^2 - \left( -\frac{\left| R - \frac{1}{2} \right|}{32} + \frac{1}{64} \right) \right) \times (M - N/2) \right\rfloor$, $K^- = K - K^+$ where $R = \frac{K}{M}$, $K$ = number of information bits, $M$ = number of transmitted bits (after rate matching), and $N$ = mother code length.

Information bits may be adjusted, for example, at the first order polarization stage and $K^-$, $K^+$ may be derived over the upper and lower N/2 bits respectively from K over all N bits.

As indicated above, $$R = \frac{K}{M},$$

is used as a term for both block puncturing and shortening rate matching schemes, and requires a division operation using an arbitrary integer divisor. In some cases, such an operation may be a relatively computationally intensive operation, and results in a fraction for which high precision may need to be maintained in further processing steps. Thus, it may be desirable to avoid such a computationally intensive operation in order to reduce processing requirements or to reduce a number of gates needed for an encoder or decoder that is implemented in hardware rather than through a processor such as a digital signal processor. In various examples, techniques provided herein include a mapping between a value for R, and the values of N and M. In some examples, one or more mapping tables may be provided for (K,M) to $K^-$, $K^+$. In cases, where a large number of (K,M) may be available, such a table may be relatively large, but may provide values for R such that a division operation with an arbitrary integer divisor is not required at the encoder/decoder. Furthermore, the precision of R and the calculation may impact the actual number of $K^-$ and $K^+$, and even a 1-bit misalignment may cause errors in decoding results. In other examples, a lookup table may be used as a mapping table to map different ratios of K and M to values for R.

FIG. 5 illustrates an example of a lookup table 500 that supports rate-matching techniques for polar codes in accordance with various aspects of the present disclosure. In some examples, lookup table 500 may be implemented by aspects of wireless communication system 100.

In this example, a number of values 505 for a parameter β may be provided, where β equals to $$\frac{M}{N} - 0.5.$$

For available values of M and N, the value of β can be computed with relatively few processing resources or relatively few gates in a hardware-based encoder/decoder. Based on the definition of β, the relationship of R with β becomes:

$$R = \frac{K}{N} * 1/(\beta + 0.5).$$

Further, a parameter f(β)=1/(β+0.5) may be provided, which results in $$\tilde{R} = \frac{K}{N} * f(\beta).$$

A second set of values 510 for f(β) are provided in lookup table 500, which have values for corresponding β values 505. Thus, an encoder or decoder may utilize the lookup table 500 to identify a value of f(β) based on a calculated β value, which may then be multiplied by K/N to generate a value of R for use in determining $K^-$ or $K^+$ in accordance with the rate matching scheme being used. It is to be understood that the parameters β and f(β) in the example of FIG. 5 are provided for illustration and discussion purposes only, and that these parameters may be defined according to any relationship between the values on M and N, such as $$\beta = 2 * \frac{M}{N}$$

and f(β)=2/β, for example.

In some cases, if a value for β is not included in the lookup table 500, f(β) may be calculated based on one or more other values that are present in the lookup table 500. In some examples, a value for f(β) may be calculated using a first order interpolation based on f(β⁻) and f(β⁺), where β⁻ and β⁺ are the closest β values. In other examples, f(β) may be calculated as f(β)=f(β'), where β' is the closest value to β in the table. In some cases, β' may be the closest value to β that is not greater than β. Using such a lookup table 500 may thus provide enhanced efficiency in encoder and decoder operations when identifying bit locations and determining $K^-$ or $K^+$.

Figure 6:
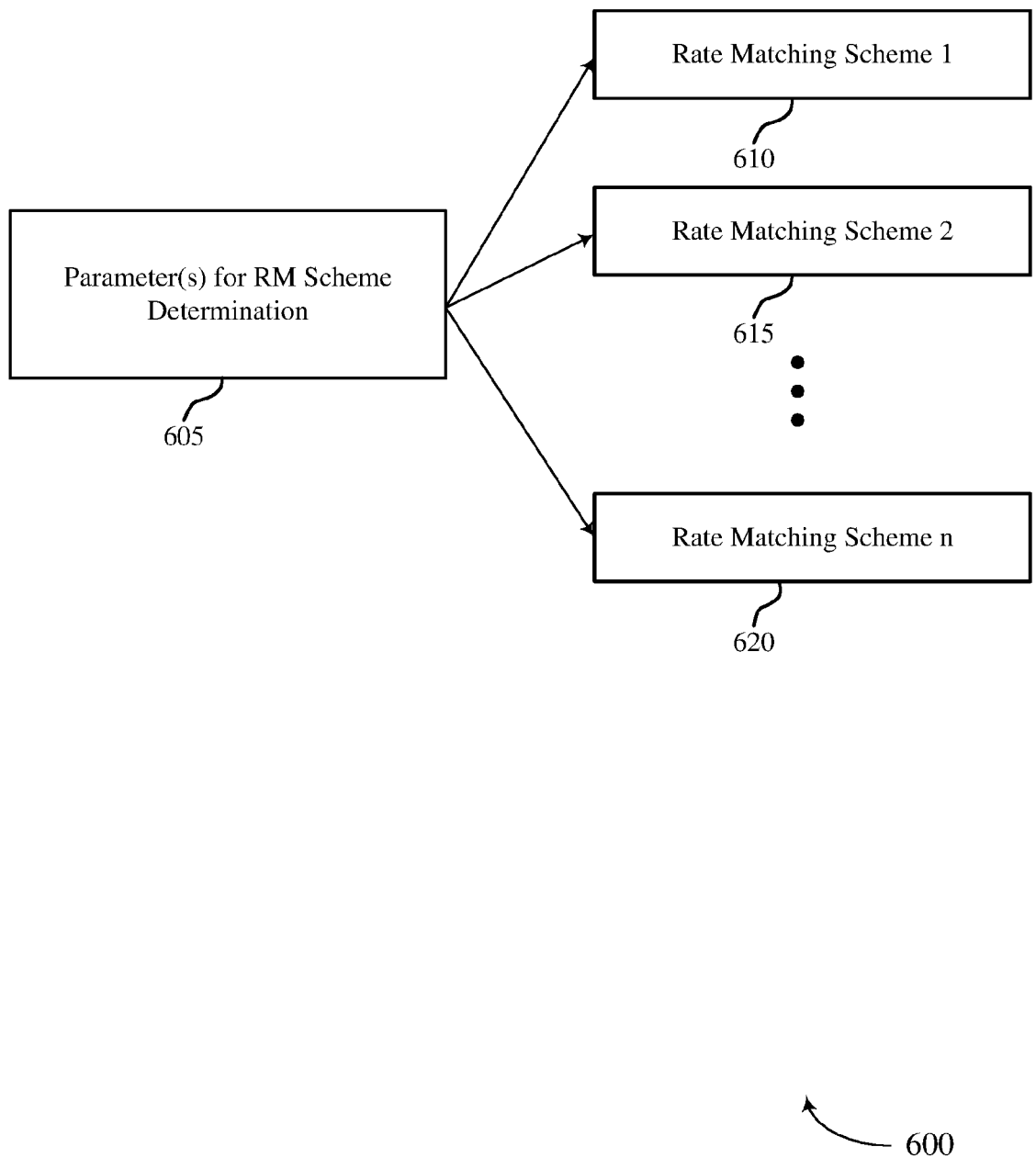
FIGS. 6 through 8 illustrate examples of rate matching scheme selection and switching that supports rate-matching techniques for polar codes in accordance with aspects of the present disclosure.
Figure 7:
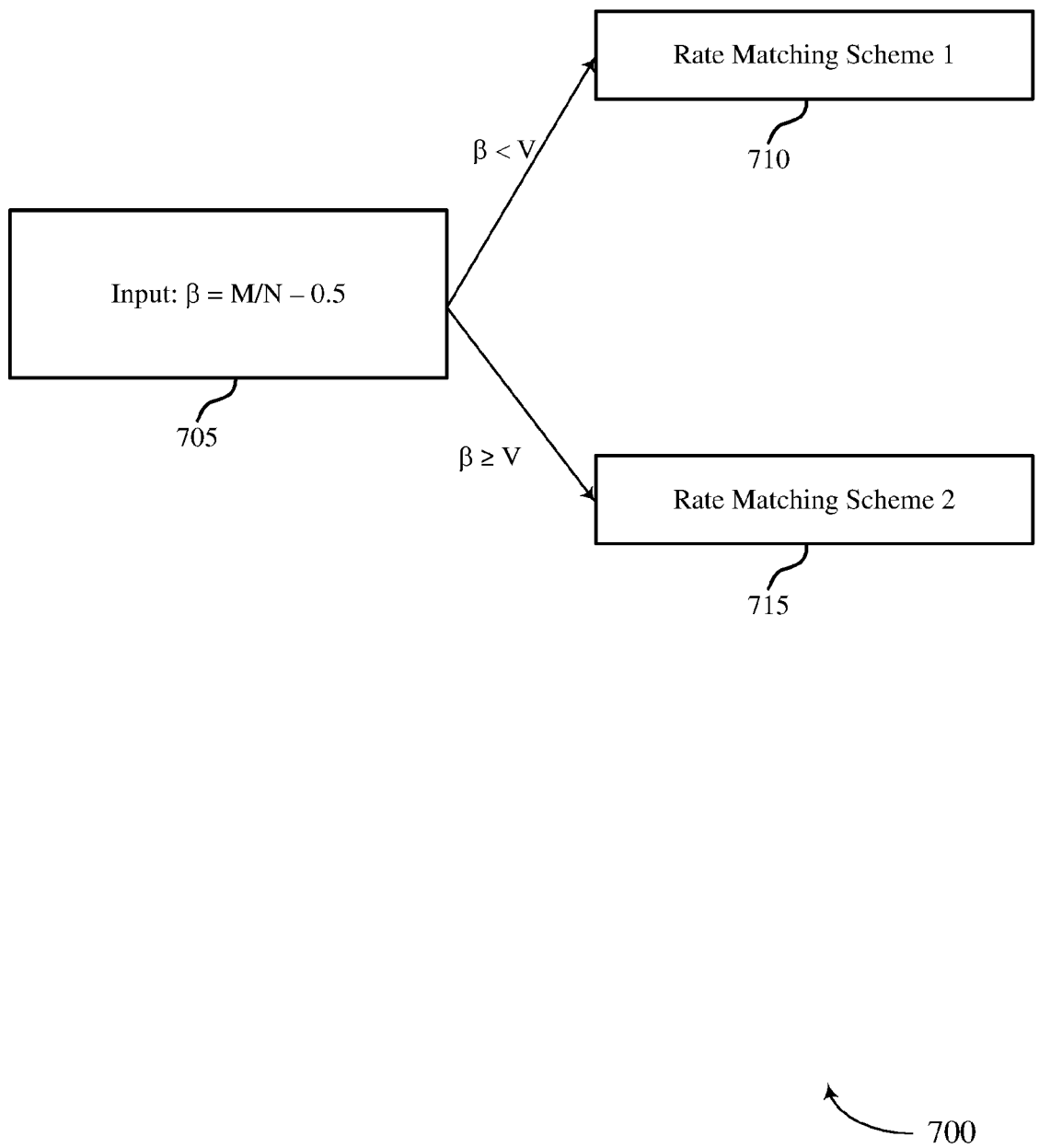
Figure 8:
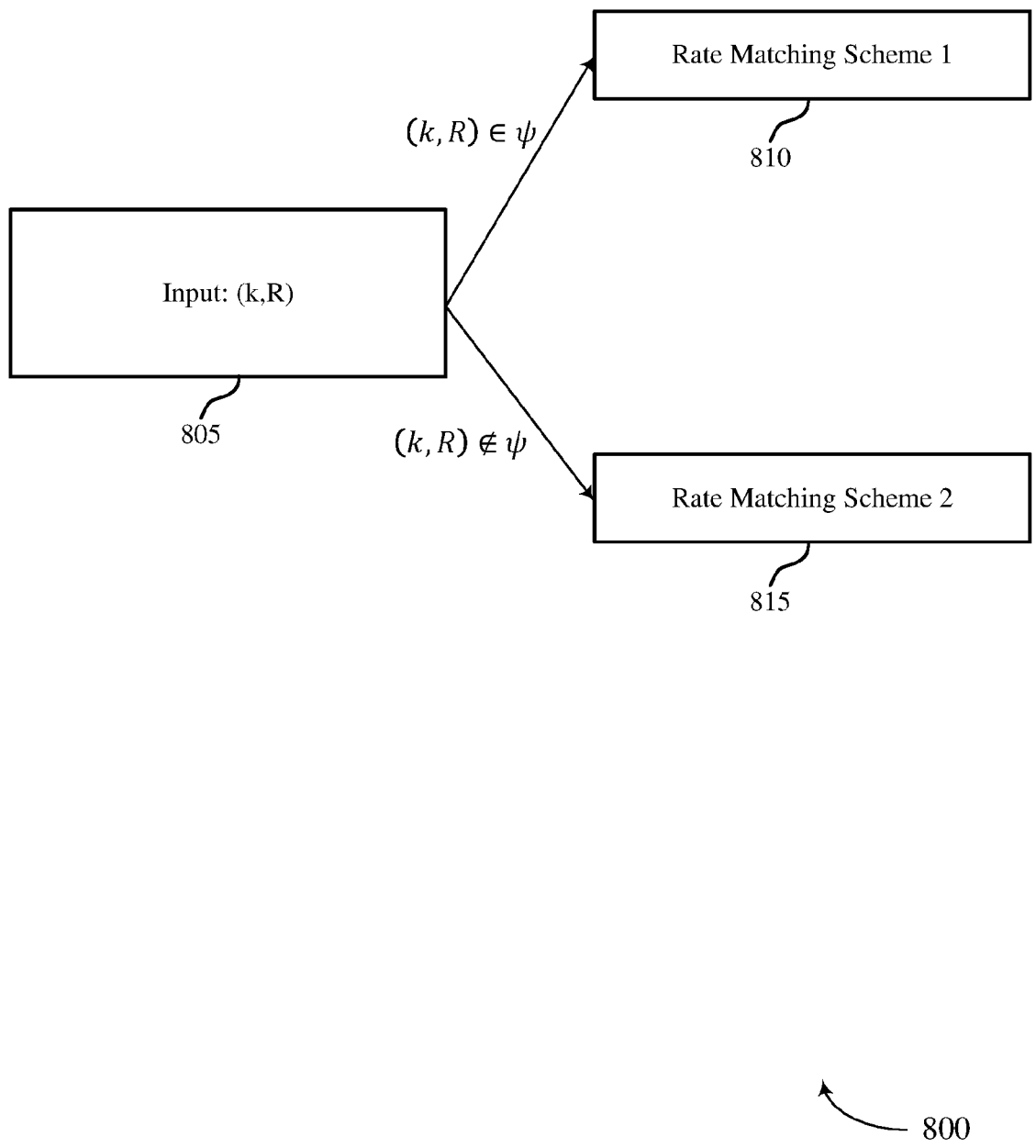

As indicated above, in some cases different rate matching schemes may be used in conjunction with polar encoding. Furthermore, different rate-matching schemes have different advantage and drawbacks. For example, some rate matching schemes may have good performance in general (and thus lower complexity), but may have relatively poor BLER performance for some polar coding parameters, while other rate matching schemes may have higher complexity, but better performance for certain polar coding parameters. Thus, based on the particular polar coding parameters, various techniques provided herein provide for selection of rate matching schemes based on one or more polar coding parameters. Furthermore, in some cases, switching between rate matching schemes may be provided based on changing parameters for polar coding. FIGS. 6 through 8 illustrate some examples for rate matching scheme selection, switching, or both.

FIG. 6 illustrates an example of a rate matching scheme selection 600 that supports rate-matching techniques for polar codes in accordance with various aspects of the present disclosure. In some examples, rate matching scheme selection 600 may implement aspects of wireless communication system 100. As indicated above, in some examples an encoder and decoder may select rate matching schemes, switch between rate matching schemes, or both, in order to achieve a performance and complexity trade-off for rate-matching.

In the example of FIG. 6, one or more parameter(s) 605 may be selected for determining a particular rate matching scheme 610 through 620 to use for rate matching. In some cases, an encoder may select a first rate matching scheme 610 based on one or more parameters. In some cases, the encoder may switch from the first rate matching scheme 610 to a second rate matching scheme 615 or an nth rate matching scheme 620, based on one or more parameters. In some examples, the one or more parameter(s) 605 may include:

K: bits input to Polar encoder;
M: encoder output bits of Polar codes (after rate matching);
N: mother code length for Polar codes;
R: K/M, coding rate;

$$\beta = \frac{M}{N} - 0.5,$$

or any function that inclusive of $$\frac{M}{N};$$

or
any combinations thereof.

In some examples, the different rate matching schemes 610 through 620 may include, for example, a first rate matching scheme 610 that adjusts the number of information bits in the information bit vector, a second rate matching scheme 615 that adjusts a block size of input data, a third rate matching scheme that interlaces portions of two or more input data blocks, or a fourth rate matching scheme that has one or more non-interlaced input data blocks and that interlaces two or more other input data blocks.

FIG. 7 illustrates an example of a rate matching scheme selection 700 that supports rate-matching techniques for polar codes in accordance with various aspects of the present disclosure. In some examples, rate matching scheme selection 700 may implement aspects of wireless communication system 100. In the example of FIG. 7, a first rate matching scheme 710 or a second rate matching scheme 715 may be selected based at least in part on a value of a parameter β, where $$\beta = \frac{M}{N} - 0.5.$$

In this example, if β<V, the first rate matching scheme 710 may be selected and if β≥V the second rate matching scheme 715 may be selected. The parameter V may be a switching value between rate matching schemes. In one example, V may be a set value, such as V=⅛. In other examples, one or more threshold values for V may be established, and the rate matching scheme selected based on the value of β in comparison to the one or more threshold values. In other examples, the value of V may be dependent on the value of R (which may be determined in a manner such as discussed above with respect to FIGS. 3 through 5). In one example, V=⅛ when ½<R<=⅓, and otherwise may be set to V=0 (i.e., the second rate matching scheme 715 is used).

FIG. 8 illustrates an example of a rate matching scheme selection 800 that supports rate-matching techniques for polar codes in accordance with various aspects of the present disclosure. In some examples, rate matching scheme selection 800 may implement aspects of wireless communication system 100. In the example of FIG. 8, a first rate matching scheme 710 or a second rate matching scheme 815 may be selected based at least in part on value of K and R (which may be determined in a manner such as discussed above with respect to FIGS. 3 through 5). In the example of FIG. 8, if the values for (k, R) are within a set (i.e., (k, R)∈ψ) the first rate matching scheme 810 may be selected, and if the values for (k, R) are not within the set (i.e., (k, R)∉ψ), then the second rate matching scheme 815 may be selected. It is to be understood that the examples of FIGS. 7 and 8 are provided for discussion and illustration purposes, and that numerous other parameters and associated values or thresholds may be used for selecting a rate matching schemes.

Figure 9:
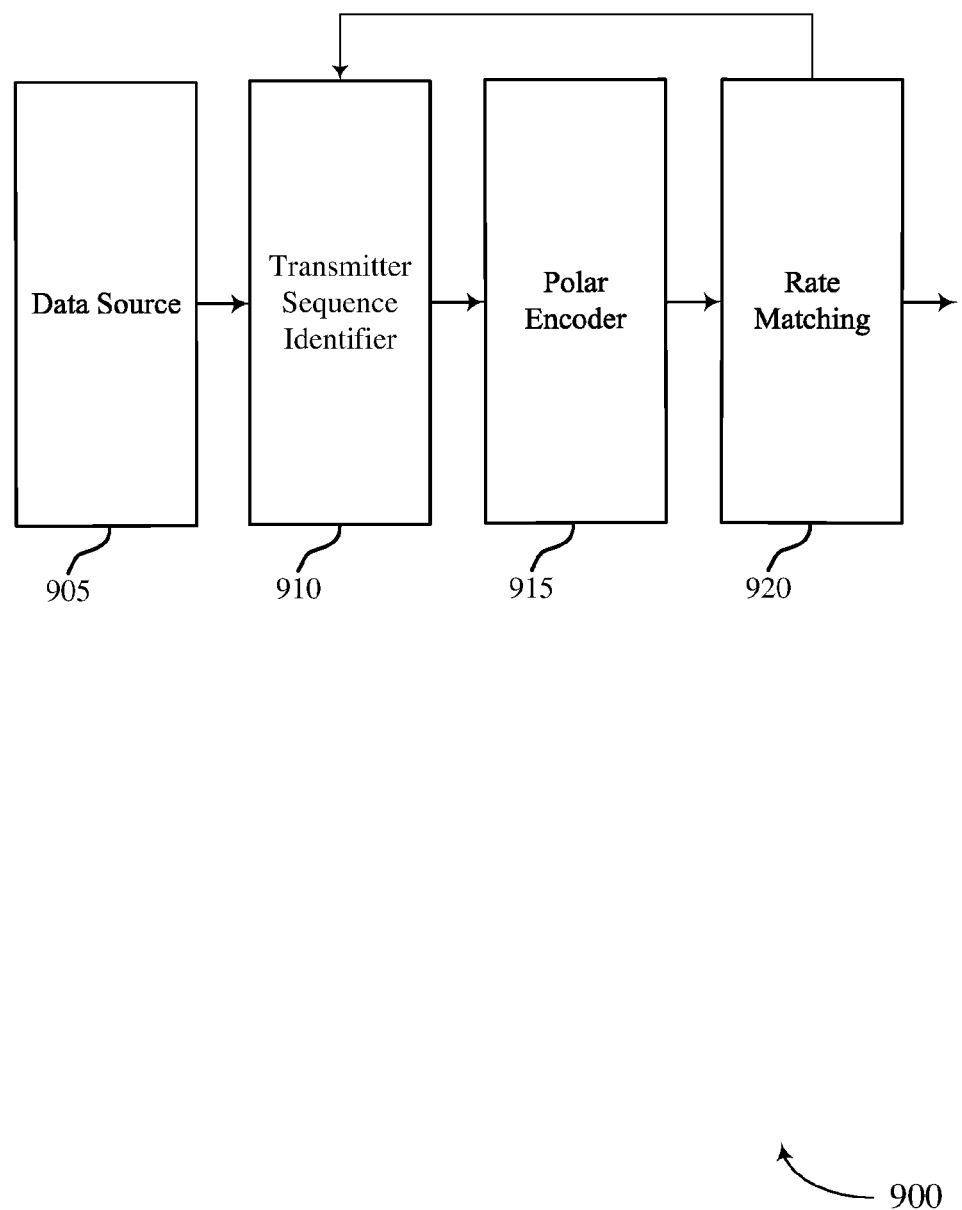
FIG. 9 illustrates an example of processing blocks that support rate-matching techniques for polar codes in accordance with aspects of the present disclosure.

FIG. 9 illustrates an example of example of processing blocks 900 that supports rate-matching techniques for polar codes in accordance with various aspects of the present disclosure. In some examples, processing blocks 900 may implement aspects of wireless communication system 100. As indicated above, in some cases different rate matching schemes may be selected for polar coding operations. In some cases, channel adjustments for information bits such as discussed above with respect to FIGS. 2 through 5 may be applied or concatenated to various different rate matching schemes.

In the example of FIG. 9, polar coding processing blocks 900 may include a data source 905, a transmitter sequence identifier 910, polar encoder 915, and a rate matching block 920. Similarly as discussed above with respect to FIG. 2, the data source 905 may provide an information vector of k information bits to be encoded and transmitted. The data source 905 may be coupled to a network, a storage device, or the like. The data source 905 may output the information vector to the transmitter sequence identifier 910. The transmitter sequence identifier 910 may select a mother code length N of a codeword and identify the k bit channels of the polar code for the k information bits. The transmitter sequence identifier 910 may output k information bits, the identified bit channel indices, and the length N to the polar encoder 915 for polar encoding. In some cases, transmitter sequence identifier 910 may provide the bit channel indices based on a rate matching scheme of the rate matching block 920.

In some cases, information bits (k) allocated to upper and lower parts of the u domain may be adjusted according to the following:

For block puncturing: $K^- = \left\lfloor \left( R^2 + \left( -\frac{\left\lfloor R - \frac{1}{2} \right\rfloor}{32} + \frac{1}{64} \right) \right) \times J \right\rfloor,$ $$K^+ = K - K^-,$$

where $R = \dfrac{K}{M}$.

For block shortening: $K^+ = \left\lfloor \left( 2R - R^2 - \left( -\dfrac{\left|R - \tfrac{1}{2}\right|}{32} + \dfrac{1}{64} \right) \right) \times J \right\rfloor$, $$K^- = K - K^+ \text{ where } R = \dfrac{K}{M}.$$

In this example, J may be the number of non-punctured or non-shortened bits in the upper or lower part of the x-domain bits. For example, in a rate matching scheme that provides interlaced x-domain bits to provide encoded codeword bits into the rate matching block 920 such that the punctured or shortened bits appear as the last bits in a buffer, J may be calculated according to the following relationships (wherein M and N are defined according to the definitions as discussed with respect to FIGS. 2 through 5):

$M \geq {}^{12}\!/_{16}*N : J = M - N/2$ $M \geq {}^{11}\!/_{16}*N \ \& \ M < {}^{12}\!/_{16}*N : J = {}^{4}\!/_{16}*N$ $M < {}^{11}\!/_{16}*N : J = M - (N/2 - {}^{1}\!/_{16}*N)$.

In other cases, J may be calculated in other manners, such as (M−N/2) as discussed above with respect to FIGS. 2 through 5, for example. For example, a set of relationships or functions for J may be given for each of a set of rate matching schemes, with the selected relationship or function selected based on the selected rate matching scheme and the number of transmitted bits relative to the mother code length. In any event, the value for R may be determined according to the techniques as discussed above, which may reduce the computation resources or hardware needed for determining K+ and K−.

Figure 10:
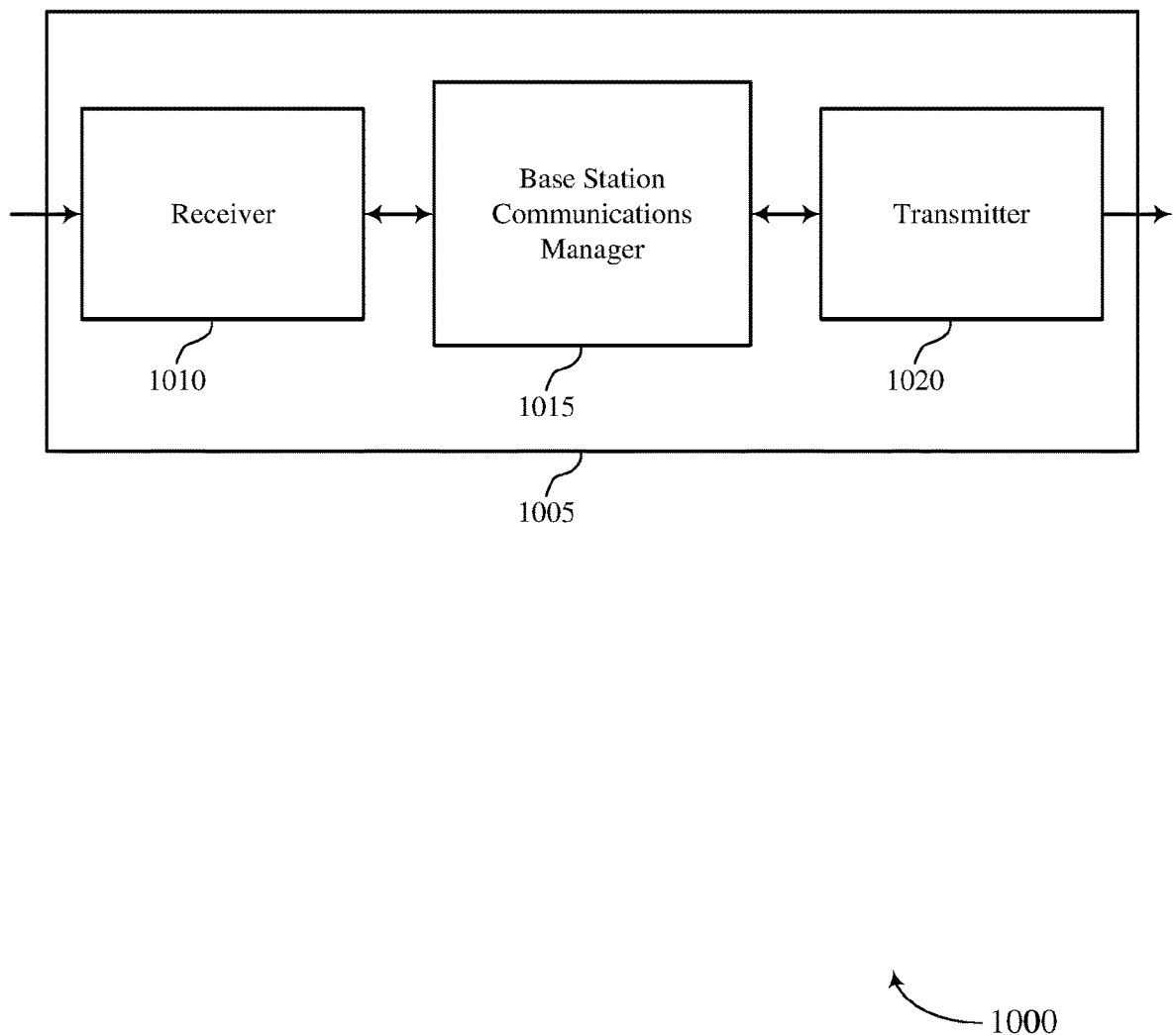
FIGS. 10 through 12 show block diagrams of a device that supports rate-matching techniques for polar codes in accordance with aspects of the present disclosure.

FIG. 10 shows a block diagram 1000 of a wireless device 1005 that supports rate-matching techniques for polar codes in accordance with aspects of the present disclosure. Wireless device 1005 may be an example of aspects of a base station 105 as described herein. Wireless device 1005 may include receiver 1010, base station communications manager 1015, and transmitter 1020. Wireless device 1005 may also include a processor. Each of these components may be in communication with one another (e.g., via one or more buses).

Receiver 1010 may receive information such as packets, user data, or control information associated with various information channels (e.g., control channels, data channels, and information related to rate-matching techniques for polar codes, etc.). Information may be passed on to other components of the device. The receiver 1010 may be an example of aspects of the transceiver 1335 described with reference to FIG. 13. The receiver 1010 may utilize a single antenna or a set of antennas.

Base station communications manager 1015 may be an example of aspects of the base station communications manager 1315 described with reference to FIG. 13.

Base station communications manager 1015 and/or at least some of its various sub-components may be implemented in hardware, software executed by a processor, firmware, or any combination thereof. If implemented in software executed by a processor, the functions of the base station communications manager 1015 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The base station communications manager 1015 and/or at least some of its various sub-components may be physically located at various positions, including being distributed such that portions of functions are implemented at different physical locations by one or more physical devices. In some examples, base station communications manager 1015 and/or at least some of its various sub-components may be a separate and distinct component in accordance with various aspects of the present disclosure. In other examples, base station communications manager 1015 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Base station communications manager 1015 may identify an information bit vector including a number of information bits to be encoded using a polar code, identify a first number of bits of a codeword generated from the information bit vector to be transmitted, identify a set of bit locations of the polar code for the number of information bits, where the set of bit locations is determined based on partitioning of a set of bit-channels of the polar code for a first order polarization stage and assigning portions of the number of information bits to a first bit-channel partition and a second bit-channel partition of the first order polarization stage, where a capacity of the set of bit-channels of the first order polarization stage is based on a transmission capacity factor determined according to a mapping between one or more of a mother polar code length for the codeword, the first number of bits, or a set of predetermined transmission capacity factors, encode the information bit vector according to the set of bit locations using the polar code to obtain the codeword, and rate matching the codeword to the first number of bits.

The base station communications manager 1015 may also identify an information bit vector including a number of information bits to be encoded using a polar code, identify one or more transmission parameters for a codeword to be generated from the information bit vector using the polar code, select a first rate matching scheme for determining a first number of bits of the codeword to be transmitted, the first rate matching scheme being selected from a set of rate matching schemes based on the one or more transmission parameters, identify a set of bit locations of the polar code for the number of information bits based on the first number of bits and the number of information bits, encode the information bit vector according to the set of bit locations using the polar code, and rate matching the codeword to the first number of bits using the first rate matching scheme.

The base station communications manager 1015 may also identify an information bit vector including a number of information bits to be encoded using a polar code, identify a first number of bits of a codeword generated from the information bit vector to be transmitted, identify a set of bit locations of the polar code for the set of information bits, where the set of bit locations is determined based on partitioning of a set of bit-channels of the polar code for a first order polarization stage and assigning portions of a number of the set of information bits to a first bit-channel partition and a second bit-channel partition of the first order polarization stage, where a capacity for the first bit-channel partition or a capacity of the second bit-channel partition is based on one of a set of functions of a number of the set of bit-channels for the first order polarization stage, where the one of the set of functions is determined based on the first number of bits, encode the information bit vector according to the set of bit locations using the polar code to obtain the codeword, and rate matching the codeword to the first number of bits.

Transmitter 1020 may transmit signals generated by other components of the device. In some examples, the transmitter 1020 may be collocated with a receiver 1010 in a transceiver module. For example, the transmitter 1020 may be an example of aspects of the transceiver 1335 described with reference to FIG. 13. The transmitter 1020 may utilize a single antenna or a set of antennas. Transmitter 1020 also may transmit the rate matched codeword over a wireless channel.

Figure 11:
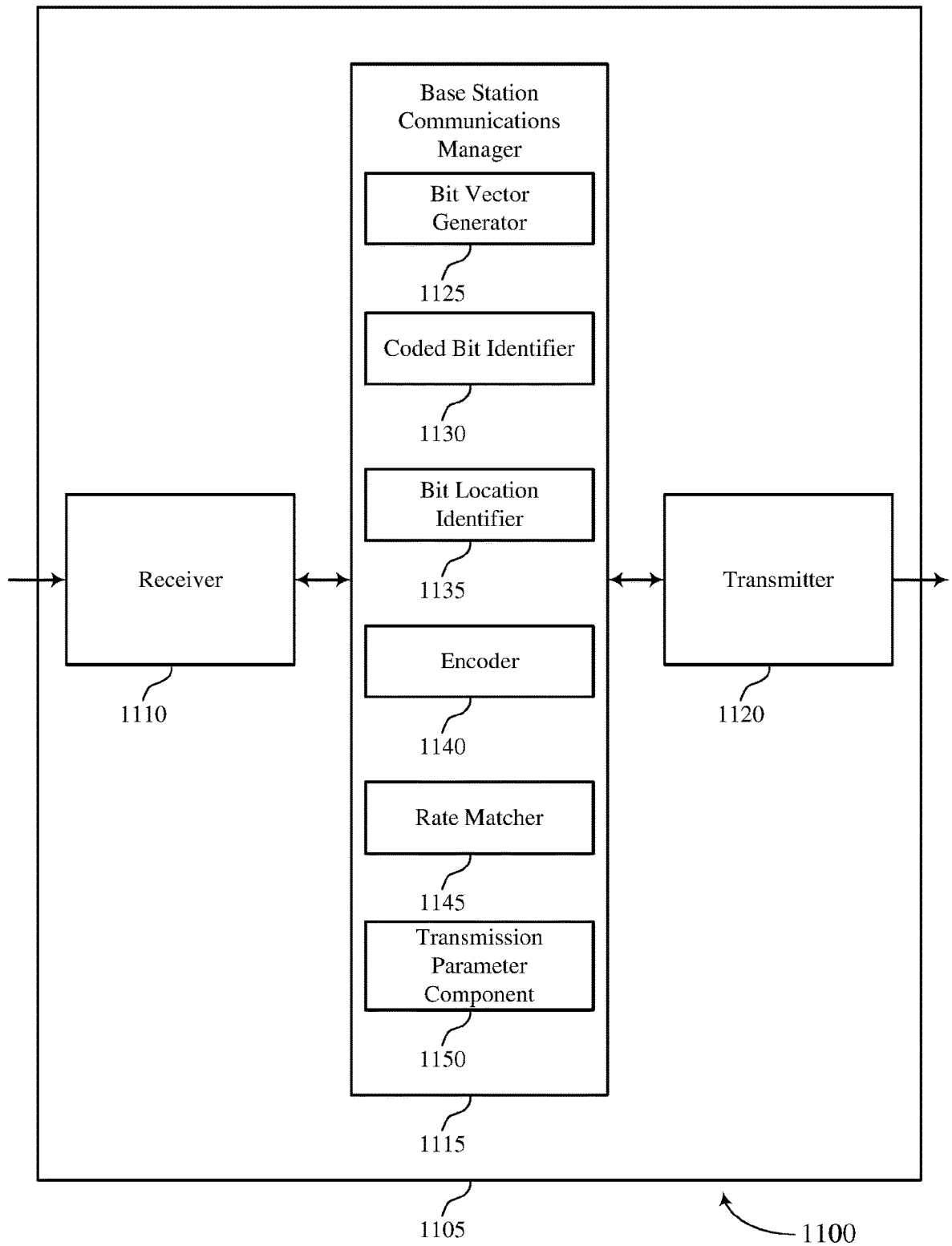

FIG. 11 shows a block diagram 1100 of a wireless device 1105 that supports rate-matching techniques for polar codes in accordance with aspects of the present disclosure. Wireless device 1105 may be an example of aspects of a wireless device 1005 or a base station 105 as described with reference to FIG. 10. Wireless device 1105 may include receiver 1110, base station communications manager 1115, and transmitter 1120. Wireless device 1105 may also include a processor. Each of these components may be in communication with one another (e.g., via one or more buses).

Receiver 1110 may receive information such as packets, user data, or control information associated with various information channels (e.g., control channels, data channels, and information related to rate-matching techniques for polar codes, etc.). Information may be passed on to other components of the device. The receiver 1110 may be an example of aspects of the transceiver 1335 described with reference to FIG. 13. The receiver 1110 may utilize a single antenna or a set of antennas.

Base station communications manager 1115 may be an example of aspects of the base station communications manager 1315 described with reference to FIG. 13.

Base station communications manager 1115 may also include bit vector generator 1125, coded bit identifier 1130, bit location identifier 1135, encoder 1140, rate matcher 1145, and transmission parameter component 1150.

Bit vector generator 1125 may identify an information bit vector including a number of information bits to be encoded using a polar code. Coded bit identifier 1130 may identify a first number of bits of a codeword generated from the information bit vector to be transmitted.

Bit location identifier 1135 may identify a set of bit locations of the polar code for the number of information bits, where the set of bit locations is determined based on partitioning of a set of bit-channels of the polar code for a first order polarization stage and assigning portions of the number of information bits to a first bit-channel partition and a second bit-channel partition of the first order polarization stage, where a capacity of the set of bit-channels of the first order polarization stage is based on a transmission capacity factor determined according to a mapping between one or more of a mother polar code length for the codeword, the first number of bits, or a set of predetermined transmission capacity factors. In some cases, bit location identifier 1135 may identify a set of bit locations of the polar code for the number of information bits based on the first number of bits and the number of information bits. In some cases, bit location identifier 1135 may identify a set of bit locations of the polar code for the set of information bits, where the set of bit locations is determined based on partitioning a set of bit-channels of the polar code for a first order polarization stage and assigning portions of a number of the set of information bits to a first bit-channel partition and a second bit-channel partition of the first order polarization stage, where a capacity for the first bit-channel partition or a capacity of the second bit-channel partition is based on one of a set of functions of a number of the set of bit-channels for the first order polarization stage, where the one of the set of functions is determined based on the first number of bits. In some cases, the set of functions correspond to a set of different rate matching schemes. In some cases, the one of the set of functions is further determined based on a mother polar code length for the codeword. In some cases, the one of the set of functions is further determined based on a value of the first number of bits relative to a mother polar code length for the codeword.

Encoder 1140 may encode the information bit vector according to the set of bit locations using the polar code to obtain the codeword.

Rate matcher 1145 may perform rate matching of the codeword to the first number of bits. In some cases, rate matcher 1145 may select a first rate matching scheme for determining a first number of bits of the codeword to be transmitted, the first rate matching scheme being selected from a set of rate matching schemes based on the one or more transmission parameters, and may rate match the codeword to the first number of bits using the first rate matching scheme. In some cases, rate matcher 1145 may switch to a second rate matching scheme of the set of rate matching schemes based on one or more updates to the one or more transmission parameters associated with the transmission. In some cases, the set of rate matching schemes include one or more of a first rate matching scheme that adjusts the number of information bits in the information bit vector, a second rate matching scheme that adjusts a block size of input data, a third rate matching scheme that interlaces portions of two or more input data blocks, or a fourth rate matching scheme that has one or more non-interlaced input data blocks and that interlaces two or more other input data blocks. In some cases, the first rate matching scheme is selected based on one or more of a value of a first parameter of the one or more transmission parameters relative to a first threshold value for the first parameter, a value of a ratio of the first number of bits and a mother code length relative to a second threshold value, a value of a coding rate of the codeword, or whether a value of each of the one or more transmission parameters belongs to a set of values associated with each rate matching scheme of the set of rate matching schemes.

Transmission parameter component 1150 may identify one or more transmission parameters for a codeword to be generated from the information bit vector using the polar code. In some cases, the one or more transmission parameters include one or more of the number of information bits in the information bit vector, the first number of bits, a mother code length for polar codes of the transmission, a ratio of the number of information bits and the first number of bits or a coding rate, a ratio of the first number of bits and the mother code length, or any combination thereof.

Transmitter 1120 may transmit signals generated by other components of the device. In some examples, the transmitter 1120 may be collocated with a receiver 1110 in a transceiver module. For example, the transmitter 1120 may be an example of aspects of the transceiver 1335 described with reference to FIG. 13. The transmitter 1120 may utilize a single antenna or a set of antennas.

Figure 12:
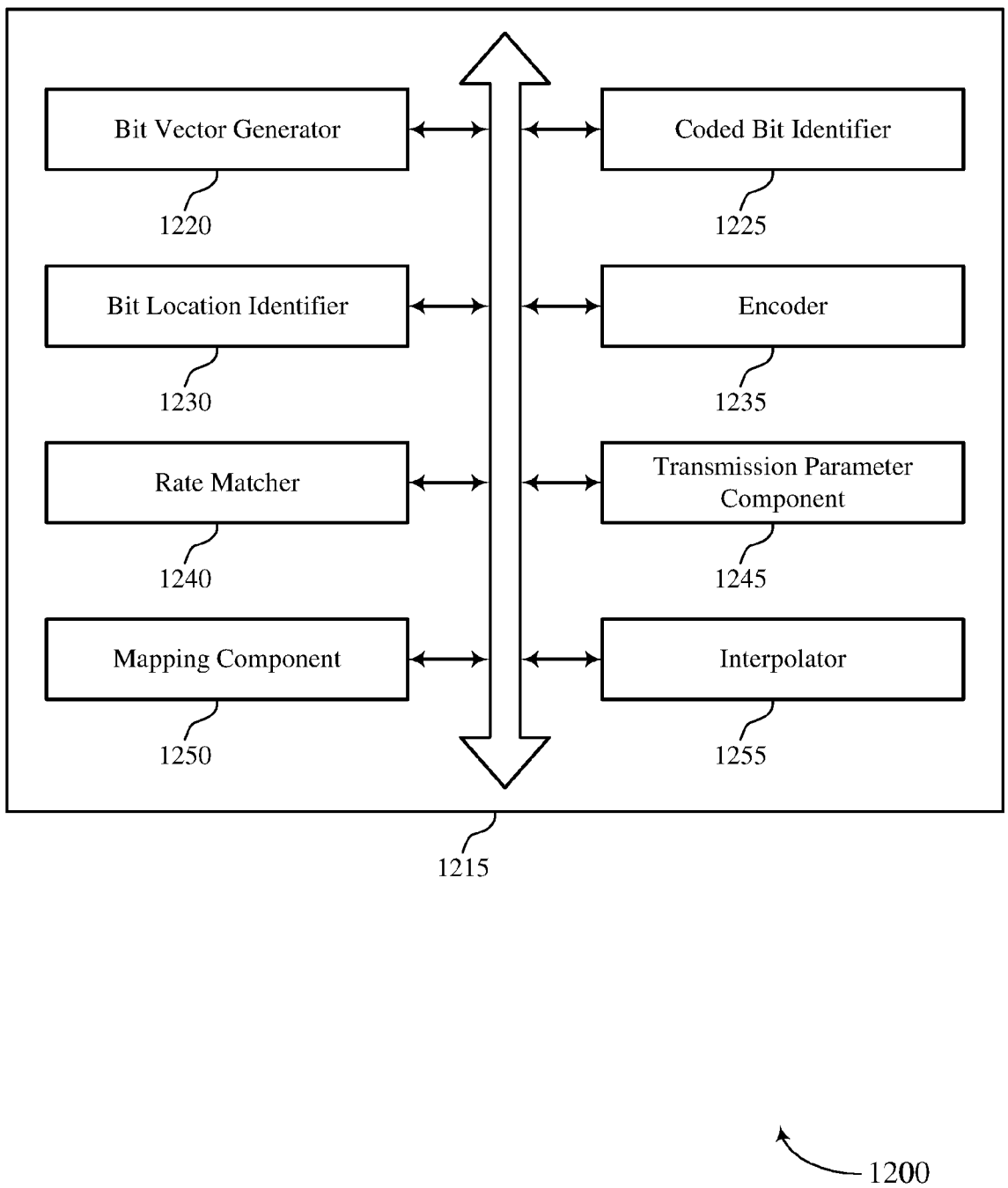

FIG. 12 shows a block diagram 1200 of a base station communications manager 1215 that supports rate-matching techniques for polar codes in accordance with aspects of the present disclosure. The base station communications manager 1215 may be an example of aspects of a base station communications manager 1015, a base station communications manager 1115, or a base station communications manager 1315 described with reference to FIGS. 10, 11, and 13. The base station communications manager 1215 may include bit vector generator 1220, coded bit identifier 1225, bit location identifier 1230, encoder 1235, rate matcher 1240, transmission parameter component 1245, mapping component 1250, and interpolator 1255. Each of these modules may communicate, directly or indirectly, with one another (e.g., via one or more buses).

Bit vector generator 1220 may identify an information bit vector including a number of information bits to be encoded using a polar code. Coded bit identifier 1225 may identify a first number of bits of a codeword generated from the information bit vector to be transmitted.

Bit location identifier 1230 may identify a set of bit locations of the polar code for the number of information bits, where the set of bit locations is determined based on partitioning of a set of bit-channels of the polar code for a first order polarization stage and assigning portions of the number of information bits to a first bit-channel partition and a second bit-channel partition of the first order polarization stage, where a capacity of the set of bit-channels of the first order polarization stage is based on a transmission capacity factor determined according to a mapping between one or more of a mother polar code length for the codeword, the first number of bits, or a set of predetermined transmission capacity factors. In some cases, bit location identifier 1230 may identify a set of bit locations of the polar code for the number of information bits based on the first number of bits and the number of information bits. In some cases, bit location identifier 1230 may identify a set of bit locations of the polar code for the set of information bits, where the set of bit locations is determined based on partitioning of a set of bit-channels of the polar code for a first order polarization stage and assigning portions of a number of the set of information bits to a first bit-channel partition and a second bit-channel partition of the first order polarization stage, where a capacity for the first bit-channel partition or a capacity of the second bit-channel partition is based on one of a set of functions of a number of the set of bit-channels for the first order polarization stage, where the one of the set of functions is determined based on the first number of bits. In some cases, the set of functions correspond to a set of different rate matching schemes. In some cases, the one of the set of functions is further determined based on a mother polar code length for the codeword. In some cases, the one of the set of functions is further determined based on a value of the first number of bits relative to a mother polar code length for the codeword.

Encoder 1235 may encode the information bit vector according to the set of bit locations using the polar code to obtain the codeword.

Rate matcher 1240 may perform rate matching of the codeword to the first number of bits. In some cases, rate matcher 1240 may select a first rate matching scheme for determining a first number of bits of the codeword to be transmitted, the first rate matching scheme being selected from a set of rate matching schemes based on the one or more transmission parameters, and may rate match the codeword to the first number of bits using the first rate matching scheme. In some cases, rate matcher 1240 may switch to a second rate matching scheme of the set of rate matching schemes based on one or more updates to the one or more transmission parameters associated with the transmission. In some cases, the set of rate matching schemes include one or more of a first rate matching scheme that adjusts the number of information bits in the information bit vector, a second rate matching scheme that adjusts a block size of input data, a third rate matching scheme that interlaces portions of two or more input data blocks, or a fourth rate matching scheme that has one or more non-interlaced input data blocks and that interlaces two or more other input data blocks. In some cases, the first rate matching scheme is selected based on one or more of a value of a first parameter of the one or more transmission parameters relative to a first threshold value for the first parameter, a value of a ratio of the first number of bits and a mother code length relative to a second threshold value, a value of a coding rate of the codeword, or whether a value of each of the one or more transmission parameters belongs to a set of values associated with each rate matching scheme of the set of rate matching schemes.

Transmission parameter component 1245 may identify one or more transmission parameters for a codeword to be generated from the information bit vector using the polar code. In some cases, the one or more transmission parameters include one or more of the number of information bits in the information bit vector, the first number of bits, a mother code length for polar codes of the transmission, a ratio of the number of information bits and the first number of bits or a coding rate, a ratio of the first number of bits and the mother code length, or any combination thereof.

Mapping component 1250 may provide a mapping or lookup table for one or more parameters such as the transmission capacity factor. In some cases, the transmission capacity factor is based on a ratio of the first number of bits to the mother polar code length for the codeword. In some cases, the mapping provides a set of transmission capacity factor values, each transmission capacity factor value corresponding to an associated rate matching ratio value that is determined based on the first number of bits and the mother polar code length for the codeword. In some cases, the mapping is provided in a lookup table containing the set of rate matching ratio values and the set of transmission capacity factor values. In some cases, the identifying the set of bit locations further includes determining a calculated rate matching ratio between the first number of bits and the mother polar code length, identifying a first rate matching ratio value and a second rate matching ratio value from the lookup table, the calculated rate matching ratio being interpolated based on the first rate matching ratio value and the second rate matching ratio value. In some cases, the transmission capacity factor may be selected as the first rate matching ratio value or the second rate matching ratio value based on which of the first rate matching ratio value or the second rate matching ratio value is closest to the calculated rate matching ratio.

Interpolator 1255 may determine a calculated rate matching ratio between the first number of bits and the mother polar code length. In some cases, a first rate matching ratio value and a second rate matching ratio value may be identified from the lookup table, and the calculated rate matching ratio may be determined as an interpolation between a first transmission capacity factor value associated with the first rate matching ratio value and a second transmission capacity factor value associated with the second rate matching ratio value. In some cases, the interpolation is a first order linear interpolation.

Figure 13:
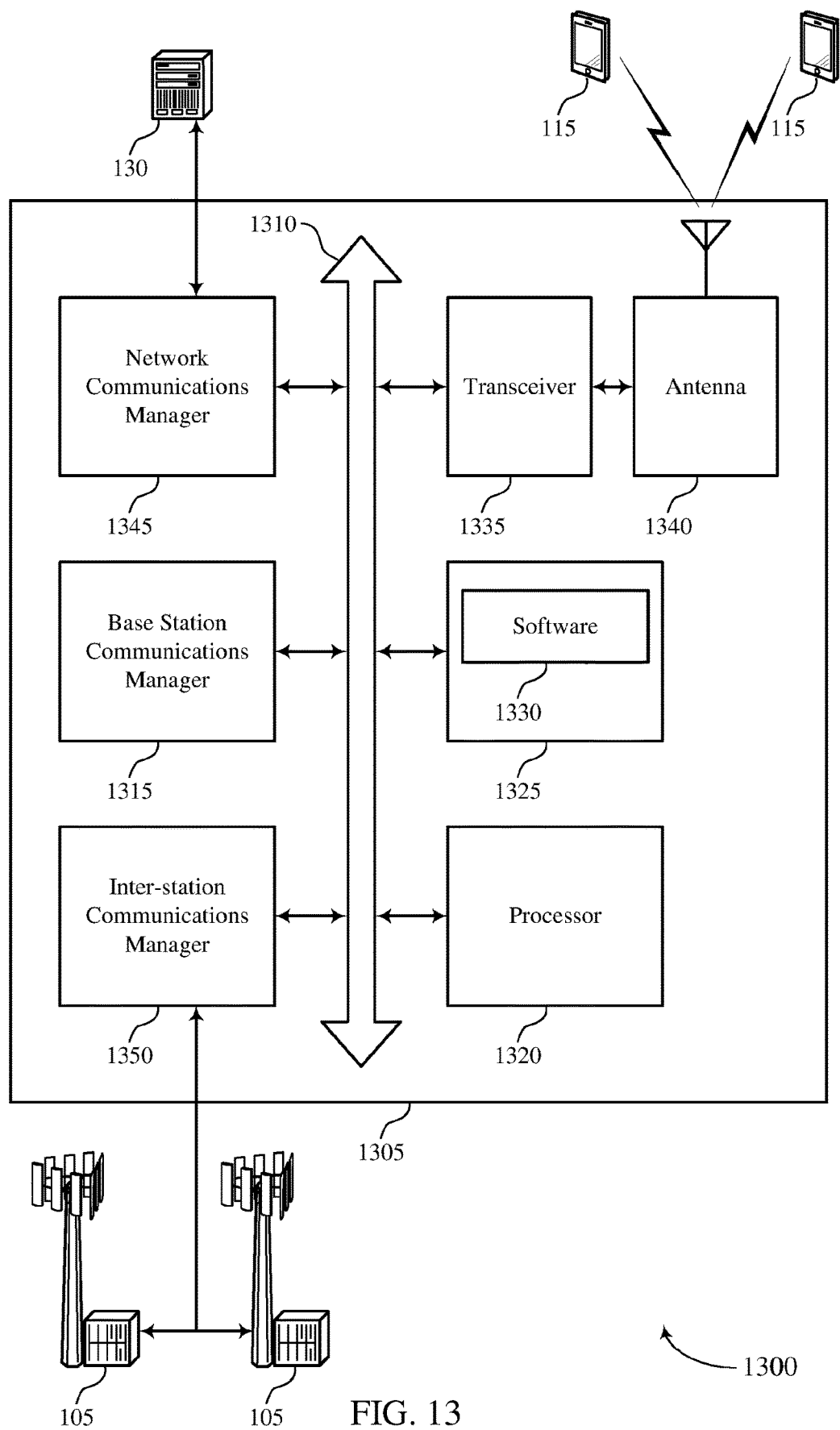
FIG. 13 illustrates a block diagram of a system including a base station that supports rate-matching techniques for polar codes in accordance with aspects of the present disclosure.

FIG. 13 shows a diagram of a system 1300 including a device 1305 that supports rate-matching techniques for polar codes in accordance with aspects of the present disclosure. Device 1305 may be an example of or include the components of wireless device 1005, wireless device 1105, or a base station 105 as described above, e.g., with reference to FIGS. 10 and 11. Device 1305 may include components for bi-directional voice and data communications including components for transmitting and receiving communications, including base station communications manager 1315, processor 1320, memory 1325, software 1330, transceiver 1335, antenna 1340, network communications manager 1345, and inter-station communications manager 1350. These components may be in electronic communication via one or more buses (e.g., bus 1310). Device 1305 may communicate wirelessly with one or more user equipment (UE)s 115.

Processor 1320 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1320 may be configured to operate a memory array using a memory controller. In other cases, a memory controller may be integrated into processor 1320. Processor 1320 may be configured to execute computer-readable instructions stored in a memory to perform various functions (e.g., functions or tasks supporting rate-matching techniques for polar codes).

Memory 1325 may include random access memory (RAM) and read only memory (ROM). The memory 1325 may store computer-readable, computer-executable software 1330 including instructions that, when executed, cause the processor to perform various functions described herein. In some cases, the memory 1325 may contain, among other things, a basic input/output system (BIOS) which may control basic hardware or software operation such as the interaction with peripheral components or devices.

Software 1330 may include code to implement aspects of the present disclosure, including code to support rate-matching techniques for polar codes. Software 1330 may be stored in a non-transitory computer-readable medium such as system memory or other memory. In some cases, the software 1330 may not be directly executable by the processor but may cause a computer (e.g., when compiled and executed) to perform functions described herein.

Transceiver 1335 may communicate bi-directionally, via one or more antennas, wired, or wireless links as described above. For example, the transceiver 1335 may represent a wireless transceiver and may communicate bi-directionally with another wireless transceiver. The transceiver 1335 may also include a modem to modulate the packets and provide the modulated packets to the antennas for transmission, and to demodulate packets received from the antennas.

In some cases, the wireless device may include a single antenna 1340. However, in some cases the device may have more than one antenna 1340, which may be capable of concurrently transmitting or receiving multiple wireless transmissions.

Network communications manager 1345 may manage communications with the core network (e.g., via one or more wired backhaul links). For example, the network communications manager 1345 may manage the transfer of data communications for client devices, such as one or more UEs 115.

Inter-station communications manager 1350 may manage communications with other base station 105, and may include a controller or scheduler for controlling communications with UEs 115 in cooperation with other base stations 105. For example, the inter-station communications manager 1350 may coordinate scheduling for transmissions to UEs 115 for various interference mitigation techniques such as beamforming or joint transmission. In some examples, inter-station communications manager 1350 may provide an X2 interface within an Long Term Evolution (LTE)/LTE-A wireless communication network technology to provide communication between base stations 105.

Figure 14:
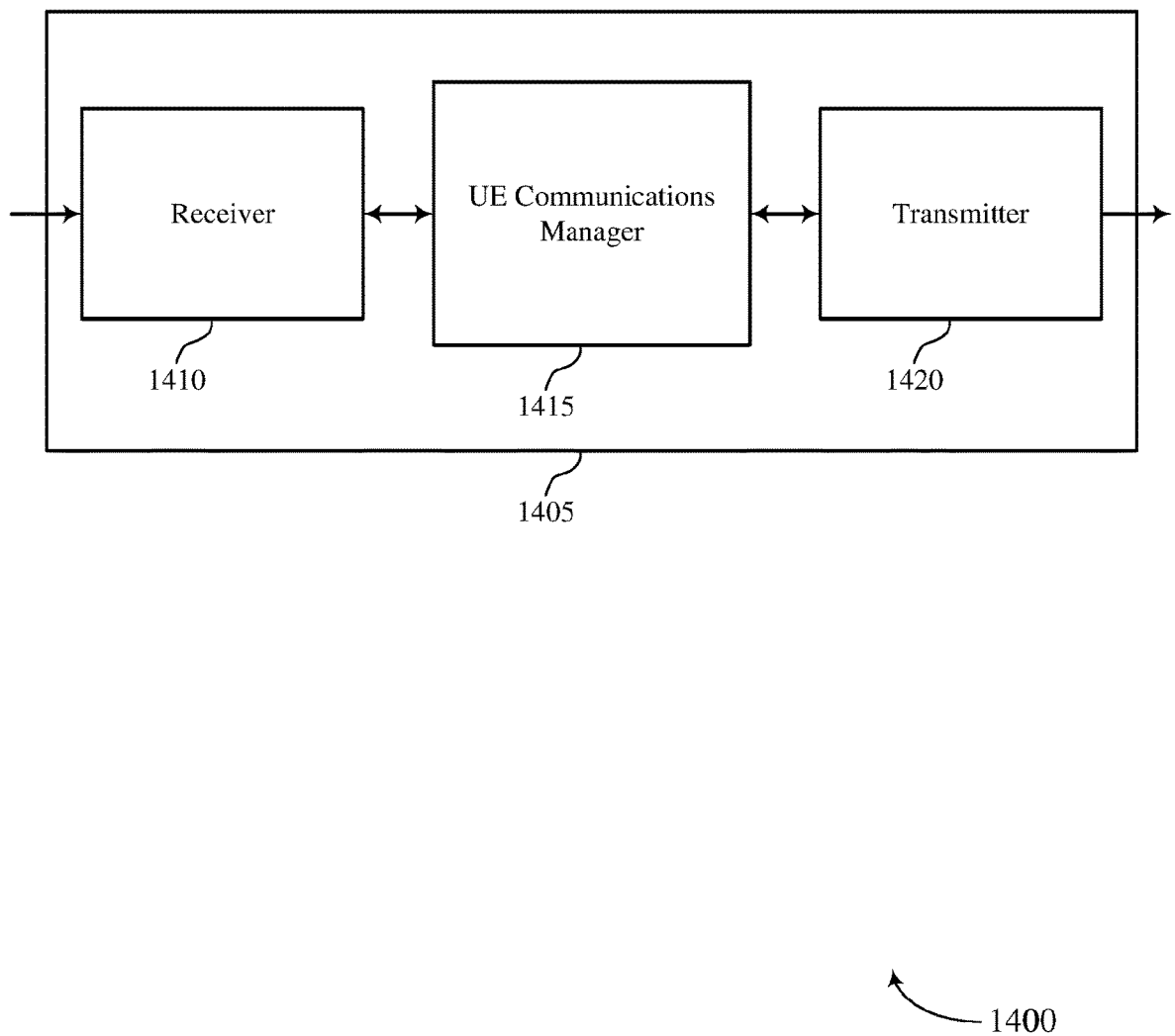
FIGS. 14 through 16 show block diagrams of a device that supports rate-matching techniques for polar codes in accordance with aspects of the present disclosure.

FIG. 14 shows a block diagram 1400 of a wireless device 1405 that supports rate-matching techniques for polar codes in accordance with aspects of the present disclosure. Wireless device 1405 may be an example of aspects of a UE 115 as described herein. Wireless device 1405 may include receiver 1410, UE communications manager 1415, and transmitter 1420. Wireless device 1405 may also include a processor. Each of these components may be in communication with one another (e.g., via one or more buses).

Receiver 1410 may receive information such as packets, user data, or control information associated with various information channels (e.g., control channels, data channels, and information related to rate-matching techniques for polar codes, etc.). Information may be passed on to other components of the device. The receiver 1410 may be an example of aspects of the transceiver 1735 described with reference to FIG. 17. The receiver 1410 may utilize a single antenna or a set of antennas.

Receiver 1410 may receive a first number of bits of a codeword over a wireless channel, where the codeword is encoded using a polar code and is generated from an information bit vector including a number of information bits, receive a first number of bits of a codeword in a transmission over a wireless channel, where the codeword is encoded using a polar code and is generated from an information bit vector including a number of information bits, and receive a first number of bits of a codeword over a wireless channel, where the codeword is encoded using a polar code and is generated from an information bit vector having a first number of information bits.

UE communications manager 1415 may be an example of aspects of the UE communications manager 1715 described with reference to FIG. 17.

UE communications manager 1415 and/or at least some of its various sub-components may be implemented in hardware, software executed by a processor, firmware, or any combination thereof. If implemented in software executed by a processor, the functions of the UE communications manager 1415 and/or at least some of its various sub-components may be executed by a general-purpose processor, a DSP, an ASIC, an FPGA or other programmable logic device, discrete gate or transistor logic, discrete hardware components, or any combination thereof designed to perform the functions described in the present disclosure. The UE communications manager 1415 and/or at least some of its various sub-components may be physically located at various positions, including being distributed such that portions of functions are implemented at different physical locations by one or more physical devices. In some examples, UE communications manager 1415 and/or at least some of its various sub-components may be a separate and distinct component in accordance with various aspects of the present disclosure. In other examples, UE communications manager 1415 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

UE communications manager 1415 may identify a set of bit locations of the polar code for the number of information bits, where the set of bit locations is determined based on partitioning of a set of bit-channels of the polar code for a first order polarization stage and assigning portions of the number of information bits to a first bit-channel partition and a second bit-channel partition of the first order polarization stage, where a capacity of the set of bit-channels of the first order polarization stage is based on a transmission capacity factor determined according to a mapping between one or more of a mother polar code length for the codeword, the first number of bits, or a set of predetermined transmission capacity factors and decode the codeword according to the polar code to obtain the information bit vector at the set of bit locations.

The UE communications manager 1415 may also select a first rate matching scheme of a set of rate matching schemes for decoding the codeword based on one or more parameters associated with the transmission, identify a set of bit locations of the polar code for the number of information bits based on the first number of bits and the number of information bits, and decode the codeword according to the polar code and the first rate matching scheme to obtain the information bit vector at the set of bit locations.

The UE communications manager 1415 may also identify a set of bit locations of the polar code for the set of information bits, where the set of bit locations is determined based on partitioning of a set of bit-channels of the polar code for a first order polarization stage and assigning portions of a number of the set of information bits to a first bit-channel partition and a second bit-channel partition of the first order polarization stage, where a capacity for the first bit-channel partition or a capacity of the second bit-channel partition is based on one of a set of functions of a number of the set of bit-channels for the first order polarization stage, where the one of the set of functions is determined based on the first number of bits and decode the codeword according to the polar code to obtain the information bit vector at the set of bit locations.

Transmitter 1420 may transmit signals generated by other components of the device. In some examples, the transmitter 1420 may be collocated with a receiver 1410 in a transceiver module. For example, the transmitter 1420 may be an example of aspects of the transceiver 1735 described with reference to FIG. 17. The transmitter 1420 may utilize a single antenna or a set of antennas.

Figure 15:
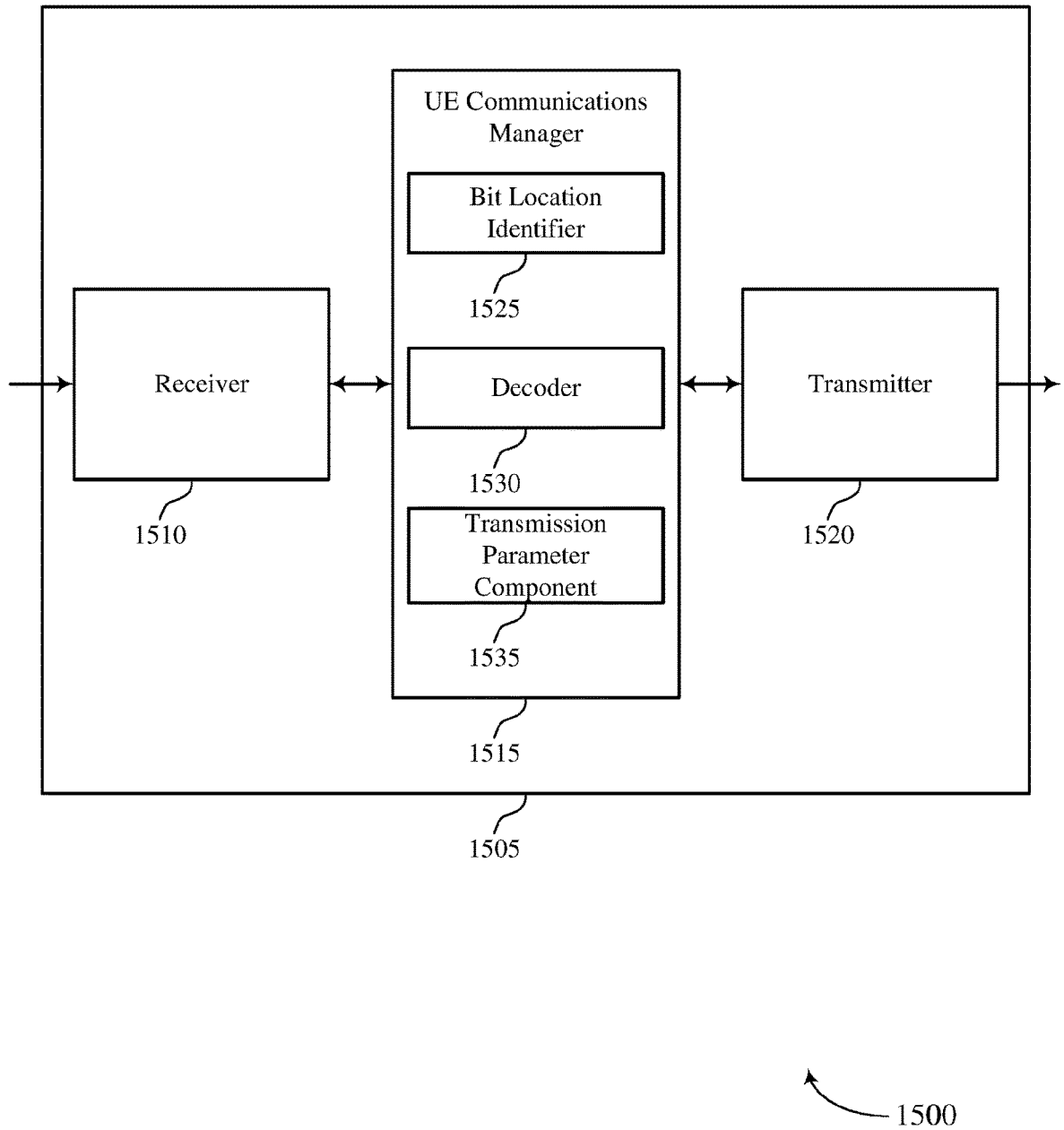

FIG. 15 shows a block diagram 1500 of a wireless device 1505 that supports rate-matching techniques for polar codes in accordance with aspects of the present disclosure. Wireless device 1505 may be an example of aspects of a wireless device 1405 or a UE 115 as described with reference to FIG. 14. Wireless device 1505 may include receiver 1510, UE communications manager 1515, and transmitter 1520. Wireless device 1505 may also include a processor. Each of these components may be in communication with one another (e.g., via one or more buses).

Receiver 1510 may receive information such as packets, user data, or control information associated with various information channels (e.g., control channels, data channels, and information related to rate-matching techniques for polar codes, etc.). Information may be passed on to other components of the device. The receiver 1510 may be an example of aspects of the transceiver 1735 described with reference to FIG. 17. The receiver 1510 may utilize a single antenna or a set of antennas.

UE communications manager 1515 may be an example of aspects of the UE communications manager 1715 described with reference to FIG. 17.

UE communications manager 1515 may also include bit location identifier 1525, decoder 1530, and transmission parameter component 1535.

Bit location identifier 1525 may identify a set of bit locations of the polar code for the number of information bits, where the set of bit locations is determined based on partitioning of a set of bit-channels of the polar code for a first order polarization stage and assigning portions of the number of information bits to a first bit-channel partition and a second bit-channel partition of the first order polarization stage, where a capacity of the set of bit-channels of the first order polarization stage is based on a transmission capacity factor determined according to a mapping between one or more of a mother polar code length for the codeword, the first number of bits, or a set of predetermined transmission capacity factors. In some cases, bit location identifier 1525 may identify a set of bit locations of the polar code for the number of information bits based on the first number of bits and the number of information bits. In some cases, bit location identifier 1525 may identify a set of bit locations of the polar code for the set of information bits, where the set of bit locations is determined based on partitioning of a set of bit-channels of the polar code for a first order polarization stage and assigning portions of a number of the set of information bits to a first bit-channel partition and a second bit-channel partition of the first order polarization stage, where a capacity for the first bit-channel partition or a capacity of the second bit-channel partition is based on one of a set of functions of a number of the set of bit-channels for the first order polarization stage, where the one of the set of functions is determined based on the first number of bits. In some cases, the set of functions correspond to a set of different rate matching schemes. In some cases, the one of the set of functions is further determined based on a mother polar code length for the codeword. In some cases, the one of the set of functions is further determined based on a value of the first number of bits relative to a mother polar code length for the codeword.

Decoder 1530 may decode the codeword according to the polar code to obtain the information bit vector at the set of bit locations and decode the codeword according to the polar code and the first rate matching scheme to obtain the information bit vector at the set of bit locations.

Transmission parameter component 1535 may select a first rate matching scheme of a set of rate matching schemes for decoding the codeword based on one or more parameters associated with the transmission. In some cases, the one or more parameters associated with the transmission include one or more of the number of information bits in the information bit vector, the first number of bits, a mother code length for polar codes of the transmission, a ratio of the number of information bits and the first number of bits or a coding rate, a ratio of the first number of bits and the mother code length, or any combination thereof.

Transmitter 1520 may transmit signals generated by other components of the device. In some examples, the transmitter 1520 may be collocated with a receiver 1510 in a transceiver module. For example, the transmitter 1520 may be an example of aspects of the transceiver 1735 described with reference to FIG. 17. The transmitter 1520 may utilize a single antenna or a set of antennas.

Figure 16:
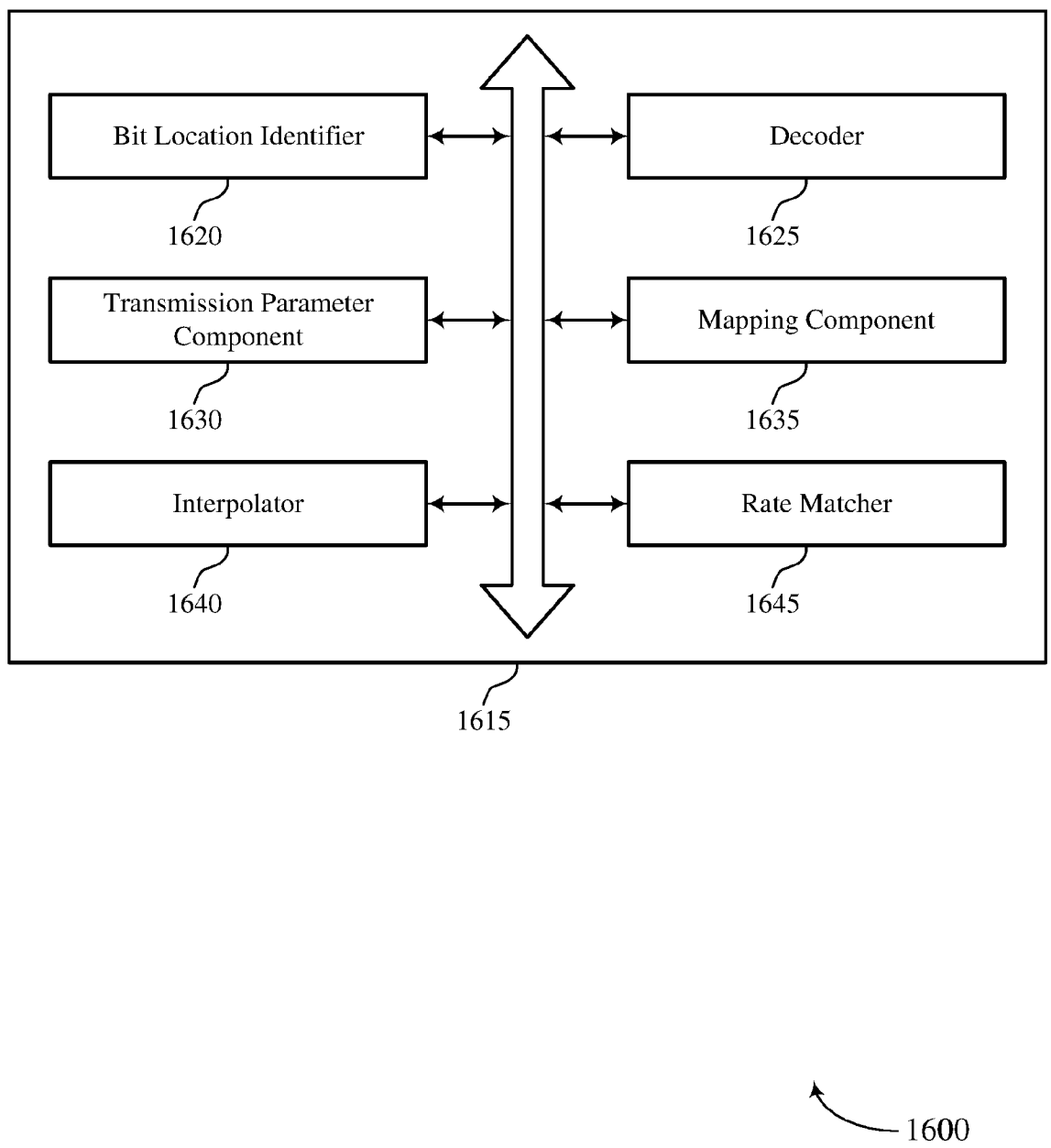

FIG. 16 shows a block diagram 1600 of a UE communications manager 1615 that supports rate-matching techniques for polar codes in accordance with aspects of the present disclosure. The UE communications manager 1615 may be an example of aspects of a UE communications manager 1715 described with reference to FIGS. 14, 15, and 17. The UE communications manager 1615 may include bit location identifier 1620, decoder 1625, transmission parameter component 1630, mapping component 1635, interpolator 1640, and rate matcher 1645. Each of these modules may communicate, directly or indirectly, with one another (e.g., via one or more buses).

Bit location identifier 1620 may identify a set of bit locations of the polar code for the number of information bits, where the set of bit locations is determined based on partitioning of a set of bit-channels of the polar code for a first order polarization stage and assigning portions of the number of information bits to a first bit-channel partition and a second bit-channel partition of the first order polarization stage, where a capacity of the set of bit-channels of the first order polarization stage is based on a transmission capacity factor determined according to a mapping between one or more of a mother polar code length for the codeword, the first number of bits, or a set of predetermined transmission capacity factors. In some cases, bit location identifier 1620 may identify a set of bit locations of the polar code for the number of information bits based on the first number of bits and the number of information bits. In some cases, bit location identifier 1620 may identify a set of bit locations of the polar code for the set of information bits, where the set of bit locations is determined based on partitioning of a set of bit-channels of the polar code for a first order polarization stage and assigning portions of a number of the set of information bits to a first bit-channel partition and a second bit-channel partition of the first order polarization stage, where a capacity for the first bit-channel partition or a capacity of the second bit-channel partition is based on one of a set of functions of a number of the set of bit-channels for the first order polarization stage, where the one of the set of functions is determined based on the first number of bits. In some cases, the set of functions correspond to a set of different rate matching schemes. In some cases, the one of the set of functions is further determined based on a mother polar code length for the codeword. In some cases, the one of the set of functions is further determined based on a value of the first number of bits relative to a mother polar code length for the codeword.

Decoder 1625 may decode the codeword according to the polar code to obtain the information bit vector at the set of bit locations and decode the codeword according to the polar code and the first rate matching scheme to obtain the information bit vector at the set of bit locations.

Transmission parameter component 1630 may select a first rate matching scheme of a set of rate matching schemes for decoding the codeword based on one or more parameters associated with the transmission. In some cases, the one or more parameters associated with the transmission include one or more of the number of information bits in the information bit vector, the first number of bits, a mother code length for polar codes of the transmission, a ratio of the number of information bits and the first number of bits or a coding rate, a ratio of the first number of bits and the mother code length, or any combination thereof.

Mapping component 1635 may provide a mapping or lookup table for one or more parameters. In some cases, the transmission capacity factor is based on a ratio of the first number of bits to the mother polar code length for the codeword. In some cases, the mapping provides a set of transmission capacity factor values, each transmission capacity factor value corresponding to an associated rate matching ratio value that is determined based on the first number of bits and the mother polar code length for the codeword. In some cases, the mapping is provided in a lookup table containing the set of rate matching ratio values and the set of transmission capacity factor values. In some cases, the identifying the set of bit locations further includes determining a calculated rate matching ratio between the first number of bits and the mother polar code length, identifying a first rate matching ratio value and a second rate matching ratio value from the lookup table, where the calculated rate matching ratio is between the first rate matching ratio value and the second rate matching ratio value, and selecting the transmission capacity factor as the first rate matching ratio value or the second rate matching ratio value based on which of the first rate matching ratio value or the second rate matching ratio value is closest to the calculated rate matching ratio.

Interpolator 1640 may determine a calculated rate matching ratio between the first number of bits and the mother polar code length by identifying a first rate matching ratio value and a second rate matching ratio value from the lookup table, the calculated rate matching ratio being between the first rate matching ratio value and the second rate matching ratio value, and determining the transmission capacity factor as an interpolation between a first transmission capacity factor value associated with the first rate matching ratio value and a second transmission capacity factor value associated with the second rate matching ratio value. In some cases, the interpolation is a first order linear interpolation.

Rate matcher 1645 may perform rate matching, select rate matching schemes, or switch between rate matching schemes of the set of rate matching schemes based on one or more updates to the one or more parameters associated with the transmission. In some cases, the set of rate matching schemes include one or more of a first rate matching scheme that adjusts the number of information bits in the information bit vector, a second rate matching scheme that adjusts a block size of input data, a third rate matching scheme that interlaces portions of two or more input data blocks, or a fourth rate matching scheme that has one or more non-interlaced input data blocks and that interlaces two or more other input data blocks. In some cases, the selecting the first rate matching scheme is based on one or more of a value of a first parameter of the one or more parameters relative to a first threshold value for the first parameter, a value of a ratio of the first number of bits and a mother code length relative to a second threshold value, a value of a coding rate of the codeword, or whether a value of each of the one or more parameters belongs to a set of values associated with each rate matching scheme of the set of rate matching schemes.

Figure 17:
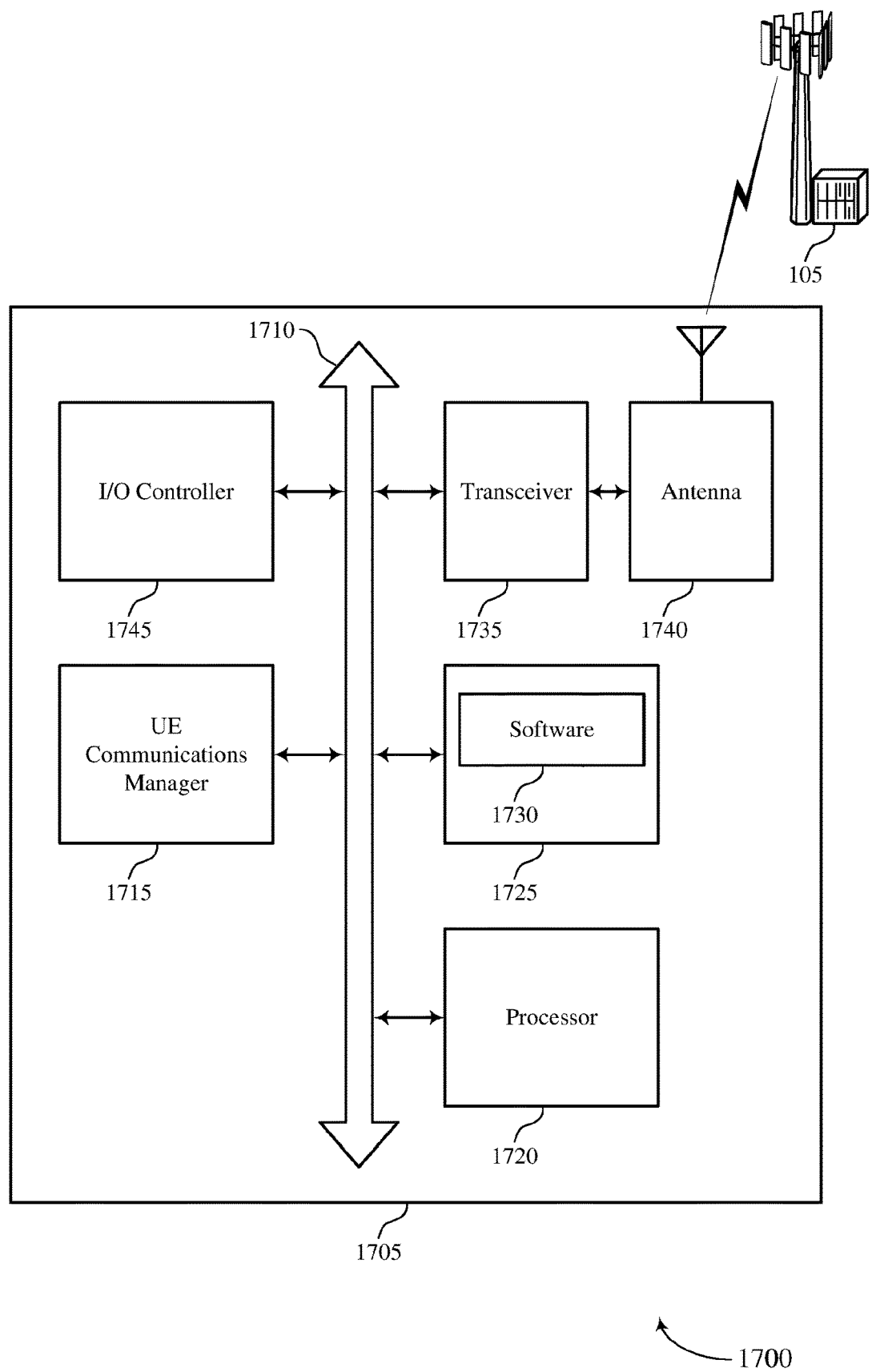
FIG. 17 illustrates a block diagram of a system including a UE that supports rate-matching techniques for polar codes in accordance with aspects of the present disclosure.

FIG. 17 shows a diagram of a system 1700 including a device 1705 that supports rate-matching techniques for polar codes in accordance with aspects of the present disclosure. Device 1705 may be an example of or include the components of UE 115 as described above, e.g., with reference to FIG. 1. Device 1705 may include components for bi-directional voice and data communications including components for transmitting and receiving communications, including UE communications manager 1715, processor 1720, memory 1725, software 1730, transceiver 1735, antenna 1740, and I/O controller 1745. These components may be in electronic communication via one or more buses (e.g., bus 1710). Device 1705 may communicate wirelessly with one or more base stations 105.

Processor 1720 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1720 may be configured to operate a memory array using a memory controller. In other cases, a memory controller may be integrated into processor 1720. Processor 1720 may be configured to execute computer-readable instructions stored in a memory to perform various functions (e.g., functions or tasks supporting rate-matching techniques for polar codes).

Memory 1725 may include RAM and ROM. The memory 1725 may store computer-readable, computer-executable software 1730 including instructions that, when executed, cause the processor to perform various functions described herein. In some cases, the memory 1725 may contain, among other things, a BIOS which may control basic hardware or software operation such as the interaction with peripheral components or devices.

Software 1730 may include code to implement aspects of the present disclosure, including code to support rate-matching techniques for polar codes. Software 1730 may be stored in a non-transitory computer-readable medium such as system memory or other memory. In some cases, the software 1730 may not be directly executable by the processor but may cause a computer (e.g., when compiled and executed) to perform functions described herein.

Transceiver 1735 may communicate bi-directionally, via one or more antennas, wired, or wireless links as described above. For example, the transceiver 1735 may represent a wireless transceiver and may communicate bi-directionally with another wireless transceiver. The transceiver 1735 may also include a modem to modulate the packets and provide the modulated packets to the antennas for transmission, and to demodulate packets received from the antennas.

In some cases, the wireless device may include a single antenna 1740. However, in some cases the device may have more than one antenna 1740, which may be capable of concurrently transmitting or receiving multiple wireless transmissions.

I/O controller 1745 may manage input and output signals for device 1705. I/O controller 1745 may also manage peripherals not integrated into device 1705. In some cases, I/O controller 1745 may represent a physical connection or port to an external peripheral. In some cases, I/O controller 1745 may utilize an operating system such as iOS®, ANDROID®, MS-DOS®, MS-WINDOWS®, OS/2®, UNIX®, LINUX®, or another known operating system. In other cases, I/O controller 1745 may represent or interact with a modem, a keyboard, a mouse, a touchscreen, or a similar device. In some cases, I/O controller 1745 may be implemented as part of a processor. In some cases, a user may interact with device 1705 via I/O controller 1745 or via hardware components controlled by I/O controller 1745.

Figure 18:
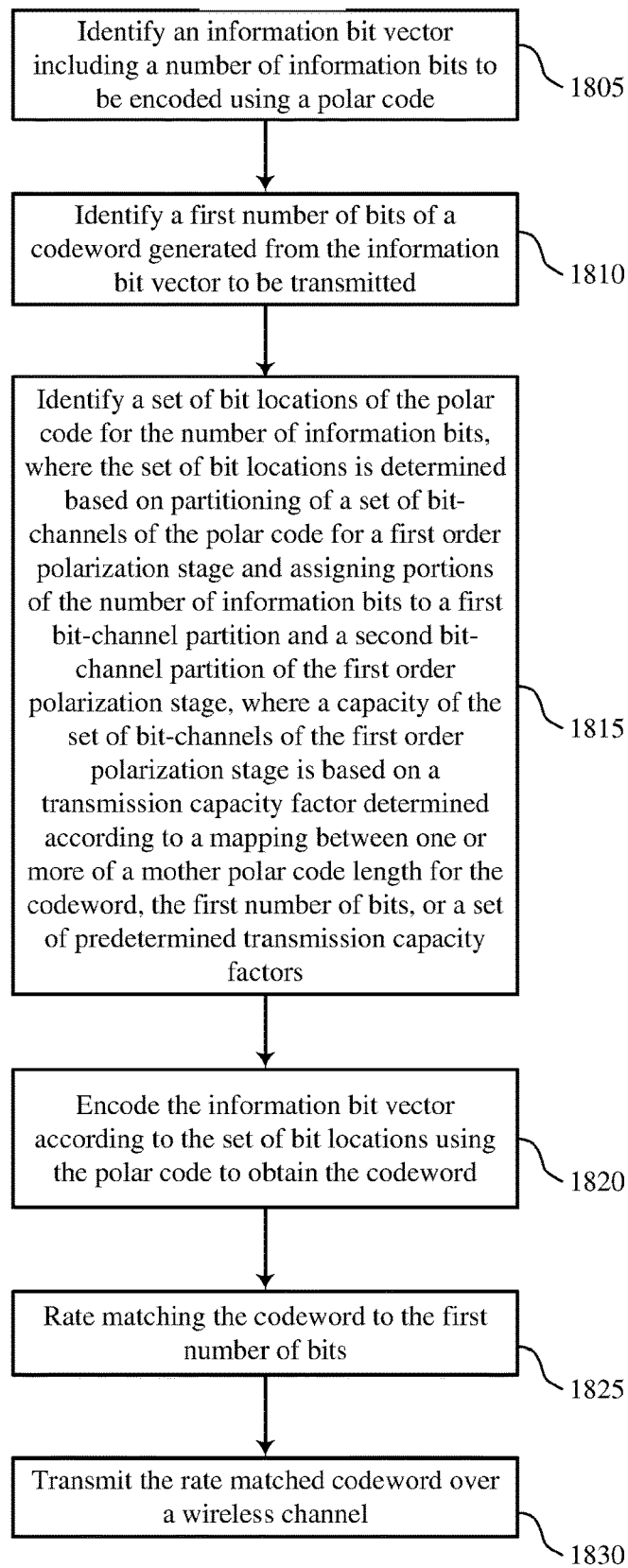
FIGS. 18 through 25 illustrate methods for rate-matching techniques for polar codes in accordance with aspects of the present disclosure.

FIG. 18 shows a flowchart illustrating a method 1800 for rate-matching techniques for polar codes in accordance with aspects of the present disclosure. The operations of method 1800 may be implemented by a base station 105 or its components as described herein. For example, the operations of method 1800 may be performed by a base station communications manager as described with reference to FIGS. 10 through 13. In some examples, a base station 105 may execute a set of codes to control the functional elements of the device to perform the functions described below. Additionally or alternatively, the base station 105 may perform aspects of the functions described below using special-purpose hardware.

At block 1805 the base station 105 may identify an information bit vector comprising a number of information bits to be encoded using a polar code. The operations of block 1805 may be performed according to the methods described herein. In certain examples, aspects of the operations of block 1805 may be performed by a bit vector generator as described with reference to FIGS. 10 through 13.

At block 1810 the base station 105 may identify a first number of bits of a codeword generated from the information bit vector to be transmitted. The operations of block 1810 may be performed according to the methods described herein. In certain examples, aspects of the operations of block 1810 may be performed by a coded bit identifier as described with reference to FIGS. 10 through 13.

At block 1815 the base station 105 may identify a set of bit locations of the polar code for the number of information bits, wherein the set of bit locations is determined based at least in part on partitioning of a plurality of bit-channels of the polar code for a first order polarization stage and assigning portions of the number of information bits to a first bit-channel partition and a second bit-channel partition of the first order polarization stage, wherein a capacity of the plurality of bit-channels of the first order polarization stage is based at least in part on a transmission capacity factor determined according to a mapping between one or more of a mother polar code length for the codeword, the first number of bits, or a plurality of predetermined transmission capacity factors. The operations of block 1815 may be performed according to the methods described herein. In certain examples, aspects of the operations of block 1815 may be performed by a bit location identifier as described with reference to FIGS. 10 through 13.

At block 1820 the base station 105 may encode the information bit vector according to the set of bit locations using the polar code to obtain the codeword. The operations of block 1820 may be performed according to the methods described herein. In certain examples, aspects of the operations of block 1820 may be performed by a encoder as described with reference to FIGS. 10 through 13.

At block 1825 the base station 105 may rate match the codeword to the first number of bits. The operations of block 1825 may be performed according to the methods described herein. In certain examples, aspects of the operations of block 1825 may be performed by a rate matcher as described with reference to FIGS. 10 through 13.

At block 1830 the base station 105 may transmit the rate matched codeword over a wireless channel. The operations of block 1830 may be performed according to the methods described herein. In certain examples, aspects of the operations of block 1830 may be performed by a transmitter as described with reference to FIGS. 10 through 13.

Figure 19:
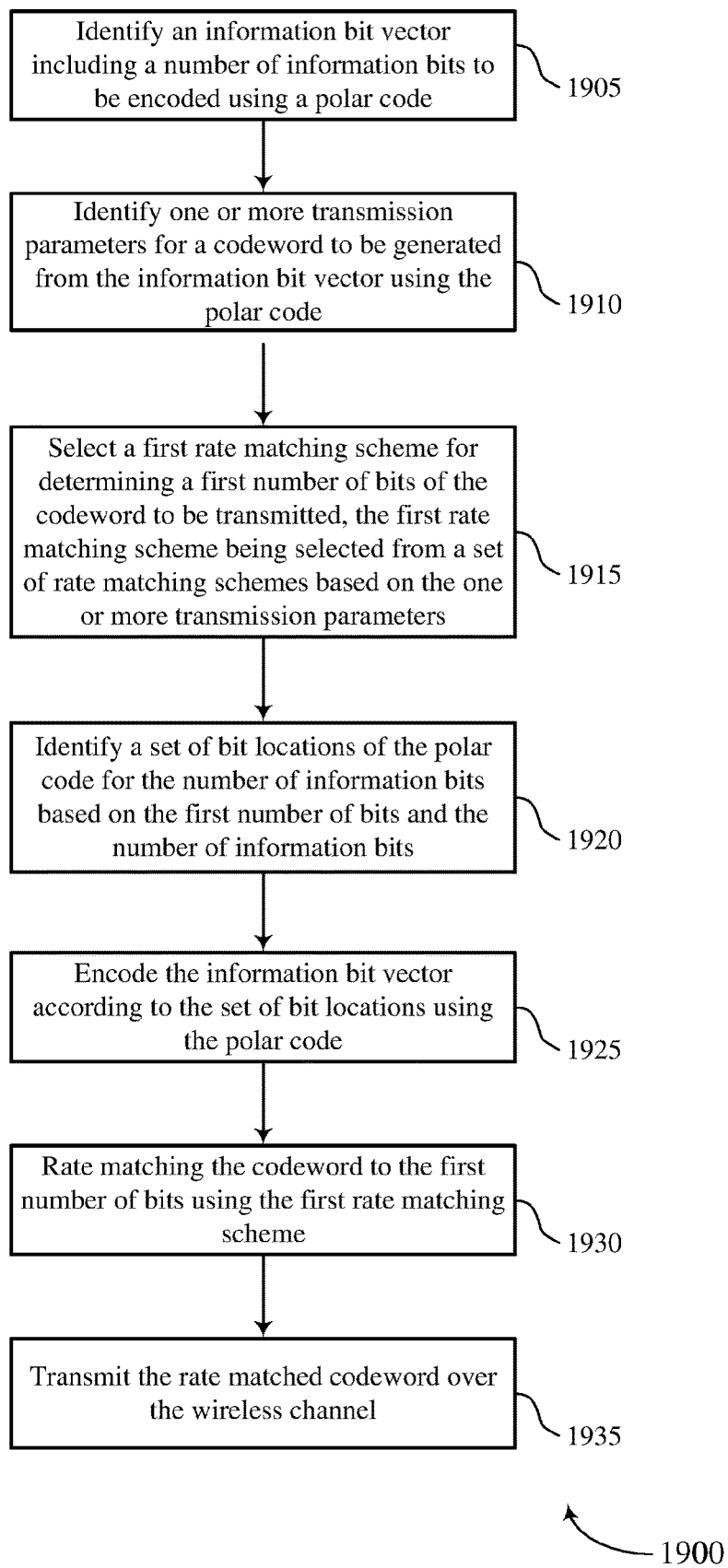

FIG. 19 shows a flowchart illustrating a method 1900 for rate-matching techniques for polar codes in accordance with aspects of the present disclosure. The operations of method 1900 may be implemented by a base station 105 or its components as described herein. For example, the operations of method 1900 may be performed by a base station communications manager as described with reference to FIGS. 10 through 13. In some examples, a base station 105 may execute a set of codes to control the functional elements of the device to perform the functions described below.

Additionally or alternatively, the base station 105 may perform aspects of the functions described below using special-purpose hardware.

At block 1905 the base station 105 may identify an information bit vector comprising a number of information bits to be encoded using a polar code. The operations of block 1905 may be performed according to the methods described herein. In certain examples, aspects of the operations of block 1905 may be performed by a bit vector generator as described with reference to FIGS. 10 through 13.

At block 1910 the base station 105 may identify one or more transmission parameters for a codeword to be generated from the information bit vector using the polar code. The operations of block 1910 may be performed according to the methods described herein. In certain examples, aspects of the operations of block 1910 may be performed by a transmission parameter component as described with reference to FIGS. 10 through 13.

At block 1915 the base station 105 may select a first rate matching scheme for determining a first number of bits of the codeword to be transmitted, the first rate matching scheme being selected from a plurality of rate matching schemes based at least in part on the one or more transmission parameters. The operations of block 1915 may be performed according to the methods described herein. In certain examples, aspects of the operations of block 1915 may be performed by a rate matcher as described with reference to FIGS. 10 through 13.

At block 1920 the base station 105 may identify a set of bit locations of the polar code for the number of information bits based at least in part on the first number of bits and the number of information bits. The operations of block 1920 may be performed according to the methods described herein. In certain examples, aspects of the operations of block 1920 may be performed by a bit location identifier as described with reference to FIGS. 10 through 13.

At block 1925 the base station 105 may encode the information bit vector according to the set of bit locations using the polar code. The operations of block 1925 may be performed according to the methods described herein. In certain examples, aspects of the operations of block 1925 may be performed by a encoder as described with reference to FIGS. 10 through 13.

At block 1930 the base station 105 may rate match the codeword to the first number of bits using the first rate matching scheme. The operations of block 1930 may be performed according to the methods described herein. In certain examples, aspects of the operations of block 1930 may be performed by a rate matcher as described with reference to FIGS. 10 through 13.

At block 1935 the base station 105 may transmit the rate matched codeword over the wireless channel. The operations of block 1935 may be performed according to the methods described herein. In certain examples, aspects of the operations of block 1935 may be performed by a transmitter as described with reference to FIGS. 10 through 13.

Figure 20:
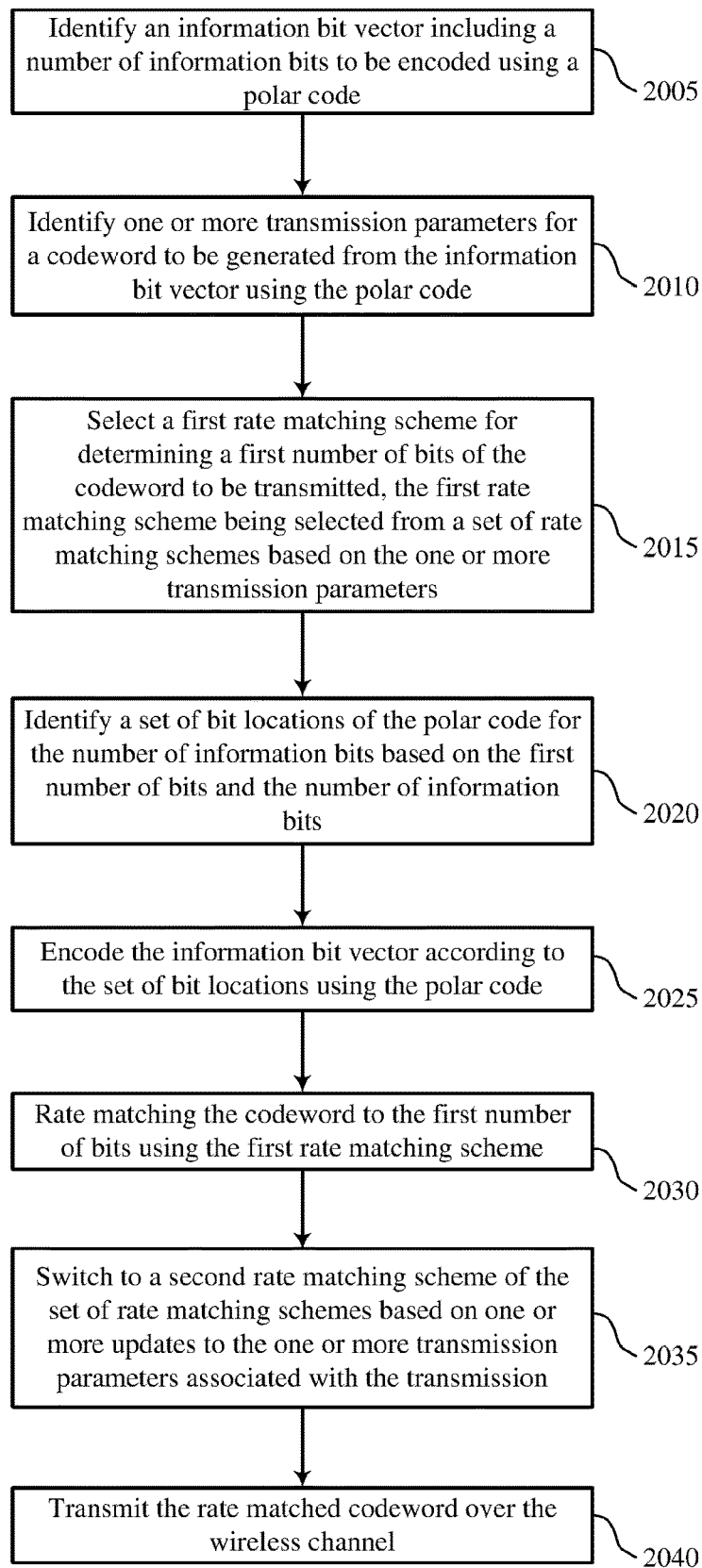

FIG. 20 shows a flowchart illustrating a method 2000 for rate-matching techniques for polar codes in accordance with aspects of the present disclosure. The operations of method 2000 may be implemented by a base station 105 or its components as described herein. For example, the operations of method 2000 may be performed by a base station communications manager as described with reference to FIGS. 10 through 13. In some examples, a base station 105 may execute a set of codes to control the functional elements of the device to perform the functions described below. Additionally or alternatively, the base station 105 may perform aspects of the functions described below using special-purpose hardware.

At block 2005 the base station 105 may identify an information bit vector comprising a number of information bits to be encoded using a polar code. The operations of block 2005 may be performed according to the methods described herein. In certain examples, aspects of the operations of block 2005 may be performed by a bit vector generator as described with reference to FIGS. 10 through 13.

At block 2010 the base station 105 may identify one or more transmission parameters for a codeword to be generated from the information bit vector using the polar code. The operations of block 2010 may be performed according to the methods described herein. In certain examples, aspects of the operations of block 2010 may be performed by a transmission parameter component as described with reference to FIGS. 10 through 13.

At block 2015 the base station 105 may select a first rate matching scheme for determining a first number of bits of the codeword to be transmitted, the first rate matching scheme being selected from a plurality of rate matching schemes based at least in part on the one or more transmission parameters. The operations of block 2015 may be performed according to the methods described herein. In certain examples, aspects of the operations of block 2015 may be performed by a rate matcher as described with reference to FIGS. 10 through 13.

At block 2020 the base station 105 may identify a set of bit locations of the polar code for the number of information bits based at least in part on the first number of bits and the number of information bits. The operations of block 2020 may be performed according to the methods described herein. In certain examples, aspects of the operations of block 2020 may be performed by a bit location identifier as described with reference to FIGS. 10 through 13.

At block 2025 the base station 105 may encode the information bit vector according to the set of bit locations using the polar code. The operations of block 2025 may be performed according to the methods described herein. In certain examples, aspects of the operations of block 2025 may be performed by a encoder as described with reference to FIGS. 10 through 13.

At block 2030 the base station 105 may rate match the codeword to the first number of bits using the first rate matching scheme. The operations of block 2030 may be performed according to the methods described herein. In certain examples, aspects of the operations of block 2030 may be performed by a rate matcher as described with reference to FIGS. 10 through 13.

At block 2035 the base station 105 may switch to a second rate matching scheme of the plurality of rate matching schemes based at least in part on one or more updates to the one or more transmission parameters associated with the transmission. The operations of block 2035 may be performed according to the methods described herein. In certain examples, aspects of the operations of block 2035 may be performed by a rate matcher as described with reference to FIGS. 10 through 13.

At block 2040 the base station 105 may transmit the rate matched codeword over the wireless channel. The operations of block 2040 may be performed according to the methods described herein. In certain examples, aspects of the operations of block 2040 may be performed by a transmitter as described with reference to FIGS. 10 through 13.

Figure 21:
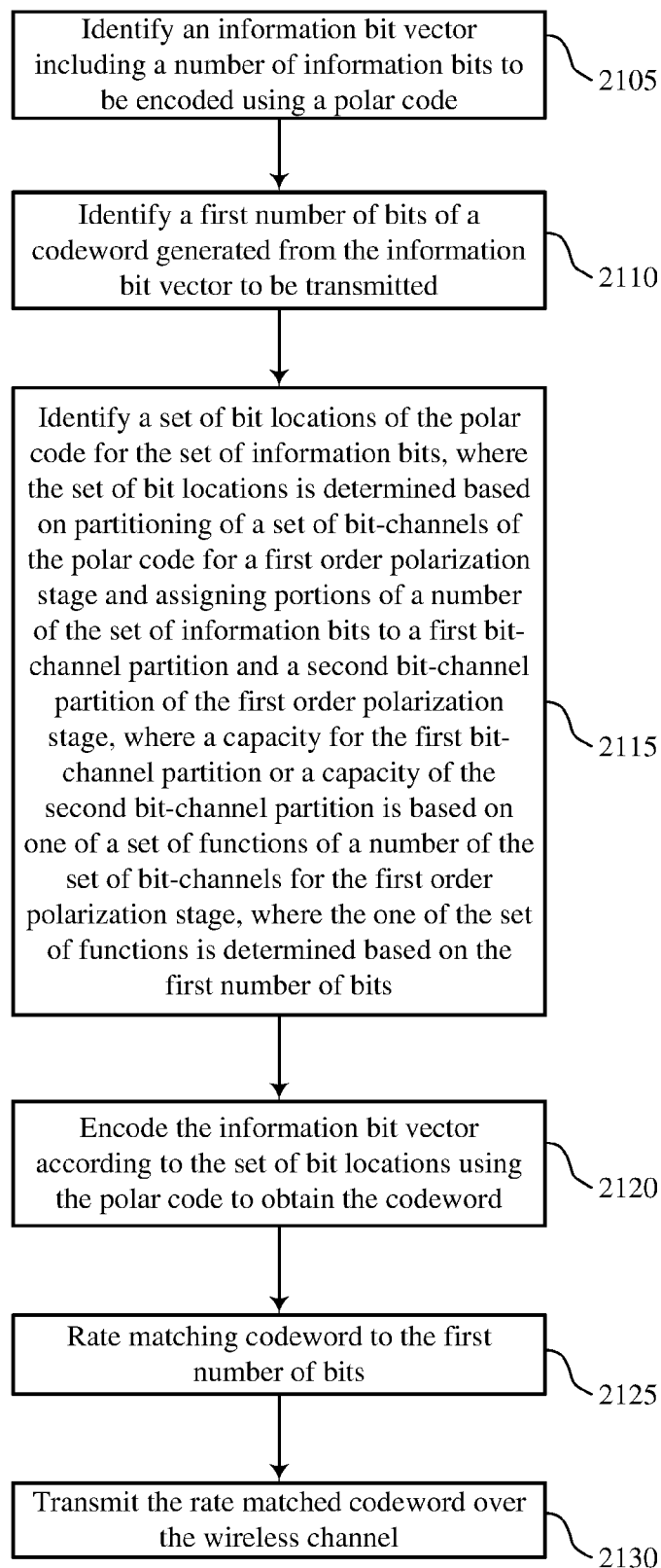

FIG. 21 shows a flowchart illustrating a method 2100 for rate-matching techniques for polar codes in accordance with aspects of the present disclosure. The operations of method 2100 may be implemented by a base station 105 or its components as described herein. For example, the operations of method 2100 may be performed by a base station communications manager as described with reference to FIGS. 10 through 13. In some examples, a base station 105 may execute a set of codes to control the functional elements of the device to perform the functions described below. Additionally or alternatively, the base station 105 may perform aspects of the functions described below using special-purpose hardware.

At block 2105 the base station 105 may identify an information bit vector comprising a number of information bits to be encoded using a polar code. The operations of block 2105 may be performed according to the methods described herein. In certain examples, aspects of the operations of block 2105 may be performed by a bit vector generator as described with reference to FIGS. 10 through 13.

At block 2110 the base station 105 may identify a first number of bits of a codeword generated from the information bit vector to be transmitted. The operations of block 2110 may be performed according to the methods described herein. In certain examples, aspects of the operations of block 2110 may be performed by a coded bit identifier as described with reference to FIGS. 10 through 13.

At block 2115 the base station 105 may identify a set of bit locations of the polar code for the plurality of information bits, wherein the set of bit locations is determined based at least in part on partitioning of a plurality of bit-channels of the polar code for a first order polarization stage and assigning portions of a number of the plurality of information bits to a first bit-channel partition and a second bit-channel partition of the first order polarization stage, wherein a capacity for the first bit-channel partition or a capacity of the second bit-channel partition is based at least in part on one of a plurality of functions of a number of the plurality of bit-channels for the first order polarization stage, wherein the one of the plurality of functions is determined based at least in part on the first number of bits. The operations of block 2115 may be performed according to the methods described herein. In certain examples, aspects of the operations of block 2115 may be performed by a bit location identifier as described with reference to FIGS. 10 through 13.

At block 2120 the base station 105 may encode the information bit vector according to the set of bit locations using the polar code to obtain the codeword. The operations of block 2120 may be performed according to the methods described herein. In certain examples, aspects of the operations of block 2120 may be performed by a encoder as described with reference to FIGS. 10 through 13.

At block 2125 the base station 105 may rate match codeword to the first number of bits. The operations of block 2125 may be performed according to the methods described herein. In certain examples, aspects of the operations of block 2125 may be performed by a rate matcher as described with reference to FIGS. 10 through 13.

At block 2130 the base station 105 may transmit the rate matched codeword over the wireless channel. The operations of block 2130 may be performed according to the methods described herein. In certain examples, aspects of the operations of block 2130 may be performed by a transmitter as described with reference to FIGS. 10 through 13.

Figure 22:
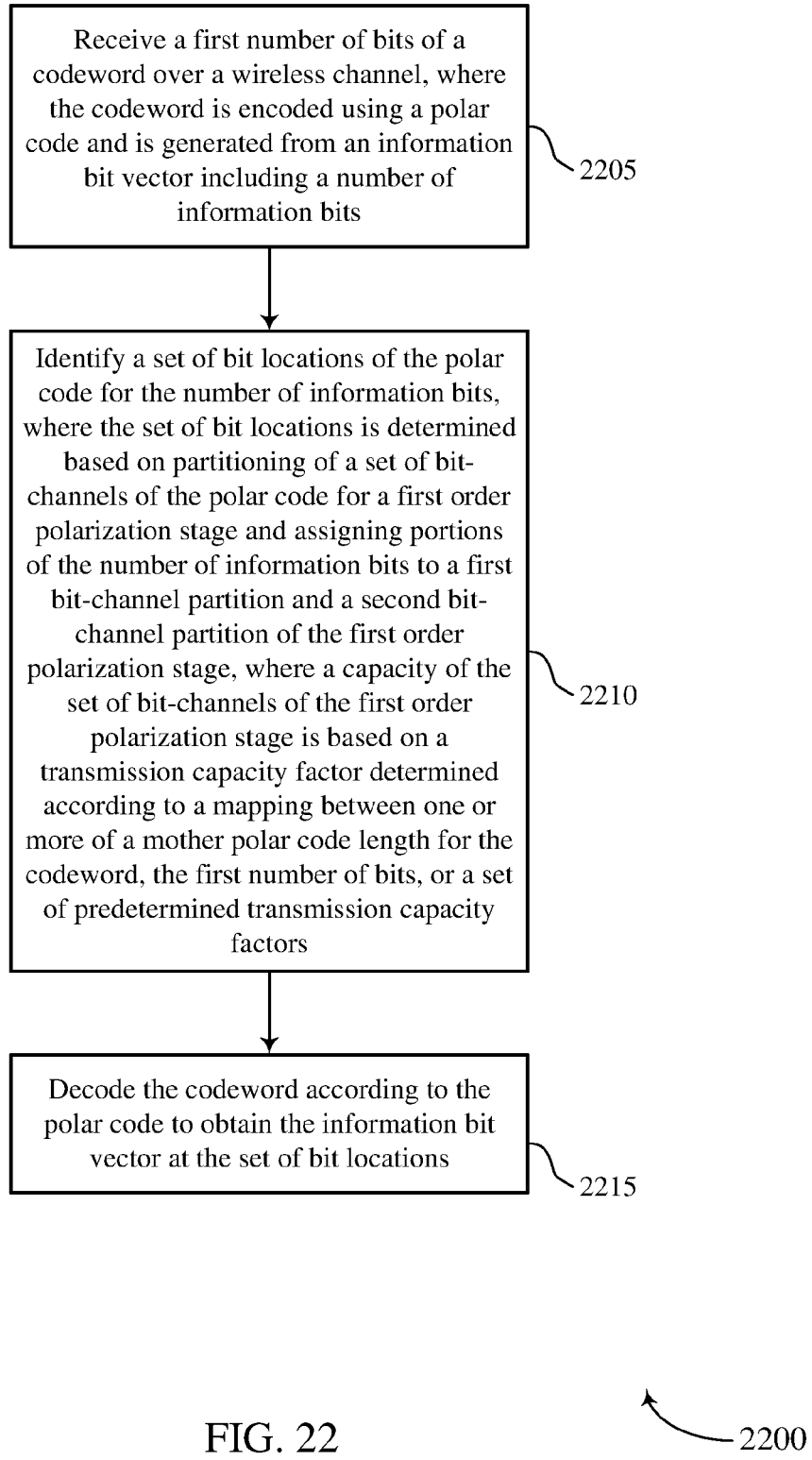

FIG. 22 shows a flowchart illustrating a method 2200 for rate-matching techniques for polar codes in accordance with aspects of the present disclosure. The operations of method 2200 may be implemented by a UE 115 or its components as described herein. For example, the operations of method 2200 may be performed by a UE communications manager as described with reference to FIGS. 14 through 17. In some examples, a UE 115 may execute a set of codes to control the functional elements of the device to perform the functions described below. Additionally or alternatively, the UE 115 may perform aspects of the functions described below using special-purpose hardware.

At block 2205 the UE 115 may receive a first number of bits of a codeword over a wireless channel, wherein the codeword is encoded using a polar code and is generated from an information bit vector comprising a number of information bits. The operations of block 2205 may be performed according to the methods described herein. In certain examples, aspects of the operations of block 2205 may be performed by a receiver as described with reference to FIGS. 14 through 17.

At block 2210 the UE 115 may identify a set of bit locations of the polar code for the number of information bits, wherein the set of bit locations is determined based at least in part on partitioning of a plurality of bit-channels of the polar code for a first order polarization stage and assigning portions of the number of information bits to a first bit-channel partition and a second bit-channel partition of the first order polarization stage, wherein a capacity of the plurality of bit-channels of the first order polarization stage is based at least in part on a transmission capacity factor determined according to a mapping between one or more of a mother polar code length for the codeword, the first number of bits, or a plurality of predetermined transmission capacity factors. The operations of block 2210 may be performed according to the methods described herein. In certain examples, aspects of the operations of block 2210 may be performed by a bit location identifier as described with reference to FIGS. 14 through 17.

At block 2215 the UE 115 may decode the codeword according to the polar code to obtain the information bit vector at the set of bit locations. The operations of block 2215 may be performed according to the methods described herein. In certain examples, aspects of the operations of block 2215 may be performed by a decoder as described with reference to FIGS. 14 through 17.

Figure 23:
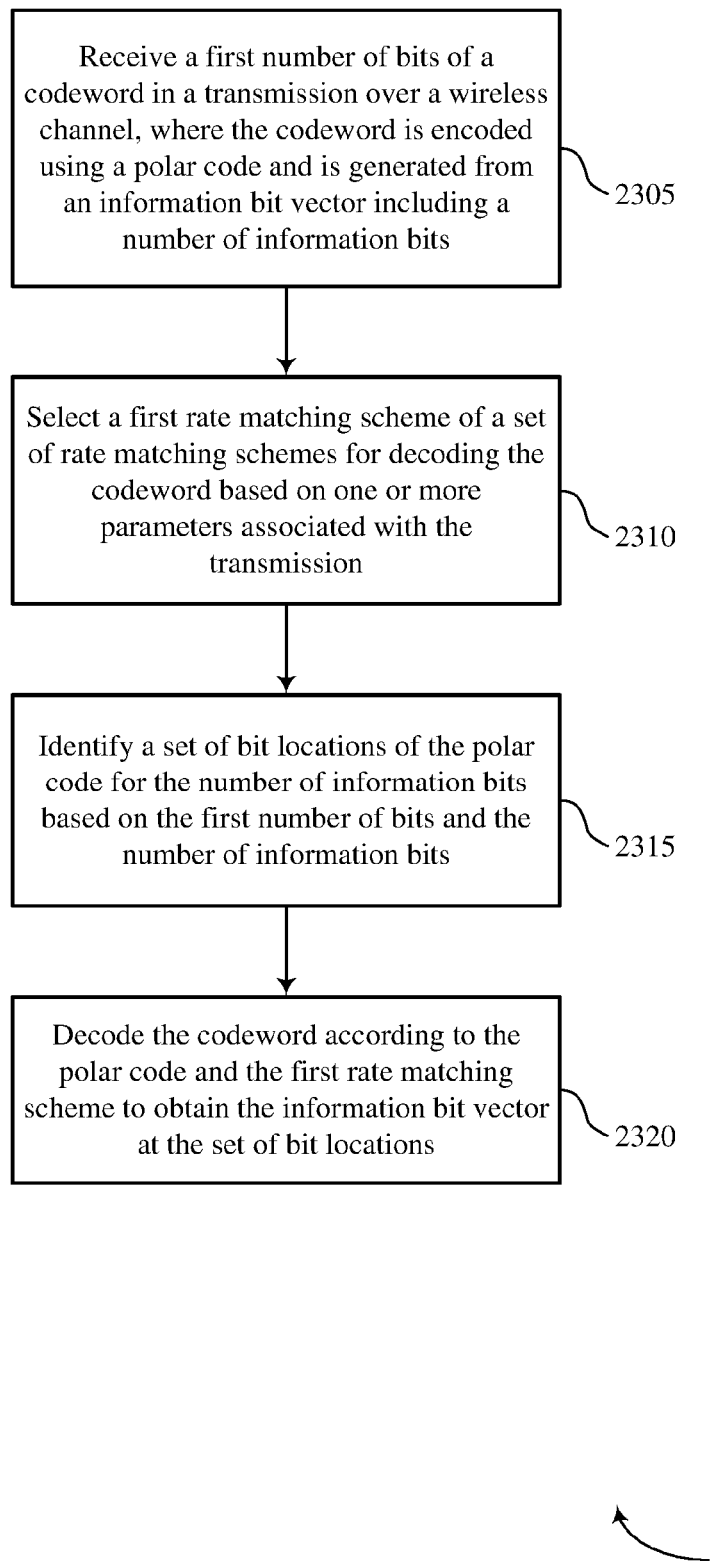

FIG. 23 shows a flowchart illustrating a method 2300 for rate-matching techniques for polar codes in accordance with aspects of the present disclosure. The operations of method 2300 may be implemented by a UE 115 or its components as described herein. For example, the operations of method 2300 may be performed by a UE communications manager as described with reference to FIGS. 14 through 17. In some examples, a UE 115 may execute a set of codes to control the functional elements of the device to perform the functions described below. Additionally or alternatively, the UE 115 may perform aspects of the functions described below using special-purpose hardware.

At block 2305 the UE 115 may receive a first number of bits of a codeword in a transmission over a wireless channel, wherein the codeword is encoded using a polar code and is generated from an information bit vector comprising a number of information bits. The operations of block 2305 may be performed according to the methods described herein. In certain examples, aspects of the operations of block 2305 may be performed by a receiver as described with reference to FIGS. 14 through 17.

At block 2310 the UE 115 may select a first rate matching scheme of a plurality of rate matching schemes for decoding the codeword based at least in part on one or more parameters associated with the transmission. The operations of block 2310 may be performed according to the methods described herein. In certain examples, aspects of the operations of block 2310 may be performed by a transmission parameter component as described with reference to FIGS. 14 through 17.

At block 2315 the UE 115 may identify a set of bit locations of the polar code for the number of information bits based at least in part on the first number of bits and the number of information bits. The operations of block 2315 may be performed according to the methods described herein. In certain examples, aspects of the operations of block 2315 may be performed by a bit location identifier as described with reference to FIGS. 14 through 17.

At block 2320 the UE 115 may decode the codeword according to the polar code and the first rate matching scheme to obtain the information bit vector at the set of bit locations. The operations of block 2320 may be performed according to the methods described herein. In certain examples, aspects of the operations of block 2320 may be performed by a decoder as described with reference to FIGS. 14 through 17.

Figure 24:
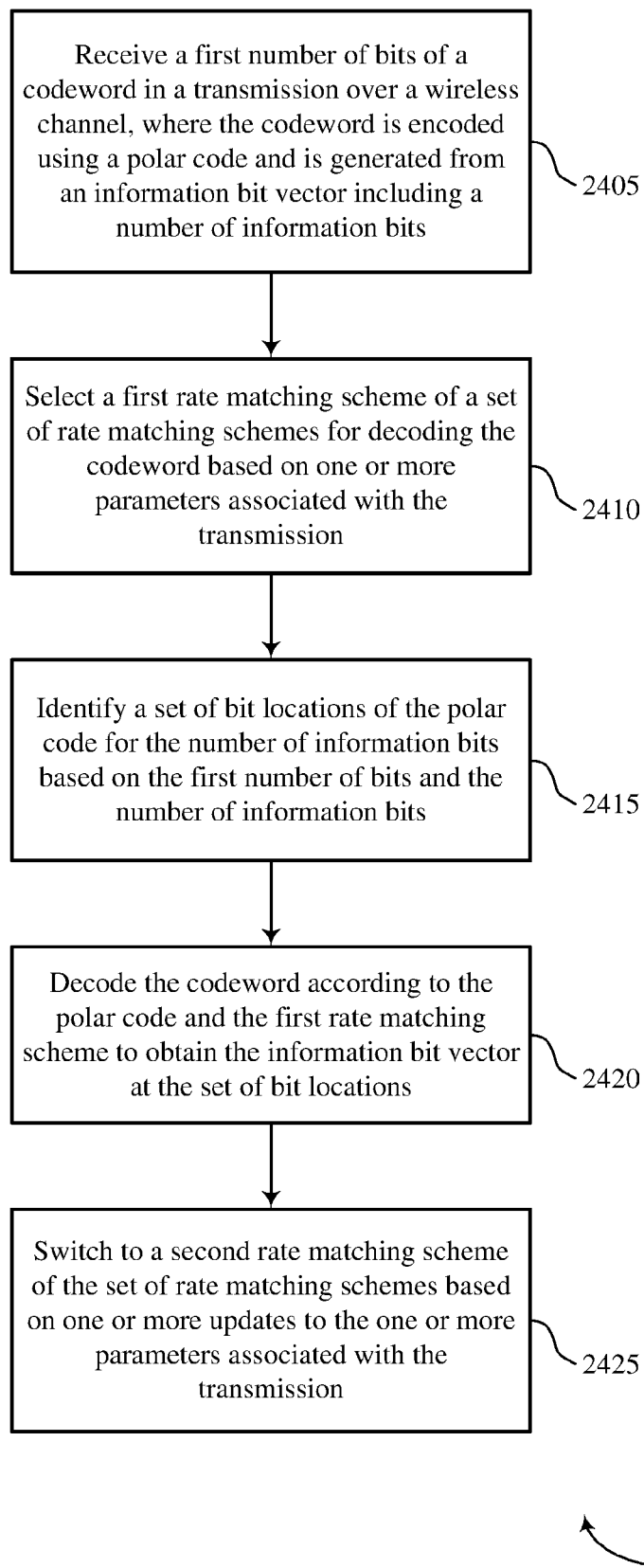

FIG. 24 shows a flowchart illustrating a method 2400 for rate-matching techniques for polar codes in accordance with aspects of the present disclosure. The operations of method 2400 may be implemented by a UE 115 or its components as described herein. For example, the operations of method 2400 may be performed by a UE communications manager as described with reference to FIGS. 14 through 17. In some examples, a UE 115 may execute a set of codes to control the functional elements of the device to perform the functions described below. Additionally or alternatively, the UE 115 may perform aspects of the functions described below using special-purpose hardware.

At block 2405 the UE 115 may receive a first number of bits of a codeword in a transmission over a wireless channel, wherein the codeword is encoded using a polar code and is generated from an information bit vector comprising a number of information bits. The operations of block 2405 may be performed according to the methods described herein. In certain examples, aspects of the operations of block 2405 may be performed by a receiver as described with reference to FIGS. 14 through 17.

At block 2410 the UE 115 may select a first rate matching scheme of a plurality of rate matching schemes for decoding the codeword based at least in part on one or more parameters associated with the transmission. The operations of block 2410 may be performed according to the methods described herein. In certain examples, aspects of the operations of block 2410 may be performed by a transmission parameter component as described with reference to FIGS. 14 through 17.

At block 2415 the UE 115 may identify a set of bit locations of the polar code for the number of information bits based at least in part on the first number of bits and the number of information bits. The operations of block 2415 may be performed according to the methods described herein. In certain examples, aspects of the operations of block 2415 may be performed by a bit location identifier as described with reference to FIGS. 14 through 17.

At block 2420 the UE 115 may decode the codeword according to the polar code and the first rate matching scheme to obtain the information bit vector at the set of bit locations. The operations of block 2420 may be performed according to the methods described herein. In certain examples, aspects of the operations of block 2420 may be performed by a decoder as described with reference to FIGS. 14 through 17.

At block 2425 the UE 115 may switch to a second rate matching scheme of the plurality of rate matching schemes based at least in part on one or more updates to the one or more parameters associated with the transmission. The operations of block 2425 may be performed according to the methods described herein. In certain examples, aspects of the operations of block 2425 may be performed by a rate matcher as described with reference to FIGS. 14 through 17.

Figure 25:
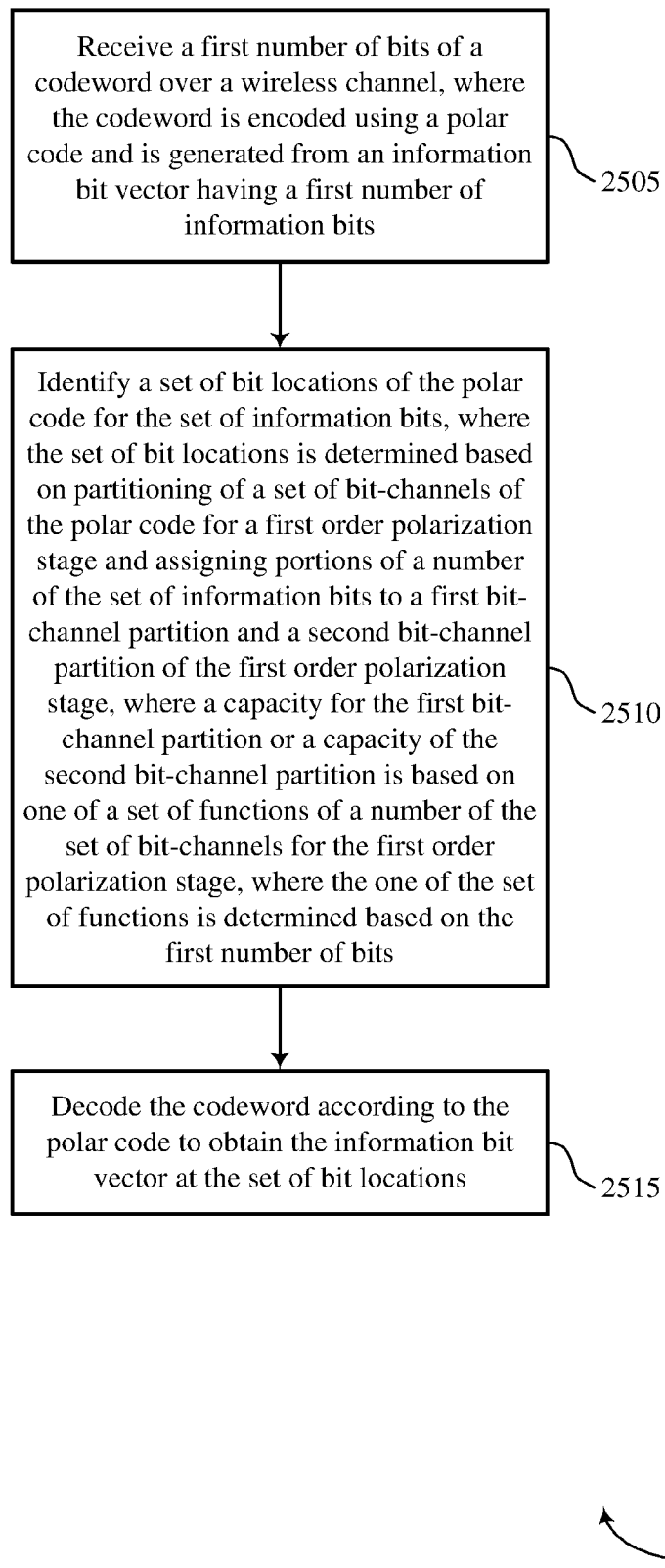

FIG. 25 shows a flowchart illustrating a method 2500 for rate-matching techniques for polar codes in accordance with aspects of the present disclosure. The operations of method 2500 may be implemented by a UE 115 or its components as described herein. For example, the operations of method 2500 may be performed by a UE communications manager as described with reference to FIGS. 14 through 17. In some examples, a UE 115 may execute a set of codes to control the functional elements of the device to perform the functions described below. Additionally or alternatively, the UE 115 may perform aspects of the functions described below using special-purpose hardware.

At block 2505 the UE 115 may receive a first number of bits of a codeword over a wireless channel, wherein the codeword is encoded using a polar code and is generated from an information bit vector having a first number of information bits. The operations of block 2505 may be performed according to the methods described herein. In certain examples, aspects of the operations of block 2505 may be performed by a receiver as described with reference to FIGS. 14 through 17.

At block 2510 the UE 115 may identify a set of bit locations of the polar code for the plurality of information bits, wherein the set of bit locations is determined based at least in part on partitioning of a plurality of bit-channels of the polar code for a first order polarization stage and assigning portions of a number of the plurality of information bits to a first bit-channel partition and a second bit-channel partition of the first order polarization stage, wherein a capacity for the first bit-channel partition or a capacity of the second bit-channel partition is based at least in part on one of a plurality of functions of a number of the plurality of bit-channels for the first order polarization stage, wherein the one of the plurality of functions is determined based at least in part on the first number of bits. The operations of block 2510 may be performed according to the methods described herein. In certain examples, aspects of the operations of block 2510 may be performed by a bit location identifier as described with reference to FIGS. 14 through 17.

At block 2515 the UE 115 may decode the codeword according to the polar code to obtain the information bit vector at the set of bit locations. The operations of block 2515 may be performed according to the methods described herein. In certain examples, aspects of the operations of block 2515 may be performed by a decoder as described with reference to FIGS. 14 through 17.

It should be noted that the methods described above describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

A macro cell generally covers a relatively large geographic area (e.g., several kilometers in radius) and may allow unrestricted access by UEs 115 with service subscriptions with the network provider. A small cell may be associated with a lower-powered base station 105, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs 115 with service subscriptions with the network provider. A femto cell may also cover a small geographic area (e.g., a home) and may provide restricted access by UEs 115 having an association with the femto cell (e.g., UEs 115 in a closed subscriber group (CSG), UEs 115 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications system 100 or systems described herein may support synchronous or asynchronous operation. For synchronous operation, the base stations 105 may have similar frame timing, and transmissions from different base stations 105 may be approximately aligned in time. For asynchronous operation, the base stations 105 may have different frame timing, and transmissions from different base stations 105 may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise random-access memory (RAM), read-only memory (ROM), electrically erasable programmable read only memory (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
   identifying an information bit vector comprising a number of information bits to be encoded using a polar code;
   identifying a first number of bits of a codeword generated from the information bit vector to be transmitted;
   identifying a set of bit locations of the polar code for the number of information bits, wherein the set of bit locations is determined based at least in part on partitioning of a plurality of bit-channels of the polar code for a first order polarization stage and assigning portions of the number of information bits to a first bit-channel partition and a second bit-channel partition of the first order polarization stage, wherein a capacity of the plurality of bit-channels of the first order polarization stage is based at least in part on a transmission capacity factor determined according to a mapping, wherein the mapping provides a plurality of transmission capacity factor values, each transmission capacity factor value corresponding to an associated rate matching ratio value that is determined based at least in part on a first number of bits and a mother polar code length for the codeword;
   encoding the information bit vector according to the set of bit locations using the polar code to obtain the codeword;
   rating matching the codeword to the first number of bits; and
   transmitting the rate matched codeword over a wireless channel.

2. The method of claim 1, wherein:
   the transmission capacity factor is based at least in part on a ratio of the first number of bits to the mother polar code length for the codeword.

3. The method of claim 1, wherein:
   the mapping is provided in a lookup table containing the plurality of rate matching ratio values and the plurality of transmission capacity factor values.

4. The method of claim 3, wherein the identifying the set of bit locations further comprises:
   determining a calculated rate matching ratio between the first number of bits and the mother polar code length;
   identifying a first rate matching ratio value and a second rate matching ratio value from the lookup table, the calculated rate matching ratio being between the first rate matching ratio value and the second rate matching ratio value; and
   determining the transmission capacity factor as an interpolation between a first transmission capacity factor value associated with the first rate matching ratio value and a second transmission capacity factor value associated with the second rate matching ratio value.

5. The method of claim 4, wherein:
   the interpolation is a first order linear interpolation.

6. The method of claim 3, wherein the identifying the set of bit locations further comprises:
   determining a calculated rate matching ratio between the first number of bits and the mother polar code length;
   identifying a first rate matching ratio value and a second rate matching ratio value from the lookup table, the calculated rate matching ratio being between the first rate matching ratio value and the second rate matching ratio value; and
   selecting the transmission capacity factor as the first rate matching ratio value or the second rate matching ratio value based at least in part on which of the first rate matching ratio value or the second rate matching ratio value is closest to the calculated rate matching ratio.

7. A method for wireless communication, comprising:
   identifying an information bit vector comprising a number of information bits to be encoded using a polar code;
   identifying one or more transmission parameters for a codeword to be generated from the information bit vector using the polar code;
   selecting a first rate matching scheme for determining a first number of bits of the codeword to be transmitted, the first rate matching scheme being selected from a plurality of rate matching schemes based at least in part on the one or more transmission parameters;
   identifying a set of bit locations of the polar code for the number of information bits based at least in part on the first number of bits and the number of information bits;
   encoding the information bit vector according to the set of bit locations using the polar code;
   rating matching the codeword to the first number of bits using the first rate matching scheme;

switching to a second rate matching scheme of the plurality of rate matching schemes based at least in part on one or more updates to the one or more transmission parameters; and transmitting the rate matched codeword over a wireless channel.

8. The method of claim 7, wherein:

the one or more transmission parameters comprise one or more of the number of information bits in the information bit vector, the first number of bits, a mother code length for polar codes of the transmission, a ratio of the number of information bits and the first number of bits or a coding rate, a ratio of the first number of bits and the mother code length, or any combination thereof.

9. The method of claim 7, wherein the plurality of rate matching schemes comprise one or more of:

a first rate matching scheme that adjusts the number of information bits in the information bit vector;

a second rate matching scheme that adjusts a block size of input data;

a third rate matching scheme that interlaces portions of two or more input data blocks; or a fourth rate matching scheme that has one or more non-interlaced input data blocks and that interlaces two or more other input data blocks.

10. The method of claim 7, wherein the selecting the first rate matching scheme is based on one or more of:

a value of a first parameter of the one or more transmission parameters relative to a first threshold value for the first parameter;

a value of a ratio of the first number of bits and a mother code length relative to a second threshold value;

a value of a coding rate of the codeword; or whether a value of each of the one or more transmission parameters belongs to a set of values associated with each rate matching scheme of the plurality of rate matching schemes.

11. A method for wireless communication, comprising:

identifying an information bit vector comprising a plurality of information bits to be encoded using a polar code;

identifying a first number of bits of a codeword generated from the information bit vector to be transmitted;

identifying a set of bit locations of the polar code for the plurality of information bits, wherein the set of bit locations is determined based at least in part on partitioning of a plurality of bit-channels of the polar code for a first order polarization stage and assigning portions of a number of the plurality of information bits to a first bit-channel partition and a second bit-channel partition of the first order polarization stage, wherein a capacity for the first bit-channel partition or a capacity of the second bit-channel partition is based at least in part on one of a plurality of functions of a number of the plurality of bit-channels for the first order polarization stage, wherein the one of the plurality of functions is determined based at least in part on the first number of bits;

encoding the information bit vector according to the set of bit locations using the polar code to obtain the codeword;

rating matching the codeword to the first number of bits; and transmitting the rate matched codeword over a wireless channel.

12. The method of claim 11, wherein:

the plurality of functions correspond to a plurality of different rate matching schemes.

13. The method of claim 11, wherein:

the one of the plurality of functions is further determined based at least in part on a mother polar code length for the codeword.

14. The method of claim 11, wherein:

the one of the plurality of functions is further determined based at least in part on a value of the first number of bits relative to a mother polar code length for the codeword.

15. A method for wireless communication, comprising:

receiving a first number of bits of a codeword over a wireless channel, wherein the codeword is encoded using a polar code and is generated from an information bit vector comprising a number of information bits;

identifying a set of bit locations of the polar code for the number of information bits, wherein the set of bit locations is determined based at least in part on partitioning of a plurality of bit-channels of the polar code for a first order polarization stage and assigning portions of the number of information bits to a first bit-channel partition and a second bit-channel partition of the first order polarization stage, wherein a capacity of the plurality of bit-channels of the first order polarization stage is based at least in part on a transmission capacity factor determined according to a mapping, wherein the mapping provides a plurality of transmission capacity factor values, each transmission capacity factor value corresponding to an associated rate matching ratio value that is determined based at least in part on the first number of bits and a mother polar code length for the codeword; and decoding the codeword according to the polar code to obtain the information bit vector at the set of bit locations.

16. The method of claim 15, wherein:

the transmission capacity factor is based at least in part on a ratio of the first number of bits to the mother polar code length for the codeword.

17. The method of claim 15, wherein:

the mapping is provided in a lookup table containing the plurality of rate matching ratio values and the plurality of transmission capacity factor values.

18. The method of claim 17, wherein the identifying the set of bit locations further comprises:

determining a calculated rate matching ratio between the first number of bits and the mother polar code length;

identifying a first rate matching ratio value and a second rate matching ratio value from the lookup table, the calculated rate matching ratio being between the first rate matching ratio value and the second rate matching ratio value; and determining the transmission capacity factor as an interpolation between a first transmission capacity factor value associated with the first rate matching ratio value and a second transmission capacity factor value associated with the second rate matching ratio value.

19. The method of claim 18, wherein:

the interpolation is a first order linear interpolation.

20. The method of claim 17, wherein the identifying the set of bit locations further comprises:

determining a calculated rate matching ratio between the first number of bits and the mother polar code length;

identifying a first rate matching ratio value and a second rate matching ratio value from the lookup table, the calculated rate matching ratio being between the first rate matching ratio value and the second rate matching ratio value; and selecting the transmission capacity factor as the first rate matching ratio value or the second rate matching ratio value based at least in part on which of the first rate matching ratio value or the second rate matching ratio value is closest to the calculated rate matching ratio.

21. A method for wireless communication, comprising:

receiving a first number of bits of a codeword in a transmission over a wireless channel, wherein the codeword is encoded using a polar code and is generated from an information bit vector comprising a number of information bits;

selecting a first rate matching scheme of a plurality of rate matching schemes for decoding the codeword based at least in part on one or more parameters associated with the transmission;

identifying a set of bit locations of the polar code for the number of information bits based at least in part on the first number of bits and the number of information bits;

decoding the codeword according to the polar code and the first rate matching scheme to obtain the information bit vector at the set of bit locations; and switching to a second rate matching scheme of the plurality of rate matching schemes based at least in part on one or more updates to the one or more parameters associated with the transmission.

22. The method of claim 21, wherein the one or more parameters associated with the transmission comprise one or more of:

the number of information bits in the information bit vector;

the first number of bits;

a mother code length for polar codes of the transmission;

a ratio of the number of information bits and the first number of bits or a coding rate;

a ratio of the first number of bits and the mother code length; or any combination thereof.

23. The method of claim 21, wherein the plurality of rate matching schemes comprise one or more of:

a first rate matching scheme that adjusts the number of information bits in the information bit vector;

a second rate matching scheme that adjusts a block size of input data;

a third rate matching scheme that interlaces portions of two or more input data blocks; or a fourth rate matching scheme that has one or more non-interlaced input data blocks and that interlaces two or more other input data blocks.

24. The method of claim 21, wherein the selecting the first rate matching scheme is based on one or more of:

a value of a first parameter of the one or more parameters relative to a first threshold value for the first parameter;

a value of a ratio of the first number of bits and a mother code length relative to a second threshold value;

a value of a coding rate of the codeword; or whether a value of each of the one or more parameters belongs to a set of values associated with each rate matching scheme of the plurality of rate matching schemes.

25. A method for wireless communication, comprising:

receiving a first number of bits of a codeword over a wireless channel, wherein the codeword is encoded using a polar code and is generated from an information bit vector having a plurality of information bits;

identifying a set of bit locations of the polar code for the plurality of information bits, wherein the set of bit locations is determined based at least in part on partitioning of a plurality of bit-channels of the polar code for a first order polarization stage and assigning portions of a number of the plurality of information bits to a first bit-channel partition and a second bit-channel partition of the first order polarization stage, wherein a capacity for the first bit-channel partition or a capacity of the second bit-channel partition is based at least in part on one of a plurality of functions of a number of the plurality of bit-channels for the first order polarization stage, wherein the one of the plurality of functions is determined based at least in part on the first number of bits; and decoding the codeword according to the polar code to obtain the information bit vector at the set of bit locations.

26. The method of claim 25, wherein:

the plurality of functions correspond to a plurality of different rate matching schemes.

27. The method of claim 25, wherein:

the one of the plurality of functions is further determined based at least in part on a mother polar code length for the codeword.

28. The method of claim 25, wherein:

the one of the plurality of functions is further determined based at least in part on a value of the first number of bits relative to a mother polar code length for the codeword.

29. An apparatus for wireless communication, comprising:

means for identifying an information bit vector comprising a number of information bits to be encoded using a polar code;

means for identifying a first number of bits of a codeword generated from the information bit vector to be transmitted;

means for identifying a set of bit locations of the polar code for the number of information bits, wherein the set of bit locations is determined based at least in part on partitioning of a plurality of bit-channels of the polar code for a first order polarization stage and assigning portions of the number of information bits to a first bit-channel partition and a second bit-channel partition of the first order polarization stage, wherein a capacity of the plurality of bit-channels of the first order polarization stage is based at least in part on a transmission capacity factor determined according to a mapping between one or more of a mother polar code length for the codeword, the first number of bits, or a plurality of predetermined transmission capacity factors;

means for encoding the information bit vector according to the set of bit locations using the polar code to obtain the codeword;

means for rating matching the codeword to the first number of bits; and means for transmitting the rate matched codeword over a wireless channel.

30. An apparatus for wireless communication, comprising:

means for identifying an information bit vector comprising a number of information bits to be encoded using a polar code;

means for identifying one or more transmission parameters for a codeword to be generated from the information bit vector using the polar code;

means for selecting a first rate matching scheme for determining a first number of bits of the codeword to be transmitted, the first rate matching scheme being selected from a plurality of rate matching schemes based at least in part on the one or more transmission parameters;

means for identifying a set of bit locations of the polar code for the number of information bits based at least in part on the first number of bits and the number of information bits;

means for encoding the information bit vector according to the set of bit locations using the polar code;

means for rating matching the codeword to the first number of bits using the first rate matching scheme;

means for switching to a second rate matching scheme of the plurality of rate matching schemes based at least in part on one or more updates to the one or more transmission parameters; and means for transmitting the rate matched codeword over a wireless channel.

31. An apparatus for wireless communication, comprising:

means for identifying an information bit vector comprising a plurality of information bits to be encoded using a polar code;

means for identifying a first number of bits of a codeword generated from the information bit vector to be transmitted;

means for identifying a set of bit locations of the polar code for the plurality of information bits, wherein the set of bit locations is determined based at least in part on partitioning of a plurality of bit-channels of the polar code for a first order polarization stage and assigning portions of a number of the plurality of information bits to a first bit-channel partition and a second bit-channel partition of the first order polarization stage, wherein a capacity for the first bit-channel partition or a capacity of the second bit-channel partition is based at least in part on one of a plurality of functions of a number of the plurality of bit-channels for the first order polarization stage, wherein the one of the plurality of functions is determined based at least in part on the first number of bits;

means for encoding the information bit vector according to the set of bit locations using the polar code to obtain the codeword;

means for rating matching the codeword to the first number of bits; and means for transmitting the rate matched codeword over a wireless channel.

32. An apparatus for wireless communication, comprising:

means for receiving a first number of bits of a codeword over a wireless channel, wherein the codeword is encoded using a polar code and is generated from an information bit vector comprising a number of information bits;

means for identifying a set of bit locations of the polar code for the number of information bits, wherein the set of bit locations is determined based at least in part on partitioning of a plurality of bit-channels of the polar code for a first order polarization stage and assigning portions of the number of information bits to a first bit-channel partition and a second bit-channel partition of the first order polarization stage, wherein a capacity of the plurality of bit-channels of the first order polarization stage is based at least in part on a transmission capacity factor determined according to a mapping, wherein the mapping provides a plurality of transmission capacity factor values, each transmission capacity factor value corresponding to an associated rate matching ratio value that is determined based at least in part on the first number of bits and a mother polar code length for the codeword; and means for decoding the codeword according to the polar code to obtain the information bit vector at the set of bit locations.

33. An apparatus for wireless communication, comprising:

means for receiving a first number of bits of a codeword in a transmission over a wireless channel, wherein the codeword is encoded using a polar code and is generated from an information bit vector comprising a number of information bits;

means for selecting a first rate matching scheme of a plurality of rate matching schemes for decoding the codeword based at least in part on one or more parameters associated with the transmission;

means for identifying a set of bit locations of the polar code for the number of information bits based at least in part on the first number of bits and the number of information bits;

means for decoding the codeword according to the polar code and the first rate matching scheme to obtain the information bit vector at the set of bit locations; and means for switching to a second rate matching scheme of the plurality of rate matching schemes based at least in part on one or more updates to the one or more parameters associated with the transmission.

34. An apparatus for wireless communication, comprising:

means for receiving a first number of bits of a codeword over a wireless channel, wherein the codeword is encoded using a polar code and is generated from an information bit vector having a plurality of information bits;

means for identifying a set of bit locations of the polar code for the plurality of information bits, wherein the set of bit locations is determined based at least in part on partitioning of a plurality of bit-channels of the polar code for a first order polarization stage and assigning portions of a number of the plurality of information bits to a first bit-channel partition and a second bit-channel partition of the first order polarization stage, wherein a capacity for the first bit-channel partition or a capacity of the second bit-channel partition is based at least in part on one of a plurality of functions of a number of the plurality of bit-channels for the first order polarization stage, wherein the one of the plurality of functions is determined based at least in part on the first number of bits; and means for decoding the codeword according to the polar code to obtain the information bit vector at the set of bit locations.

35. An apparatus for wireless communication, comprising:

a processor;

memory in electronic communication with the processor; and instructions stored in the memory and operable, when executed by the processor, to cause the apparatus to:
identify an information bit vector comprising a number of information bits to be encoded using a polar code;

identify a first number of bits of a codeword generated from the information bit vector to be transmitted;

identify a set of bit locations of the polar code for the number of information bits, wherein the set of bit locations is determined based at least in part on partitioning of a plurality of bit-channels of the polar code for a first order polarization stage and assigning portions of the number of information bits to a first bit-channel partition and a second bit-channel partition of the first order polarization stage, wherein a capacity of the plurality of bit-channels of the first order polarization stage is based at least in part on a transmission capacity factor determined according to a mapping between one or more of a mother polar code length for the codeword, the first number of bits, or a plurality of predetermined transmission capacity factors;

encode the information bit vector according to the set of bit locations using the polar code to obtain the codeword;

rate matching the codeword to the first number of bits; and transmit the rate matched codeword over a wireless channel.

36. An apparatus for wireless communication, comprising:
a processor;
memory in electronic communication with the processor; and
instructions stored in the memory and operable, when executed by the processor, to cause the apparatus to:
identify an information bit vector comprising a number of information bits to be encoded using a polar code;
identify one or more transmission parameters for a codeword to be generated from the information bit vector using the polar code;
select a first rate matching scheme for determining a first number of bits of the codeword to be transmitted, the first rate matching scheme being selected from a plurality of rate matching schemes based at least in part on the one or more transmission parameters;
identify a set of bit locations of the polar code for the number of information bits based at least in part on the first number of bits and the number of information bits;
encode the information bit vector according to the set of bit locations using the polar code;
rate matching the codeword to the first number of bits using the first rate matching scheme;
switch to a second rate matching scheme of the plurality of rate matching schemes based at least in part on one or more updates to the one or more transmission parameters; and
transmit the rate matched codeword over a wireless channel.

37. An apparatus for wireless communication, comprising:
a processor;
memory in electronic communication with the processor; and
instructions stored in the memory and operable, when executed by the processor, to cause the apparatus to:
identify an information bit vector comprising a plurality of information bits to be encoded using a polar code;

identify a first number of bits of a codeword generated from the information bit vector to be transmitted;

identify a set of bit locations of the polar code for the plurality of information bits, wherein the set of bit locations is determined based at least in part on partitioning of a plurality of bit-channels of the polar code for a first order polarization stage and assigning portions of a number of the plurality of information bits to a first bit-channel partition and a second bit-channel partition of the first order polarization stage, wherein a capacity for the first bit-channel partition or a capacity of the second bit-channel partition is based at least in part on one of a plurality of functions of a number of the plurality of bit-channels for the first order polarization stage, wherein the one of the plurality of functions is determined based at least in part on the first number of bits;

encode the information bit vector according to the set of bit locations using the polar code to obtain the codeword;

rate matching the codeword to the first number of bits; and transmit the rate matched codeword over a wireless channel.

38. An apparatus for wireless communication, comprising:
a processor;
memory in electronic communication with the processor; and
instructions stored in the memory and operable, when executed by the processor, to cause the apparatus to:
receive a first number of bits of a codeword over a wireless channel, wherein the codeword is encoded using a polar code and is generated from an information bit vector comprising a number of information bits;
identify a set of bit locations of the polar code for the number of information bits, wherein the set of bit locations is determined based at least in part on partitioning of a plurality of bit-channels of the polar code for a first order polarization stage and assigning portions of the number of information bits to a first bit-channel partition and a second bit-channel partition of the first order polarization stage, wherein a capacity of the plurality of bit-channels of the first order polarization stage is based at least in part on a transmission capacity factor determined according to a mapping, wherein the mapping provides a plurality of transmission capacity factor values, each transmission capacity factor value corresponding to an associated rate matching ratio value that is determined based at least in part on the first number of bits and a mother polar code length for the codeword; and
decode the codeword according to the polar code to obtain the information bit vector at the set of bit locations.

39. An apparatus for wireless communication, comprising:
a processor;
memory in electronic communication with the processor; and
instructions stored in the memory and operable, when executed by the processor, to cause the apparatus to:
receive a first number of bits of a codeword in a transmission over a wireless channel, wherein the codeword is encoded using a polar code and is generated from an information bit vector comprising a number of information bits;

select a first rate matching scheme of a plurality of rate matching schemes for decoding the codeword based at least in part on one or more parameters associated with the transmission;

identify a set of bit locations of the polar code for the number of information bits based at least in part on the first number of bits and the number of information bits;

decode the codeword according to the polar code and the first rate matching scheme to obtain the information bit vector at the set of bit locations; and switch to a second rate matching scheme of the plurality of rate matching schemes based at least in part on one or more updates to the one or more parameters associated with the transmission.

40. An apparatus for wireless communication, comprising:

a processor;

memory in electronic communication with the processor; and instructions stored in the memory and operable, when executed by the processor, to cause the apparatus to:

receive a first number of bits of a codeword over a wireless channel, wherein the codeword is encoded using a polar code and is generated from an information bit vector having a plurality of information bits;

identify a set of bit locations of the polar code for the plurality of information bits, wherein the set of bit locations is determined based at least in part on partitioning of a plurality of bit-channels of the polar code for a first order polarization stage and assigning portions of a number of the plurality of information bits to a first bit-channel partition and a second bit-channel partition of the first order polarization stage, wherein a capacity for the first bit-channel partition or a capacity of the second bit-channel partition is based at least in part on one of a plurality of functions of a number of the plurality of bit-channels for the first order polarization stage, wherein the one of the plurality of functions is determined based at least in part on the first number of bits; and decode the codeword according to the polar code to obtain the information bit vector at the set of bit locations.

41. A non-transitory computer readable medium storing code for wireless communication, the code comprising instructions executable by a processor to:

identify an information bit vector comprising a number of information bits to be encoded using a polar code;

identify a first number of bits of a codeword generated from the information bit vector to be transmitted;

identify a set of bit locations of the polar code for the number of information bits, wherein the set of bit locations is determined based at least in part on partitioning of a plurality of bit-channels of the polar code for a first order polarization stage and assigning portions of the number of information bits to a first bit-channel partition and a second bit-channel partition of the first order polarization stage, wherein a capacity of the plurality of bit-channels of the first order polarization stage is based at least in part on a transmission capacity factor determined according to a mapping between one or more of a mother polar code length for the codeword, the first number of bits, or a plurality of predetermined transmission capacity factors;

encode the information bit vector according to the set of bit locations using the polar code to obtain the codeword;

rate matching the codeword to the first number of bits; and transmit the rate matched codeword over a wireless channel.

42. A non-transitory computer readable medium storing code for wireless communication, the code comprising instructions executable by a processor to:

identify an information bit vector comprising a number of information bits to be encoded using a polar code;

identify one or more transmission parameters for a codeword to be generated from the information bit vector using the polar code;

select a first rate matching scheme for determining a first number of bits of the codeword to be transmitted, the first rate matching scheme being selected from a plurality of rate matching schemes based at least in part on the one or more transmission parameters;

identify a set of bit locations of the polar code for the number of information bits based at least in part on the first number of bits and the number of information bits;

encode the information bit vector according to the set of bit locations using the polar code;

rate matching the codeword to the first number of bits using the first rate matching scheme;

switch to a second rate matching scheme of the plurality of rate matching schemes based at least in part on one or more updates to the one or more transmission parameters; and transmit the rate matched codeword over a wireless channel.

43. A non-transitory computer readable medium storing code for wireless communication, the code comprising instructions executable by a processor to:

identify an information bit vector comprising a plurality of information bits to be encoded using a polar code;

identify a first number of bits of a codeword generated from the information bit vector to be transmitted;

identify a set of bit locations of the polar code for the plurality of information bits, wherein the set of bit locations is determined based at least in part on partitioning of a plurality of bit-channels of the polar code for a first order polarization stage and assigning portions of a number of the plurality of information bits to a first bit-channel partition and a second bit-channel partition of the first order polarization stage, wherein a capacity for the first bit-channel partition or a capacity of the second bit-channel partition is based at least in part on one of a plurality of functions of a number of the plurality of bit-channels for the first order polarization stage, wherein the one of the plurality of functions is determined based at least in part on the first number of bits;

encode the information bit vector according to the set of bit locations using the polar code to obtain the codeword;

rate matching the codeword to the first number of bits; and transmit the rate matched codeword over a wireless channel.

44. A non-transitory computer readable medium storing code for wireless communication, the code comprising instructions executable by a processor to:
- receive a first number of bits of a codeword over a wireless channel, wherein the codeword is encoded using a polar code and is generated from an information bit vector comprising a number of information bits;
- identify a set of bit locations of the polar code for the number of information bits, wherein the set of bit locations is determined based at least in part on partitioning of a plurality of bit-channels of the polar code for a first order polarization stage and assigning portions of the number of information bits to a first bit-channel partition and a second bit-channel partition of the first order polarization stage, wherein a capacity of the plurality of bit-channels of the first order polarization stage is based at least in part on a transmission capacity factor determined according to a mapping, wherein the mapping provides a plurality of transmission capacity factor values, each transmission capacity factor value corresponding to an associated rate matching ratio value that is determined based at least in part on the first number of bits and a mother polar code length for the codeword; and
- decode the codeword according to the polar code to obtain the information bit vector at the set of bit locations.

45. A non-transitory computer readable medium storing code for wireless communication, the code comprising instructions executable by a processor to:
- receive a first number of bits of a codeword in a transmission over a wireless channel, wherein the codeword is encoded using a polar code and is generated from an information bit vector comprising a number of information bits;
- select a first rate matching scheme of a plurality of rate matching schemes for decoding the codeword based at least in part on one or more parameters associated with the transmission;
- identify a set of bit locations of the polar code for the number of information bits based at least in part on the first number of bits and the number of information bits;
- decode the codeword according to the polar code and the first rate matching scheme to obtain the information bit vector at the set of bit locations; and
- switch to a second rate matching scheme of the plurality of rate matching schemes based at least in part on one or more updates to the one or more parameters associated with the transmission.

46. A non-transitory computer readable medium storing code for wireless communication, the code comprising instructions executable by a processor to:
- receive a first number of bits of a codeword over a wireless channel, wherein the codeword is encoded using a polar code and is generated from an information bit vector having a plurality of information bits;
- identify a set of bit locations of the polar code for the plurality of information bits, wherein the set of bit locations is determined based at least in part on partitioning of a plurality of bit-channels of the polar code for a first order polarization stage and assigning portions of a number of the plurality of information bits to a first bit-channel partition and a second bit-channel partition of the first order polarization stage, wherein a capacity for the first bit-channel partition or a capacity of the second bit-channel partition is based at least in part on one of a plurality of functions of a number of the plurality of bit-channels for the first order polarization stage, wherein the one of the plurality of functions is determined based at least in part on the first number of bits; and
- decode the codeword according to the polar code to obtain the information bit vector at the set of bit locations.

* * * * *